(12) United States Patent  
Hakewill et al.

(10) Patent No.: US 8,386,972 B2  
(45) Date of Patent: *Feb. 26, 2013

(54) METHOD AND APPARATUS FOR MANAGING THE CONFIGURATION AND FUNCTIONALITY OF A SEMICONDUCTOR DESIGN

(75) Inventors: James Robert Howard Hakewill, Radlett (GB); Mohammed Noshad Khan, Edgware (GB); Edward Plowman, Gamlingay (GB)

(73) Assignee: Synopsys, Inc., Mountain View, CA (US)

( * ) Notice: Subject to any disclaimer, the term of this patent is extended or adjusted under 35 U.S.C. 154(b) by 59 days.

This patent is subject to a terminal disclaimer.

(21) Appl. No.: 12/639,911

(22) Filed: Dec. 16, 2009

(65) Prior Publication Data

US 2010/0299647 A1    Nov. 25, 2010

Related U.S. Application Data

(63) Continuation of application No. 11/067,086, filed on Feb. 25, 2005, now abandoned, which is a continuation of application No. 09/418,663, filed on Oct. 14, 1999, now Pat. No. 6,862,563.

(60) Provisional application No. 60/104,271, filed on Oct. 14, 1998.

(51) Int. Cl.  
*G06F 17/50* (2006.01)

(52) U.S. Cl. ..................................... 716/104

(58) Field of Classification Search ................. 716/102, 716/103, 104, 106, 111; 703/13, 14  
See application file for complete search history.

(56) References Cited

U.S. PATENT DOCUMENTS

| | | |
|---|---|---|
| 4,611,278 A | 9/1986 | Boothroyd et al. |
| 4,639,886 A | 1/1987 | Hashimoto et al. |
| 4,755,966 A | 7/1988 | Lee et al. |
| 4,763,242 A | 8/1988 | Lee et al. |
| 4,890,218 A | 12/1989 | Bram |
| 4,896,258 A | 1/1990 | Yamaguchi et al. |
| 4,974,155 A | 11/1990 | Dulong et al. |
| 4,992,934 A | 2/1991 | Portanova et al. |
| 5,019,967 A | 5/1991 | Wheeler et al. |
| 5,247,637 A | 9/1993 | Leedom et al. |

(Continued)

FOREIGN PATENT DOCUMENTS

| | | |
|---|---|---|
| EP | 0352103 A | 1/1990 |
| EP | 0355069 A2 | 2/1990 |

(Continued)

OTHER PUBLICATIONS

Hartoog et al., "Generation of Software Tools from Processor Descriptions for Hardware/Software Codesign," 1997 ACM 0-89791-920-3/97/06, pp. 303-306.*

(Continued)

*Primary Examiner* — Vuthe Siek  
(74) *Attorney, Agent, or Firm* — Fenwick & West LLP

(57) ABSTRACT

A method of managing the configuration, design parameters, and functionality of an integrated circuit (IC) design using a hardware description language (HDL). Instructions can be added, subtracted, or generated by the designer interactively during the design process, and customized HDL descriptions of the IC design are generated through the use of scripts based on the user-edited instruction set and inputs. The customized HDL description can then be used as the basis for generating "makefiles" for purposes of simulation and/or logic level synthesis. The method further affords the ability to generate an HDL model of a complete device, such as a microprocessor or DSP. A computer program implementing the aforementioned method and a hardware system for running the computer program are also disclosed.

11 Claims, 44 Drawing Sheets

U.S. PATENT DOCUMENTS

| | | | |
|---|---|---|---|
| 5,361,373 A | 11/1994 | Gilson | |
| 5,371,860 A | 12/1994 | Mura et al. | |
| 5,404,319 A | 4/1995 | Smith et al. | |
| 5,450,586 A | 9/1995 | Kuzara et al. | |
| 5,488,730 A | 1/1996 | Brown, III et al. | |
| 5,491,640 A | 2/1996 | Sharma et al. | |
| 5,493,508 A | 2/1996 | Dangelo et al. | |
| 5,493,687 A | 2/1996 | Garg et al. | |
| 5,502,661 A | 3/1996 | Glunz | |
| 5,509,129 A | 4/1996 | Guttag et al. | |
| 5,530,965 A | 6/1996 | Kawasaki et al. | |
| 5,535,331 A | 7/1996 | Swoboda et al. | |
| 5,537,580 A | 7/1996 | Giomi et al. | |
| 5,544,067 A | 8/1996 | Rostoker et al. | |
| 5,555,201 A | 9/1996 | Dangelo et al. | |
| 5,555,384 A | 9/1996 | Roberts et al. | |
| 5,590,294 A | 12/1996 | Mirapuri et al. | |
| 5,696,956 A | 12/1997 | Razdan et al. | |
| 5,703,789 A | 12/1997 | Beausang et al. | |
| 5,724,566 A | 3/1998 | Swoboda et al. | |
| 5,748,875 A | 5/1998 | Tzori | |
| 5,751,984 A | 5/1998 | Chang et al. | |
| 5,752,271 A | 5/1998 | Yung | |
| 5,774,687 A | 6/1998 | Nakamura et al. | |
| 5,778,208 A | 7/1998 | Eickemeyer et al. | |
| 5,784,603 A | 7/1998 | Leung et al. | |
| 5,801,958 A | 9/1998 | Dangelo et al. | |
| 5,809,320 A | 9/1998 | Jain et al. | |
| 5,812,416 A | 9/1998 | Gupte et al. | |
| 5,819,050 A | 10/1998 | Boehling et al. | |
| 5,819,064 A | 10/1998 | Razdan et al. | |
| 5,838,984 A | 11/1998 | Nguyen et al. | |
| 5,841,663 A | 11/1998 | Sharma et al. | |
| 5,854,929 A | 12/1998 | Van Praet et al. | |
| 5,854,930 A | 12/1998 | McLain, Jr. et al. | |
| 5,867,399 A | 2/1999 | Rostoker et al. | |
| 5,867,400 A * | 2/1999 | El-Ghoroury et al. | 716/101 |
| 5,870,588 A | 2/1999 | Rompaey et al. | |
| 5,898,595 A | 4/1999 | Bair et al. | |
| 5,920,711 A | 7/1999 | Seawright et al. | |
| 5,963,454 A | 10/1999 | Dockser et al. | |
| 5,994,892 A | 11/1999 | Turino et al. | |
| 5,995,736 A * | 11/1999 | Aleksic et al. | 716/103 |
| 5,999,734 A | 12/1999 | Willis et al. | |
| 6,006,022 A | 12/1999 | Rhim et al. | |
| 6,016,543 A | 1/2000 | Suzuki et al. | |
| 6,026,219 A | 2/2000 | Miller et al. | |
| 6,035,123 A | 3/2000 | Razdan et al. | |
| 6,052,518 A * | 4/2000 | Shigeta et al. | 716/104 |
| 6,110,218 A | 8/2000 | Jennings | |
| 6,110,223 A | 8/2000 | Southgate et al. | |
| 6,173,434 B1 | 1/2001 | Wirthlin et al. | |
| 6,182,206 B1 | 1/2001 | Baxter | |
| 6,195,593 B1 | 2/2001 | Nguyen | |
| 6,226,776 B1 | 5/2001 | Panchul et al. | |
| 6,256,729 B1 | 7/2001 | Cherabuddi et al. | |
| 6,269,467 B1 | 7/2001 | Chang et al. | |
| 6,317,860 B1 | 11/2001 | Heile | |
| 6,321,369 B1 | 11/2001 | Heile et al. | |
| 6,324,678 B1 | 11/2001 | Dangelo et al. | |
| 6,338,136 B1 | 1/2002 | Col et al. | |
| 6,360,350 B1 | 3/2002 | Gabele et al. | |
| 6,378,123 B1 | 4/2002 | Dupenloup | |
| 6,385,757 B1 | 5/2002 | Gupta et al. | |
| 6,408,428 B1 | 6/2002 | Schlansker et al. | |
| 6,421,818 B1 | 7/2002 | Dupenloup et al. | |
| 6,457,173 B1 | 9/2002 | Gupta et al. | |
| 6,477,683 B1 | 11/2002 | Killian et al. | |
| 6,477,697 B1 | 11/2002 | Killian et al. | |
| 6,560,754 B1 | 5/2003 | Hakewill et al. | |
| 6,637,018 B1 | 10/2003 | Demler | |
| 6,671,743 B1 | 12/2003 | Verity | |
| 6,701,515 B1 | 3/2004 | Wilson et al. | |
| 6,760,888 B2 | 7/2004 | Hakewill et al. | |
| 6,862,563 B1 * | 3/2005 | Hakewill et al. | 703/14 |
| 7,010,558 B2 | 3/2006 | Morris | |
| 7,181,596 B2 | 2/2007 | Henry et al. | |
| 2002/0073375 A1 * | 6/2002 | Hollander | 714/739 |
| 2003/0208723 A1 | 11/2003 | Killian et al. | |

FOREIGN PATENT DOCUMENTS

| | | |
|---|---|---|
| EP | 0365188 A2 | 4/1990 |
| EP | 0476628 A2 | 3/1992 |
| EP | 0489266 A2 | 6/1992 |
| EP | 0649085 A | 4/1995 |
| EP | 0871108 A1 | 10/1998 |
| GB | 2308470 A | 6/1997 |
| GB | 2309803 | 8/1997 |
| GB | 2330673 A | 4/1999 |
| WO | WO 97/13209 A1 | 4/1997 |
| WO | WO 00/70446 A2 | 11/2000 |
| WO | WO 00/70483 A2 | 11/2000 |

OTHER PUBLICATIONS

U.S. Appl. No. 09/418,663 entitled "Method and Apparatus for Managing the Configuration and Functionality of a Semiconductor Design" filed Oct. 14 1999.

U.S. Appl. No. 09/523,871 entitled "Method and Apparatus for Jump Control in a Pipelined Processor," filed Mar. 13, 2000.

U.S. Appl. No. 09/523,877 entitled "Method and Apparatus for Jump Delay Slot Control in a Pipelined Processor," filed Mar. 13, 2000.

"ARC Wins Key U.S. Patent," Microprocessor Report, Mar. 2005, pp. 19-20, vol. 19, Archive 3.

"The ARCtangentTM—A5 Processor," ARC International, 2002, 4 pages.

Baron, M. "ARM's Configurable OptimoDE," Microprocessor Report, Jun. 2004, pp. 10-14, vol. 18, Archive 6.

Berekovic, M. et al., A Core Generator for Fully Synthesizable and Highly Parameterizable RISC Cores for System On-Chip Designs, 1998 IEEE Workshop on Signal Processing Systems, pp. 561-568, XP-002137267.

Cambell et al, "A tutorial for make", Proceedings of the 1985 ACM annual conference on the range of computing; mid-80's perspective, 1985, Denver, Colorado, United States, pp. 374-380. ISBN 0-89791-170-9.

Chinese First Office Action, Chinese Application No. 00808460.2, Jun. 27, 2003, 15 pages.

Chinese First Office Action, Chinese Application No. 00808458.0, Jun. 11, 2004, 11 pages.

Chinese Third Office Action, Chinese Application No. 200510084318.3, Jan. 4, 2008, 6 pages.

Chinese Second Office Action, Chinese Application No. 200510084318.3, Sep. 7, 2007, 6 pages.

Chinese First Office Action, Chinese Application No. 200510084318.3, Jan. 26, 2007, 9 pages.

Chinese First Office Action, Chinese Application No. 00808462.9, Jan. 2, 2003, 11 pages.

Chinese First Office Action, Chinese Application No. 200510053551.5, Nov. 17, 2006, 15 pages.

Clucas, R., "Designing with a Customisable Microprocessor Core," Electronic Eng'g, vol. 71, No. 865, Feb. 1, 1999, p. 35.

Compton et al. "Configurable Computing: A Survey of Systems and Software," Technical Report, Northwestern Universily, Dept. of ECE. 1999.

"Condition Register Coherency Look-Ahead," Research Disclosure (1993), No. 348, Apr. 1993, p. 243, XP000304185.

Diefendorff, K. et al., "Organization of the Motorola 88110 Superscalar RISC Microprocessor," IEEE Micro, Apr. 1992, pp. 40-63, vol. 12, No. 2.

Ditzel, D.R., et al., "Branch Folding in the CRISP Microprocessor: Reducing Branch Delay to Zero," 14th Annual International Symposium on Computer Architecture, Jun. 2-5, 1987, pp. 2-8, XP000212073.

"Earlier Configurable Processors: Close, But No Cigar," Microprocessor Report, Dec. 2002, pp. 8-10, vol. 16, Archive 12.

Elms, A., Tuning a Customisable RISC Core for DSP; Electronic Product Design, Sep. 1997, vol. 18, No. 9, 5 pages.

Elms, A., Tuning a Customisable RISC Core for DSP; Electronic Product Design, Sep. 1997, vol. 18, No. 9, pp. 19-20, 22, XP000909039.
European Decision to Refuse a European Patent Application, European Patent Application No. 99958445.1, Dec. 23, 2005, 9 pages.
European Provision of a Copy of the Minutes in Accordance with Rule 76(4) EPC, European Patent Application No. 99958445.1, Dec. 23, 2005, 7 pages.
European Summons to Attend Oral Proceedings Pursuant to Rule 71(1) EPC, European Application No. 99958445.1, May 18, 2005, 5 pages.
European Examination Report, European Application No. 99958445.1, Jul. 21, 2004, 8 pages.
European Examination Report, European Application No. 99958445.1, Mar. 12, 2002, 6 pages.
European Examination Report, European Application No. 00930715.8, Feb. 9, 2007, 5 pages.
European Examination Report, European Application No. 00930715.8, Oct. 7, 2005, 5 pages.
European Examination Report, European Application No. 00930715.8, Mar. 25, 2004, 4 pages.
European Examination Report, European Application No. 00930715.8, Jul. 11, 2002, 6 pages.
European Examination Report, European Application No. 00930707.5, Dec. 6, 2006, 7 pages.
European Examination Report, European Application No. 00930707.5, Mar. 11, 2005, 8 pages.
European Examination Report, European Application No. 00930707.5, Oct. 28, 2003, 4 pages.
European Examination Report, European Application No. 00930707.5, Mar. 17, 2003, 8 pages.
European Examination Report, European Application No. 00930707.5, Oct. 22, 2002, 4 pages.
Fauth et al. "Describing Instruction Set Processors Using nML" (Proc. Euro. Design & Test Conf., Paris, Mar. 1995, IEEE 1995, 5 pages.
Fisher, J. et al., "Custom-Fit Processors: Letting Applications Define Architectures", IEEE, 1996, 32 pages.
Freericks "The nML Machine Description Formalism" Bericht 1991/15, pp. 3-41).
Hadjiyiannis, G. et al., ISDL: An Instruction Set Description Language for Retargetability, DAC '97, ACM. 1997, 4 pages.
Halfhill, T.R., "Altera's New CPU for FPGAs" Microprocessor Report, Jun. 2004, pp. 15-20.
Halfhill, T.R. et al., "ARC Patent Looks Formidable," Microprocessor Report, Aug. 2005, pp. 3-11, vol. 19, Archive 8.
Halfhill, T.R., "ARC's Preconfigured Cores," Microprocessor Report, Mar. 2005, pp. 15-20, vol. 19, Archive 3.
Halfhill, T.R., "Busy Bees at Silicon Hive" Microprocessor Report, Jun. 2005, pp. 17-20, vol. 19, Archive 6.
Halfhill, T.R., "MIPS Embraces Configurable Technology" Microprocessor Report, Mar. 2003, pp. 7-15, vol. 17, Archive 3.
Halfhill, T.R., "Tensilica Patent Challenged," Microprocessor Report, Jun. 2003, p. 4, vol. 17, Archive 6.
Halfhill, T.R. et al., "Tensilica Patents Raise Eyebrows," Microprocessor Report, Dec. 2002, pp. 1, 7-10, vol. 16, Archive 12.
Halfhill, T.R., "Tensilica's Automaton Arrives," Microprocessor Report, Jul. 2004, pp. 22-26.
Halfhill, T.R., "Tensilica Patents Raise Eyebrows" Mdr--Microprocessor Report, dated Dec. 9, 2002, 6 pages.
Hartoog et al., "Generation of Software Tools from Processor Descriptions for Hardware/Software Codesign," ACM, Jun. 1997, pp. 303-306.
Hauk et al., "The Chimaera Reconfigurable Functional Unit." Proceedings of the IEEE Symposium on Field-Programmable Custom Computing Machines, 1997, pp. 87-96.
"HDL Chip Design" by Douglas J. Smith, Ninth printing Jul. 2001, minor updates. First Printing Jun. 1996. Doone Publications. ISBN 0-9651934-3-8. pp. 1-25.
Helbig, W. et al., "A DCFL E/D Mesfet GaAS Experimental RISC Machine," IEEE Transactions on Computers, Feb. 1989, pp. 263-274, vol. 38, No. 2.

Hennessy & Patterson, Computer Architecture A Quantitative Approach, 2nd Edition, Morgan Kaufmann Publishers, Inc. 1996, pp. 70-71 & 132, Chapter 2, Chapter 3, Sections 3.1-3.2, and Chapter 6, Sections 6.1 and 6.2.
Heuring, V.P. et al., "Computer Systems Design and Architecture," Menlo Park, CA: Addison Wesley Longman, Inc.1997, pp. 38-40.
Hogl, H. et al., "Enable ++: A General-Purpose L2 Trigger Processor," Nuclear Science Symp. & Medical Imaging Conf., vol. 2, Oct. 21-28, 1995, pp. 667-671.
Indian Office Action, Indian Application No. IN/PCT/2001/00420, Apr. 6, 2005, 1 page.
Indian Office Action, Indian Application No. IN/PCT/2001/00420, Jun. 24, 2005, 1 page.
Indian Office Action, Indian Application No. IN/PCT/2001/00420, Jan. 2005, 1 page.
InstantWeb. Free Online Computing Dictionary (FOLDOC), 1997, Search term: RISC, <http://www.instantweb.comffoldoc/foldoc.cgi?query=RISC>.
Intel Architecture Software Developer's Manual vol. 2: Instruction Set Reference, Intel Corporation, 1997, Chapters 1, 2, 3, Section 3.1, pp. 3-416 to 4-419 and 3-429.
Intel Pentium® Processor Family Developer's Manual vol. 3: Architecture and Programming Manual, Mt. Prospect, IL, Intel Corporation, 1996, pp. 3-4, 3-13, 2527, 25-31, 25-280.
Internet Publication http://www.retarget.com/brfchschk.html, Last Updated Sep. 10, 1998, Target Compiler Technologies N.V., [Retrieved on Jan. 24, 1999], 19 pages.
Internet Publication http://www.synopsys.com/products/designware/8051_ds.html, 1998, Synopsys, Inc., [Retrieved on Nov. 7, 1998], 8 pages.
Internet Publication http://www.synopsys.com/products/designware/dwpci_ds.html, 1998, Synopsys, Inc., [Retrieved on Nov. 7, 1998], 16 pages.
Internet Publication http://www.lexra.com/product.html, No. date, Lexra, Inc., [Retrieved on Nov. 7, 1998], 11 pages.
Internet Publication http://www.risccores.com/html/body aboutarc,htm, No. date, Argonaut RISC Cores, [Retrieved on Nov. 7, 1998], 13 pages.
Israel Notification Prior to Examination of Patent Application No. 170671, Jun. 4, 2007, 1 page.
Israel Official Notification Under Section 18 of the Law, Israel Patent Application No. 142342, Jun. 7, 2012, 4 pages.
Israel Office Action, Israel Patent Application No. 142342, May 29, 2005, 4 pages.
Korean Office Action, Korean Application No. 10-2001-7004710, Apr. 28, 2006, 5 pages.
Korean Office Action, Korean Application No. 10-2001-7004710, Oct. 26, 2007, 12 pages.
Korean Notice of Amendment, Korean Application No. 10-2001-7004710, Jun. 13, 2001, 2 pages.
Leupers, R. et al., Retargetable Code Generation based on Structural Processor Descriptions, Design Automation for Embedded Systems, vol. 3, No. 1, Jan. 1998, p. 1-36.
Mano, M. M. et al., "Logic and Computer Design Fundamentals," $2^{nd}$ Edition Updated, Upper Saddle River, New Jersey: Prentice Hall, 1997, pp. xiii-xiv and 9798.
May, D. et al., "The Transputer," Proceedings of the NATO Advanced Workshop on Neural Computers, Berlin, DE, Sep. 28-Oct. 2, 1987, pp. 477-486.
Merriam-Webster Online Dictionary, Search Term: Integrate, Merriam-Webster, Inc., 2005.
Patel, P. et al., "Architectural Features of the i860—Microprocessor RISC Core and on:Chip Caches," Proceedings of the International Conference on Computer Design: VLSI in Computers and Processors, IEEE Comp. Soc. Press, 1989, pp. 385-390.
Patterson, D.A. et al., "Computer Architecture: A Quantitative Approach," San Mateo, CA: Morgan Kaufmann Publishers, Inc., 1990, pp. 252-278.
PCT International Search Report, PCT Application No. PCT/IB99/02030, May 22, 2000, 3 pages.
PCT International Preliminary Examination Report, PCT Application No. PCT/IB99/02030, Jan. 8, 2001, 5 pages.

PCT International Search Report, PCT Application No. PCT/US00/13233, Feb. 27, 2001, 9 pages.
PCT International Preliminary Examination Report, PCT Application No. PCT/US00/13233, Jul. 31, 2001, 12 pages.
PCT International Search Report, PCT Application No. PCT/US00/13221, Feb. 27, 2001, 7 pages.
PCT International Preliminary Examination Report, PCT Application No. PCT/US00/13221, Aug. 17, 2001, 18 pages.
PCT International Search Report, PCT Application No. PCT/US00/13198, Nov. 5, 2001, 7 pages.
PCT International Preliminary Examination Report, PCT Application No. PCT/US00/13198, Jun. 3, 2002, 12 pages.
PCT International Search Report, PCT Application No. PCT/US00/13030, Feb. 27, 2001, 6 pages.
PCT International Preliminary Examination Report, PCT Application No. PCT/US00/13030, Aug. 10, 2001, 13 pages.
Razdan et al., "A High-Performance Microarchitecture with Hardware-Programmable Function Units," Proceedings of MICRO-27, Nov. 1997, 13 pages.
Rosenberg, J.M., "Dictionary of Computers, Information Processing, and Telecommunications," Second Edition, New York: John Wiley & Sons, 1987, p. 419.
Tensilica, Inc; Xtensa Instruction Set Architecture (ISA) Reference Manual Revision 1.0. (First 25 pages).
Tensilica, Inc. Instruction Extension Language (TIE) Reference Manual Revision 1.3, 1988-1999, 53 pages.
Vax Macro and Instruction Set Reference Manual, Digital Equipment Corporation, 1996, [Online] Retrieved from the Internet<URL:http://tigger.stcloudstate.edu/~tigger/openvms/72final/4515/4515pro.html#first_page>.
Wang et al., "Hardware/Software Instruction Set Configurability for System-on-Chip Processors," Proceedings of Design Automation Conference, 2001, pp. 184-188.
Warren, H.S., "Instruction Scheduling for the IBM Risc System/6000 Processor," IBM Journal of Research and Development, vol. 34, No. 1, 1990, pp. 85-92, XP000128183.
Wirthlin et al., "The Nano Processor: A Low Resource Reconfigurable Processor," IEEE Workshop on FPGAs for Custom Computing Machines, Napa, CA, Apr. 11,1994, pp. 23-30.
Wollan, V., "A Design Methodology Achieving Fast Development Cycles for Complex VLSI Architectures," Proc. on the European Conf. on Design Automation, Feb. 22-Mar. 25, 1993, pp. 532-535.
www.dictionary.com; search terms: processor, computer, instruction. (no date).
Yang, Jin-Hyuk, et al. "MetaCore: A Configurable & Instruction-Level Extensible DSP Core." Proceedings of the ASP-DAC '98 Asian and South Pacific Design Automation Conference 1998, Feb. 1998, pp. 325-326, XP-OO2137268.
Zavojnovic, V. et al., DSP Processor/Complier Co-Design A Quantitative Approach, Integrated Systems for Signal Processing, Aachen University Technology, p. 761-765, 1998.
Chinese First Office Action, Chinese Application No. 00808459.9, Jul. 25, 2003, 16 pages.
Chinese Second Office Action, Chinese Application No. 00808459.9, Jan. 16, 2004, 13 pages.
European Examination Report, European Application No. 00928970.3, Jun. 14, 2002, 3 pages.

* cited by examiner

METHOD AND APPARATUS FOR MANAGING THE CONFIGURATION AND FUNCTIONALITY OF A SEMICONDUCTOR DESIGN

CROSS-REFERENCE TO RELATED APPLICATIONS

This application is a continuation of U.S. patent application Ser. No. 11/067,086, filed on Feb. 25, 2005, which is a continuation of U.S. patent application Ser. No. 09/418,663, filed on Oct. 14, 1999, now U.S. Pat. No. 6,862,563, which claims the benefit of U.S. Provisional Application Ser. No. 60/104,271, filed Oct. 14, 1998. Each of these applications is hereby incorporated in their entirety herein by reference.

BACKGROUND OF THE INVENTION

1. Field of the Invention

The invention relates generally to the field of semiconductor design and layout and computer automated design (CAD) for semiconductors. More specifically, the invention provides a method for managing the configuration, design parameters, and functionality of an integrated circuit design in which custom instructions and other elements may be arbitrarily controlled by the designer.

2. Description of Related Technology

Several types of computer aided design (CAD) tools are available to design and fabricate integrated circuits (IC). Such computer-aided or automated IC design tools can include modules or programs addressing both the synthesis and optimization processes. Synthesis is generally defined as an automatic method of converting a higher level of abstraction to a lower level of abstraction, and can include any desired combination of synthesis techniques which occur at various levels of abstraction. So-called "behavioral synthesis" is a design tool wherein the behavior (e.g. inputs, outputs, and functionality) of a desired IC are entered into a computer program to design a device that exhibits the desired behavior. Such tools permit IC designers to produce increasingly complex and capable devices, sometimes having logic gate counts in the tens of millions, with few or no errors and in a much shorter time period than would be otherwise possible with manual design techniques such as hand layouts.

Examples of synthesis processes which involve different levels of abstraction include architectural level synthesis and logic level synthesis, both of which may be incorporated into the IC design process.

Architectural level synthesis is primarily concerned with the macroscopic structure of the circuit; it utilizes functional blocks (including information relating to their interconnections and internal functionality). Architectural level synthesis includes register transfer level (RTL) synthesis, which can have multi-bit components such as registers and operators.

Logic level synthesis, on the other hand, is concerned with gate level design. Logic level synthesis determines a microscopic structure of a circuit and transforms a logic model into an interconnection of instances of library cells. The result of the logic level synthesis is a netlist of logic devices and their interconnections. Logic-level synthesizers (so-called synthesis "engines") are available from several commercial vendors.

The synthesis process generally begins with the designer compiling a set of IC specifications based on the desired functionality of the target device. These specifications are then encoded in a hardware description language (HDL) such as VHDL® (VHSIC hardware description language) available from IEEE of New York, N.Y., or Verilog® available from Cadence Design Systems, Inc. of Santa Clara, Calif. The specifications define an IC in terms of the desired inputs and outputs, as well as desired functionality such as available memory or clock speed. From the HDL, the designer then generates a "netlist" including a list of gates and their interconnections, which is descriptive of the circuitry of the desired IC. Ultimately, the design is compiled and masks fabricated for producing the physical IC. FIG. 1 illustrates a typical prior art IC design and fabrication approach.

Unfortunately, while well suited for simpler devices and single components, the aforementioned prior art approaches to automated IC design suffer several limitations, especially when applied to the design of more complex ICs such as CPU-based processors. These problems stem largely from the requirement that the instruction set be fixed prior to, and not modifiable during, the design and synthesis processes, thereby reducing the flexibility and capability afforded the designer both during and after the design process. These problems are highlighted by the practice of supplying pre-defined CPU designs to users desiring to integrate a processor into their systems Integrated Circuit design. Specifically, by not being able to consider certain instructions, functions, or components in the design during synthesis, the designer is required to attempt to "backfit" these elements to the design, which often times creates compatibility issues or other problems. This disability also effectively precludes optimization of the design for certain parameters (such as die size or clock speed) since the resulting design necessarily has a higher gate count, and does not have the benefit of customized instructions specific to the desired architecture and functionality. Furthermore, such prior art systems are incapable of automatically assembling a HDL model of the complete processor and simulating its operation, an approach which can greatly increase the efficiency and effectiveness of the design process.

Based on the foregoing, an improved method (and associated apparatus) is needed for managing the configuration, design parameters, and functionality of an integrated circuit design in which the instruction set can be interactively varied by the user. Specifically, such an improved method would permit the user to add or subtract existing instructions, as well as generate new instructions specifically adapted for use with the design, while retaining the ability to verify the accuracy and correctness of the VHDL model and the subsequent synthesized logic or layout. Additionally, the improved method would allow the user to generate descriptive models of the complete processor as opposed to just individual logic circuits or modules, thereby further enhancing the simulation and synthesis processes. Furthermore, the user could automatically or interactively select various design parameters (such as the existence of a memory interface or peripheral component) during the design and synthesis processes to preclude having to retrofit or modify the design at a later time. This latter ability would greatly enhance the integration of such components into the design, thereby effectively eliminating incompatibilities, and reducing the resulting IC to its smallest possible dimension, clock speed, and power consumption, with the least amount of effort and cost.

SUMMARY OF THE INVENTION

The present invention satisfies the aforementioned needs by providing an automated means of managing the configuration, design parameters, and functionality of an integrated circuit design, through the use of an interactive computer program.

In a first aspect of the invention, an improved method for managing the configuration, design parameters, and functionality of an integrated circuit design is disclosed. In one embodiment of the disclosed method, the user inputs information relating to the design hierarchy and HDL library files, and generates a computer program script based on these inputs. Custom instructions and other elements (such as special-purpose registers, new condition code choices, local scratchpad RAM, or a library of multimedia extensions for 3D or DSP applications) may be arbitrarily added to the existing HDL instruction set by the designer as well during the design process. Unlike adding an external ASIC or other component post-synthesis, these instructions become included within the processor instruction and register set so as to eliminate integration problems, and allow maximal optimization based on one or more selected attributes. Ultimately, the generated script is run, and a customized HDL model of the IC is produced based on the user-defined instruction set. This customized HDL model is then used as the basis for further simulation and/or synthesis as desired by the designer. This method further affords the designer the ability to generate an HDL model of the entire IC, thereby greatly enhancing the efficiency of the design process. This ability is especially useful for complex CPU-based processor designs, although it may readily be applied to other types of components.

In a second aspect of the invention, the aforementioned method is further embodied in a menu-driven computer program which may be used in conjunction with a microcomputer or other similar device for designing and managing the configuration of integrated circuits. In one exemplary embodiment, this menu-driven computer program comprises a series of routines or "modules" which perform various sets or groups of related functions. An interactive architecture module gathers information about the designer's system, available libraries, and the design configuration to be generated. A hierarchy generation module assists in ordering logical blocks or entities and routing signals within the design, as well as ultimately generating a netlist. An HDL generation module generates a merged HDL file descriptive of the design. In the exemplary embodiment, these modules are connected together via computer programs scripts or user initiated execution of the individual modules. In yet another embodiment, these modules may also be compiled into one comprehensive program, and bundled with other software tools that facilitate rapid and integrated design of the subject IC on a standard microcomputer.

In a third aspect of the invention, an apparatus for generating, simulating, and/or synthesizing an integrated circuit design using the aforementioned method is disclosed. In a first embodiment, a microcomputer having a microprocessor, display, and input device is used to run the previously described menu-driven computer program, thereby allowing the designer to interact with the program during the design, simulation, and/or synthesis processes. The microcomputer further includes a storage device and network interface to allow for the storage, retrieval, and sharing of information between two or more microcomputers configured with the aforementioned computer program.

In a fourth aspect of the invention, an integrated circuit design depicted in a hardware description language and synthesized using the aforementioned method of the invention is disclosed.

In a fifth aspect of the invention, an integrated circuit fabricated using the aforementioned synthesized design is disclosed. In one exemplary embodiment, the integrated circuit comprises a reduced instruction set CPU (RISC) processor.

In a sixth aspect of the invention, a data storage device adapted for use with a computer system and comprising in part the aforementioned computer program is disclosed.

DETAILED DESCRIPTION OF THE INVENTION

Figure 1:
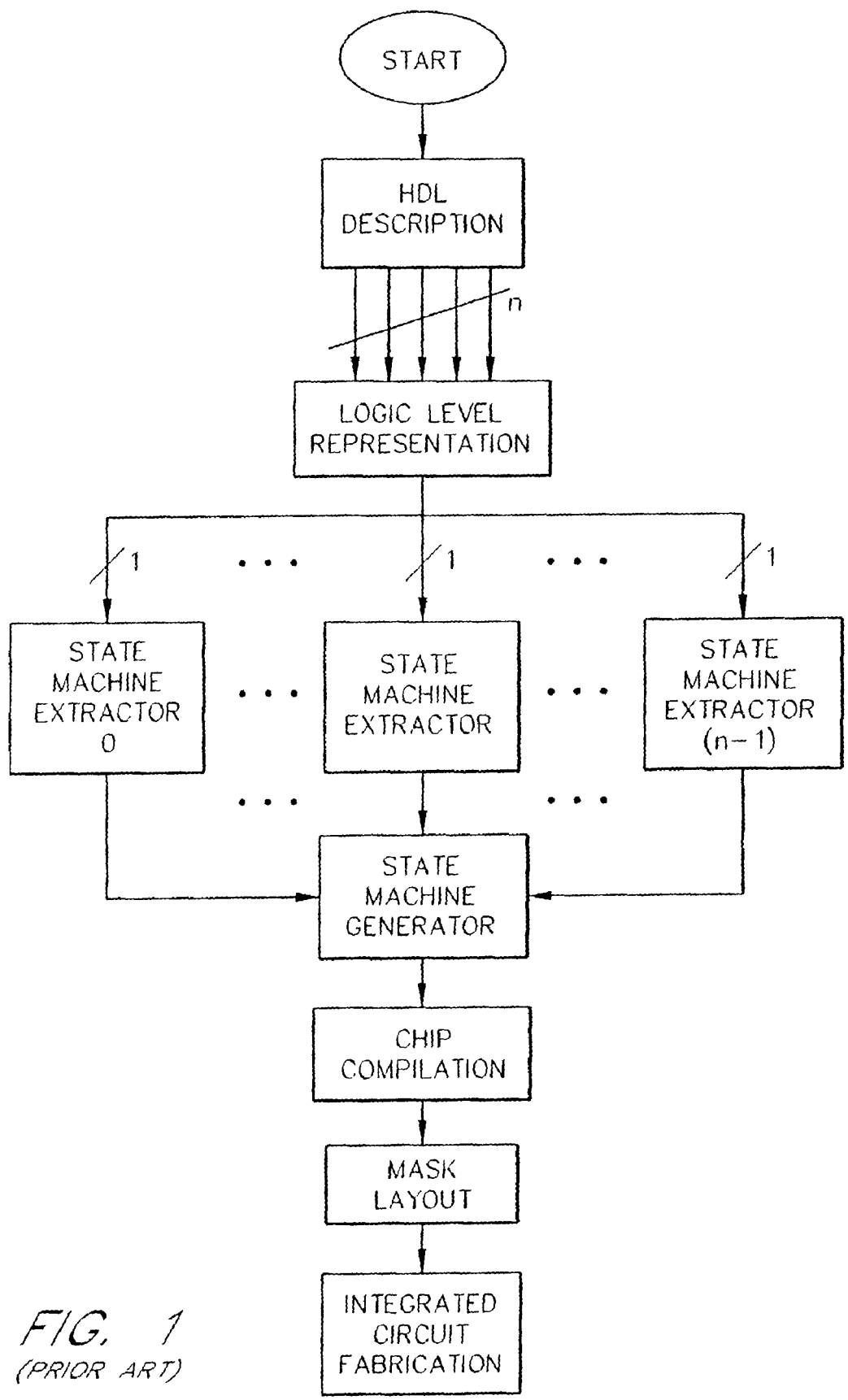
FIG. 1 is a flow diagram illustrating a typical prior art integrated circuit design and synthesis method.

Reference is now made to the drawings wherein like numerals refer to like parts throughout.

As used herein, the terms "computer program," "routine," "subroutine," and "algorithm" are essentially synonymous, with "computer program" being used typically (but not exclusively) to describe collections or groups of the latter three elements. In general, however, all of the aforementioned terms as used herein are meant to encompass any series of logical steps performed in a sequence to accomplish a given purpose.

Also, while the following description relates explicitly to the VHDL environment, it can be appreciated that the general principles and functionality of the present invention may be embodied in other description language environments including, for example, Verilog®.

Background of "ARC™"

In the following discussion, the term "ARC™" (ARC RISC Core) refers to a microprocessor-like central processing unit (CPU) architecture. While the method of present invention can be applied to other types of integrated circuits including, for example, application specific integrated circuits (ASICs) and field-programmable gate arrays (FPGAs), the microprocessor-like CPU design is chosen to more clearly illustrate the operation and capability of the invention.

As discussed in greater detail below, the present invention takes in one embodiment the form of a computer program having a synthesizable and customizable (i.e., "soft") macro with a complementary suite of software tools for configuration and hardware-software co-design. This computer program employs the concept of a "system builder" to accomplish much of the desired functionality. In the present context, the ARC system builder refers to that portion or module of the computer program whereby the designer controls the generation of the subject CPU design. In one particular embodiment, the System builder directs the assembly of a series of predefined VHDL based designs along with design elements created by the user (also in VHDL, or whatever other description language is chosen) to produce a new, custom CPU specific to the user's specifications and needs. Hence, the system builder controls the creation and testing of HDL-based synthesizable CPUs. This approach further provides users with a great deal of flexibility in configuring the specific attributes of the resulting CPU.

The ARC System builder is embodied in a series of "scripts" that allows users to build customized ARC systems along with support files for both design simulation and synthesis. A script is more specifically a computer program, often written in a special computer programming language designed for the purpose. Such script languages incluedv for example the "perl" and language commonly employed in UNIX based computer systems as a "scripting language." There are other languages available to write scripts compatible with the present invention. It is noted that for the purposes of the present discussion, the term "scripts" refers to any series of logical instructions or actions of a computer program which are executed in a predefined order.

When executed, the ARC system builder script produces a series of questions, answered primarily through menus (as illustrated in greater detail below in the exemplary menu structure of Appendix I), the answers to which are used to build the VHDL simulator and synthesis files. An installation script allows several different ARC features to be selected, such as processor cache size and cache line length, size of external memory space to be cached, and clock period/skew. The script creates a working directory for the user, and further generates various VHDL files necessary to support further customized VHDL development.

The term "makefile" as used herein refers to the commonly used UNIX makefile function or similar function of a computer system well known to those of skill in the computer programming arts. The makefile function causes other programs or algorithms resident in the computer system to be executed in the specified order. In addition, it further specifies the names or locations of data files and other information necessary to the successful operation of the specified programs. It is noted, however, that the invention disclosed herein may utilize file structures other than the "makefile" type to produce the desired functionality.

Central to the method of the invention is the concept that one computer program may write another program, which is subsequently executed by the computer system. For example, one script may write a second script that is tailored by user input to perform a specific task. The task is then performed when the second script is executed. This "dynamic scripting" is employed in various aspects of the invention, as further described herein.

Detailed Description of Method

Figure 2:
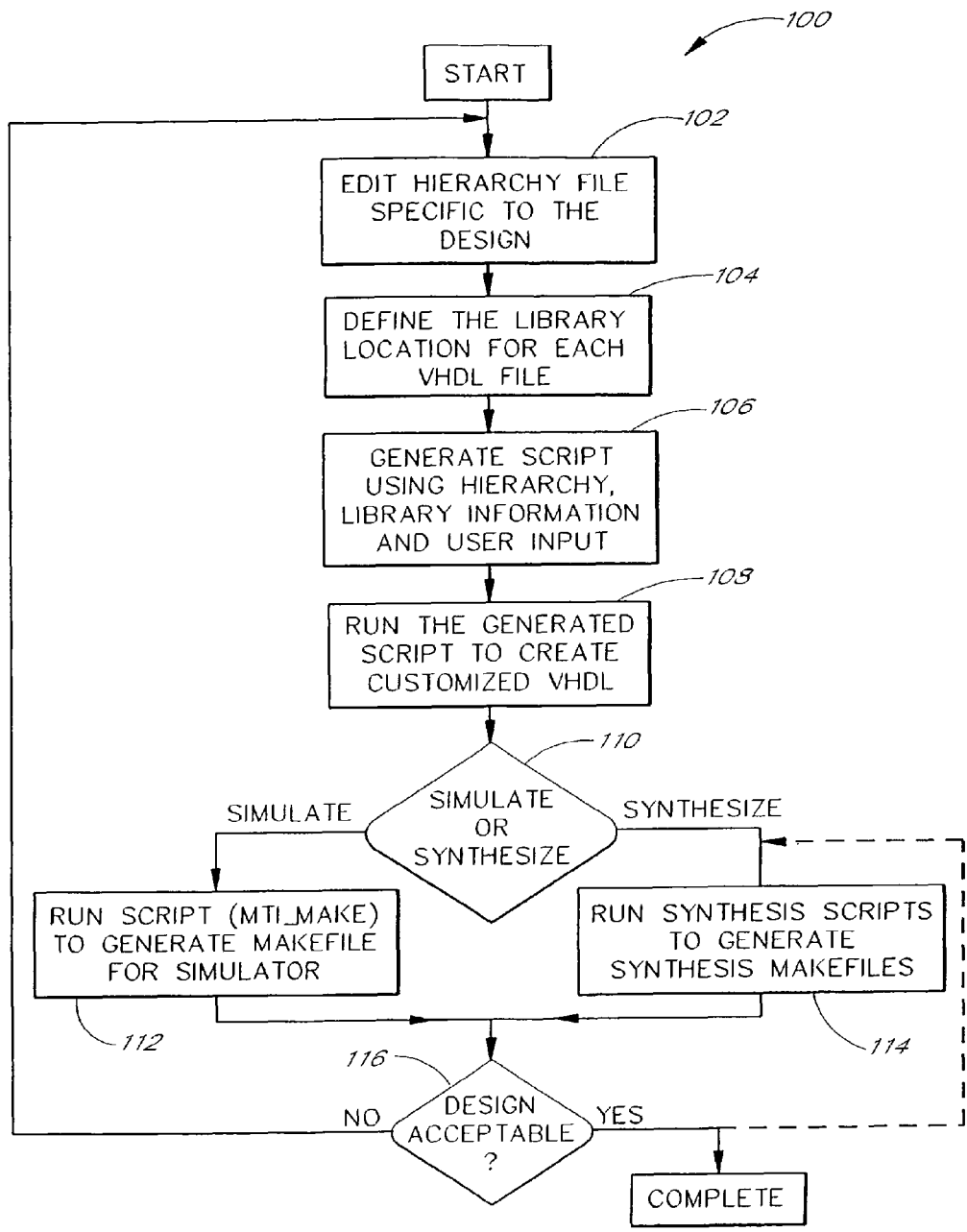
FIG. 2 is a flow diagram illustrating the general integrated circuit design and synthesis method of the invention.

Referring now to FIG. 2, one embodiment of the generalized method of the invention is described. While this description is presented in terms of an algorithm or computer program running on a microcomputer or other similar processing device, it can be appreciated that other hardware environments (including minicomputers, workstations, networked computers, "supercomputers", and mainframes) may be used to practice the method 100. Additionally, one or more portions of the computer program may be embodied in hardware or firmware as opposed to software if desired, such alternate embodiments being well within the skill of the computer artisan.

Initially, the hierarchy file specific to the processor design under consideration is edited in the first step 102. Specifically, desired modules or functions for the design are selected by the user, and instructions relating to the design are added, subtracted, or generated as necessary. For example, in signal processing applications, it is often advantageous for CPUs to include a single "multiply and accumulate" (MAC) instruction. This instruction commonly improves system performance and reduces the amount of computer code required to perform signal processing tasks; two desirable characteristics in such systems. Conversely, applications that are essentially logical control oriented in nature have little or no need for such an instruction. Eliminating the instruction from a purpose-built CPU reduces the CPU die size and gate count, also a generally preferred advantage. In still another case, an instruction that is only of value to one specific application may be defined and implemented by designers. In all of these examples, the present invention permits designers a greater degree of control over the CPU design and more flexibility in making design tradeoffs and optimizations.

It should also be recognized that when using the system builder of the present embodiment in its most common mode, the hierarchy of design is determined by the script, and a "hierarchy builder" is called by the script builder.

In step 104 of the method of FIG. 2, the technology library location for each VHDL file is defined by the user. The technology library files in the present invention store all of the information related to cells necessary for the synthesis process, including for example logical function, input/output timing, and any associated constraints. In the present invention, each user can define his/her own library name and location(s), thereby adding further flexibility.

A makefile is then generated in the third step 106 using the hierarchy file information, library information previously described, as well as additional user input information relating to the desired configuration and attributes of the device. For example, in the ARC system builder, the user is asked to input the type of "build" (e.g., overall device or system configuration), width of the external memory system data bus, different types of extensions, cache type/size, etc., as described in additional detail below with respect to FIGS. 3a-3e. It will be recognized that such user input may be in the form of an interactive software prompt, or alternatively may occur using command line parameters, by accessing a pre-built configuration file, or a concurrently running application or other computer program resident on the designer's system or another system linked thereto. Many other methods of input are also possible, all of which are considered to be within the scope of the invention.

Next, the makefile generated in the third step 106 is run in a fourth step 108 to create a customized VHDL model. As part of this step, the user is presented with a variety of optional response menus and prompts to further define the VHDL model based on his/her desired attributes.

At this point in the program, a decision is made whether to synthesize or simulate the design (step 110). If simulation is chosen, a separate script ("MTI-make" in the present embodiment) is run in step 112 to generate a separate simulation makefile for use in the simulation. Simulation scripts and makefiles are generally well known to those of ordinary skill in the art, and accordingly will not be discussed further herein. Alternatively, if synthesis is chosen, the synthesis scripts) (e.g., "synopsys_make") are run in step 114 to generate corresponding synthesis makefiles. After completion of the synthesis/simulation scripts, the adequacy of the design is evaluated in step 116. For example, a synthesis engine may create a specific physical layout of the design that meets the performance criteria of the overall design process yet does not meet the die size requirements. In this case, the designer will make changes to the control files, libraries, or other elements that can affect the die size. The resulting set of design information is then used to re-run the synthesis script.

Note that there are many different criteria that may be used to determine whether or not a design is acceptable. In general, each design will have a different set of criteria used to determine the acceptability of the final design. Die size, power consumption, clock speed, and numerous other factors may constitute alone or collectively design constraints or targets. This great variability in acceptance criteria is one factor that demands the flexibility of the present invention.

If the generated design is acceptable, the design process is completed. If the design is not acceptable, the process steps beginning with step 102 are re-performed until an acceptable design is achieved. In this fashion, the method 100 is iterative. Note that if the simulation path 112 is chosen in order to simulate the operation of the generated design, the user may subsequently run the synthesis scripts per step 114 (dotted line in FIG. 2) if desired to synthesize the logical design into a physical structure.

Appendix I illustrates the operation of an algorithm utilizing the method of FIG. 2. In Appendix I, several explicit examples illustrating various menu structures, design considerations, and user input options are presented. Note that these examples are merely illustrative of the general process performed by the user in practicing the method of the present invention using the VHDL software embodiment set forth herein.

Appendix II is a list of the VHDL script files used in conjunction with the VHDL embodiment of the algorithm of the present invention.

It is noted that while the source code for the embodiment of the computer program set forth herein is written using AWK, a programming language commonly found on UNIX workstations, but also available on other personal computers, the program may be embodied using any of a number of different programming languages such as, for example, $C^{++}$. The source code directed to the exemplary AWK embodiment of the invention described herein is set forth in Applicant's aforementioned Provisional U.S. Patent Application No. 60/104,271, which is incorporated herein by reference in its entirety.

Figure 2A:
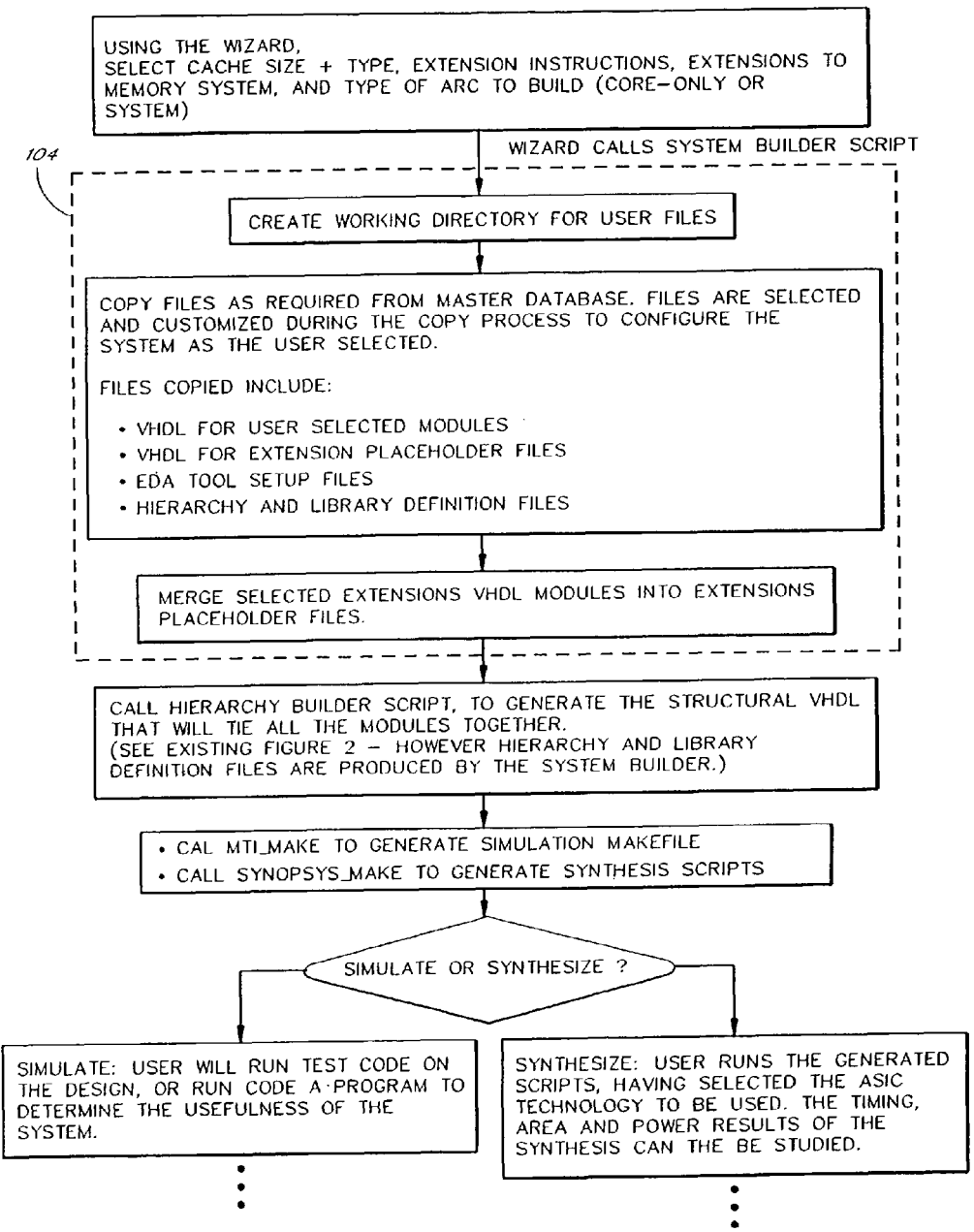
FIG. 2a is a flow diagram illustrating one specific embodiment of the generalized method of FIG. 2.

Referring now to FIG. 2a, one specific embodiment of the general method of FIG. 2 is described. In this embodiment, certain steps of the method depicted in FIG. 2 are separated into constituent parts for illustration purposes. For example, step 102 of FIG. 2 is separated into an interactive ("Wizard™") component and a hierarchy generator ("hiergen") component (not shown). The interactive component of step 102 provides substantially all of the direct user interaction control. Through a series of questions answered by the user, the program selects the relevant design elements necessary to realize the user's design. Portions of this information are used by the hierarchy generator to create a makefile script that is executed to build the HDL hierarchy.

Similarly, the step 104 of defining the library location for each VHDL file in FIG. 2 corresponds to the steps of (i)

creating a working directory 204, (ii) copying files from a master database 206, and merging the selected extension VHDL modules into placeholder files 208. The remainder of method 100 depicted in FIG. 2a generally parallels that of FIG. 2.

It will be appreciated by one skilled in the relevant art that there are a large number of alternative partitionings or structures of the flowchart of FIG. 2, each of which results in the same or similar sets of scripts, makefiles, and other design data for a given set of input data. Further, it may be advantageous for additional data or partitionings to be selected in order to utilize commonly available tools for executing portions of the method 100. Also, the order of performance of several of the individual steps present in the method of FIG. 2 (and FIG. 2a) may be permuted without departing from the invention as disclosed herein.

Referring now to FIGS. 3a-3e, one embodiment of the architecture functionality of the invention ("ARChitect™") is described in detail. The architecture module essentially gathers information about the designer's system, including for example, specifications from the designer's libraries, and assembles this information for later use by other modules within the program. The output of the ARChitect™ process is an HDL synthesizable model of the IC under design.

Figure 3A:
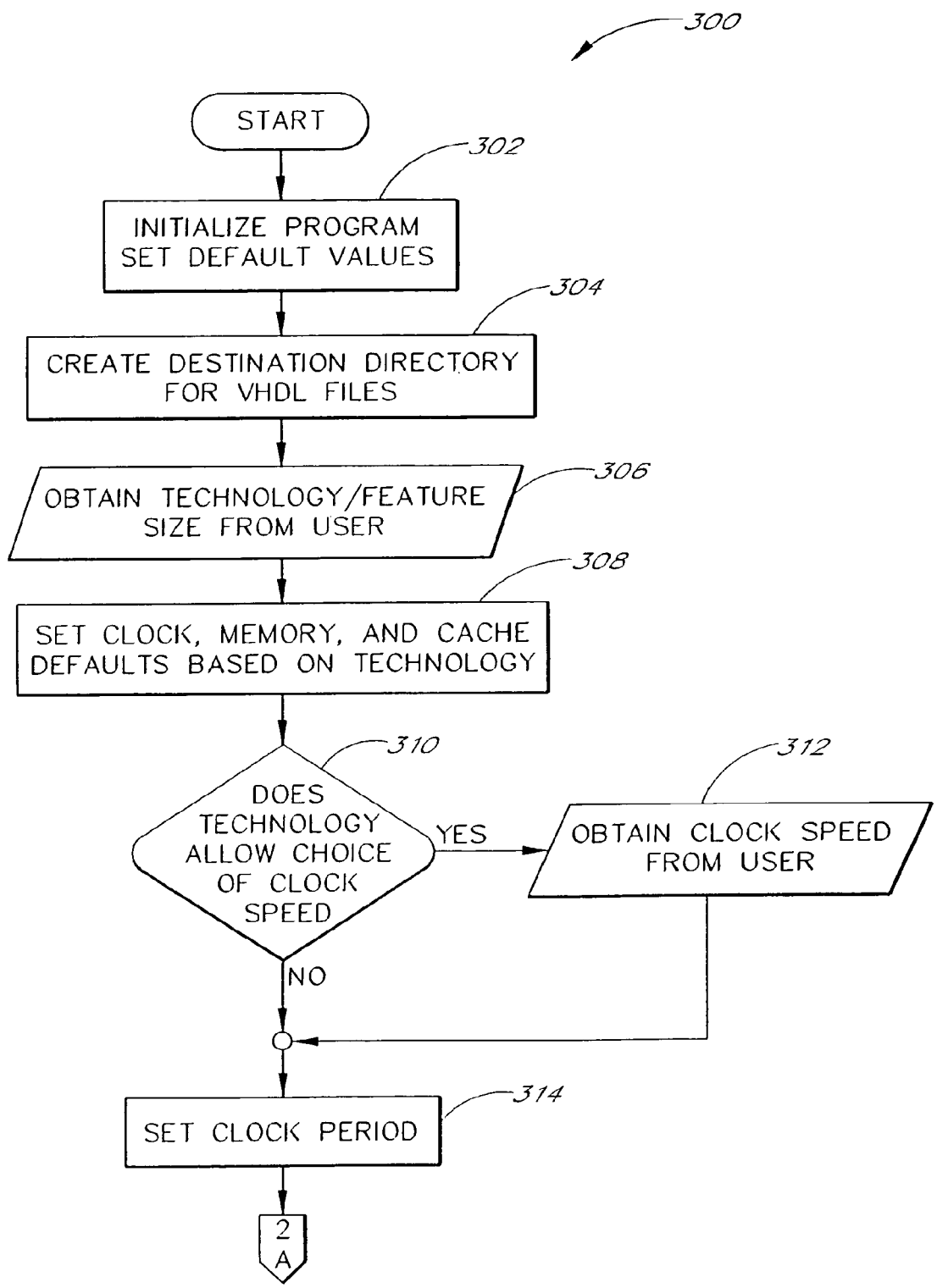
FIGS. 3a-3e collectively comprise a logical flow diagram illustrating one exemplary embodiment of the architecture module of the invention.

As shown in FIG. 3a, the process 300 specifically employed by the ARChitect™ module comprises a series of steps, the first of which is initializing the program and setting default values 302. Next, a destination directory is created in step 304 for the HDL (in this case VHDL) files to be generated in subsequent steps. In step 306, the technology/feature size is obtained from the user (or another source, as previously described). For example, the user may desire a 0.18 micron process for their design.

In step 308, the system clock, memory configuration, and cache default values are set based on the technology chosen in step 306 above. If the technology chosen by the user allows a choice of clock speed, the user is prompted (or the selection otherwise obtained) in steps 310 and 312. The clock period is then set per step 314.

Figure 3B:
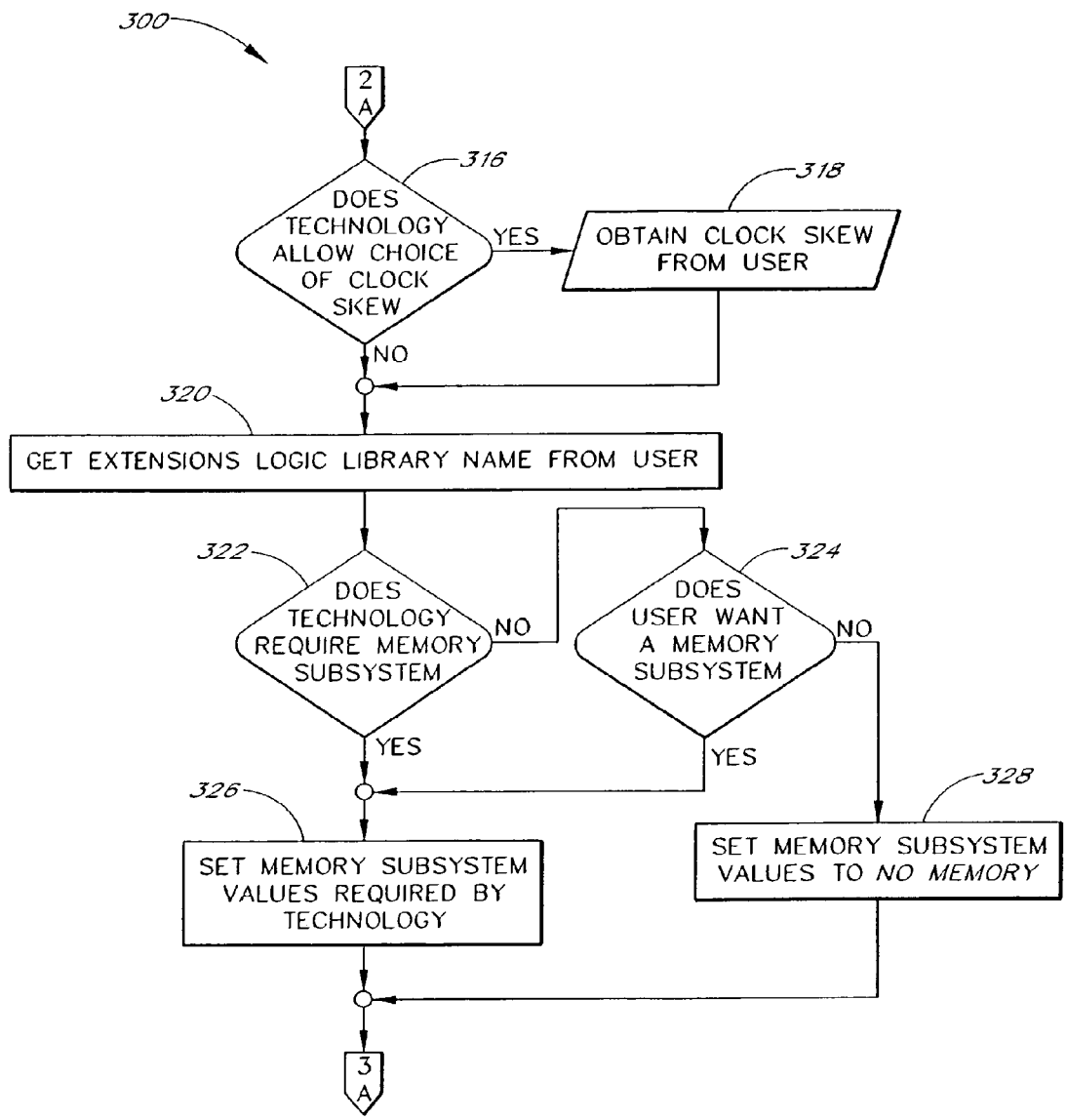

Referring now to FIG. 3b, the process 300 continues with steps 316 and 318, wherein the clock skew is selected (or otherwise defaulted). The extensions logic library name/location is then obtained from the user in step 320. As used herein, the term "extensions" refers to a set of predetermined logical functions. For example, extensions within the ARC system may include rotate, arithmetic and logical shifts within the barrel shifter, small multi-cycle multiply, MAC function, swap function (for swapping upper and lower bytes), timer interrupt, and the like. Lastly, in steps 322-328, the need or user desire for a memory subsystem such as a scratchpad RAM is analyzed (based on the user's technology choice), and the memory subsystem values are set accordingly.

Figure 3C:
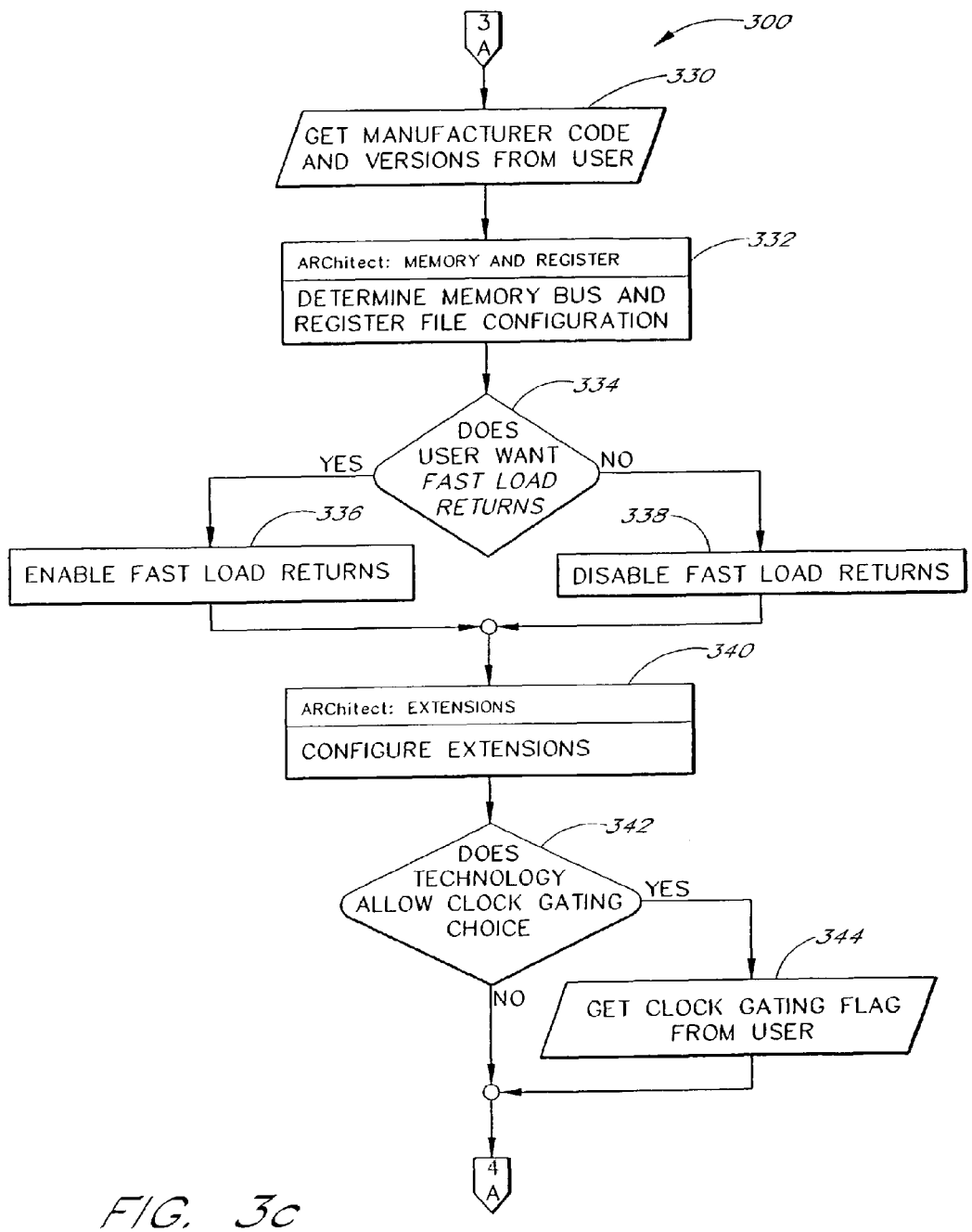

Referring now to FIG. 3c, the method 300 continues with step 330, wherein the user's manufacturer code (specific to each user entity) and version are obtained from the user. In step 332, the memory bus and register file configuration required for the design are determined; see the discussion of FIG. 4 herein for further details of this process. Once the memory/register configuration is determined; the user is prompted in step 334 to determine if the use of fast load returns is desired. As used herein, the term "fast load returns" refers to the condition in which the processor initiates a load operation but continues other execution before the load has been confirmed as being completed. Steps 336-338 allow the user to enable/disable this functionality, respectively, as desired.

Next, in step 340, the system configures the extensions used with the design as specified in step 320 described above. FIGS. 5a-5h depicts this process in greater detail, as discussed further below. The user's choice of technology (step 306) is then examined in step 342 to determine if clock gating is allowed; if so, the user is prompted for a clock gating flag in step 344.

Figure 3D:
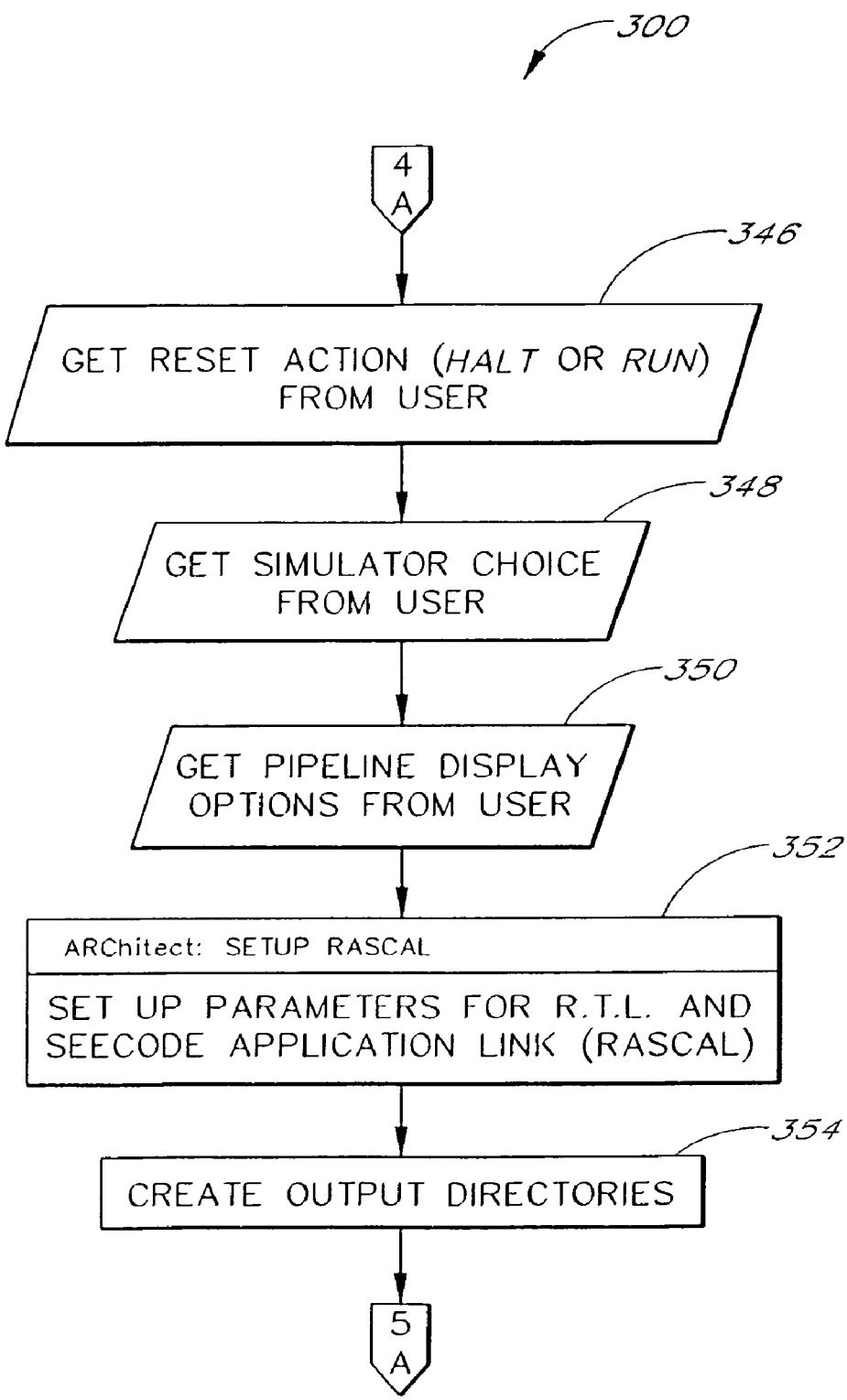

Referring now to FIG. 3d, the user is next prompted for a series of inputs including the desired reset action (i.e., "halt" or "run") per step 346, simulator choice (step 348), and pipeline display options (step 350). In step 352, the setup parameters for the register transfer link (RTL) and SeeCode Application Link ("RASCAL™") are defined, as discussed in greater detail below with reference to FIG. 8. RASCAL™ is a utility module available from ARC Cores, Ltd. that connects the debugger module to the MTI simulator. This connection allows the debugger to control the simulation of code on the IC system model in the MTI simulator for hardware/software co-verification. The output directories for the files are then created in step 354.

Figure 3E:
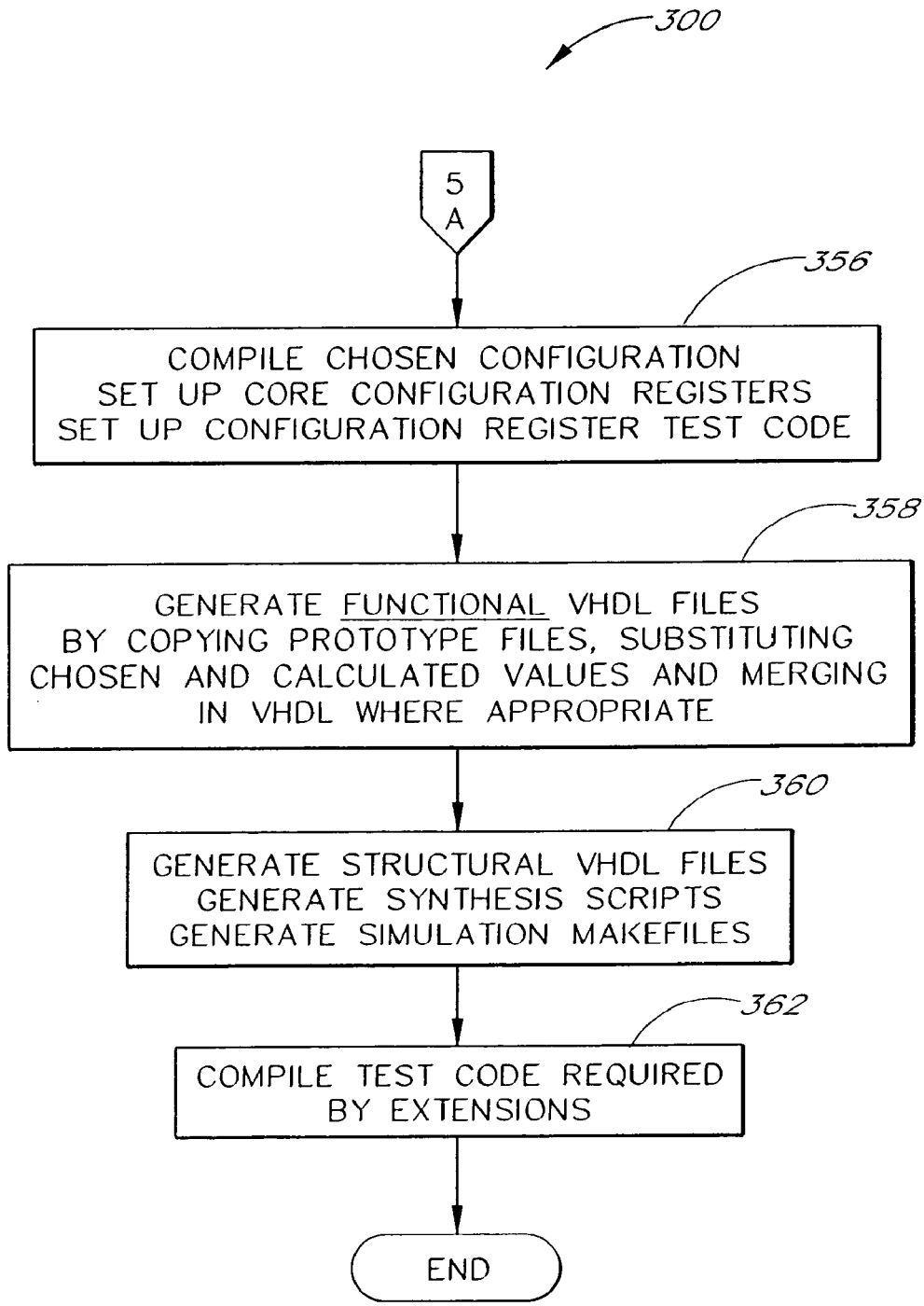

Referring now to FIG. 3e, the configuration is compiled, the core configuration registers and configuration register test code are set up per step 356. Next, in step 358, the functional HDL files are generated by (i) copying prototype files; (ii) substituting chosen and calculated values where required; and (iii) merging in the HDL where required. Note that in the illustrated embodiment, only the prototype files actually required for the selected configuration are copied.

In step 360, the structural HDL files are generated, along with the synthesis scripts and simulation makefiles. Lastly, the test code required by the chosen extensions is compiled in step 362.

Figure 4:
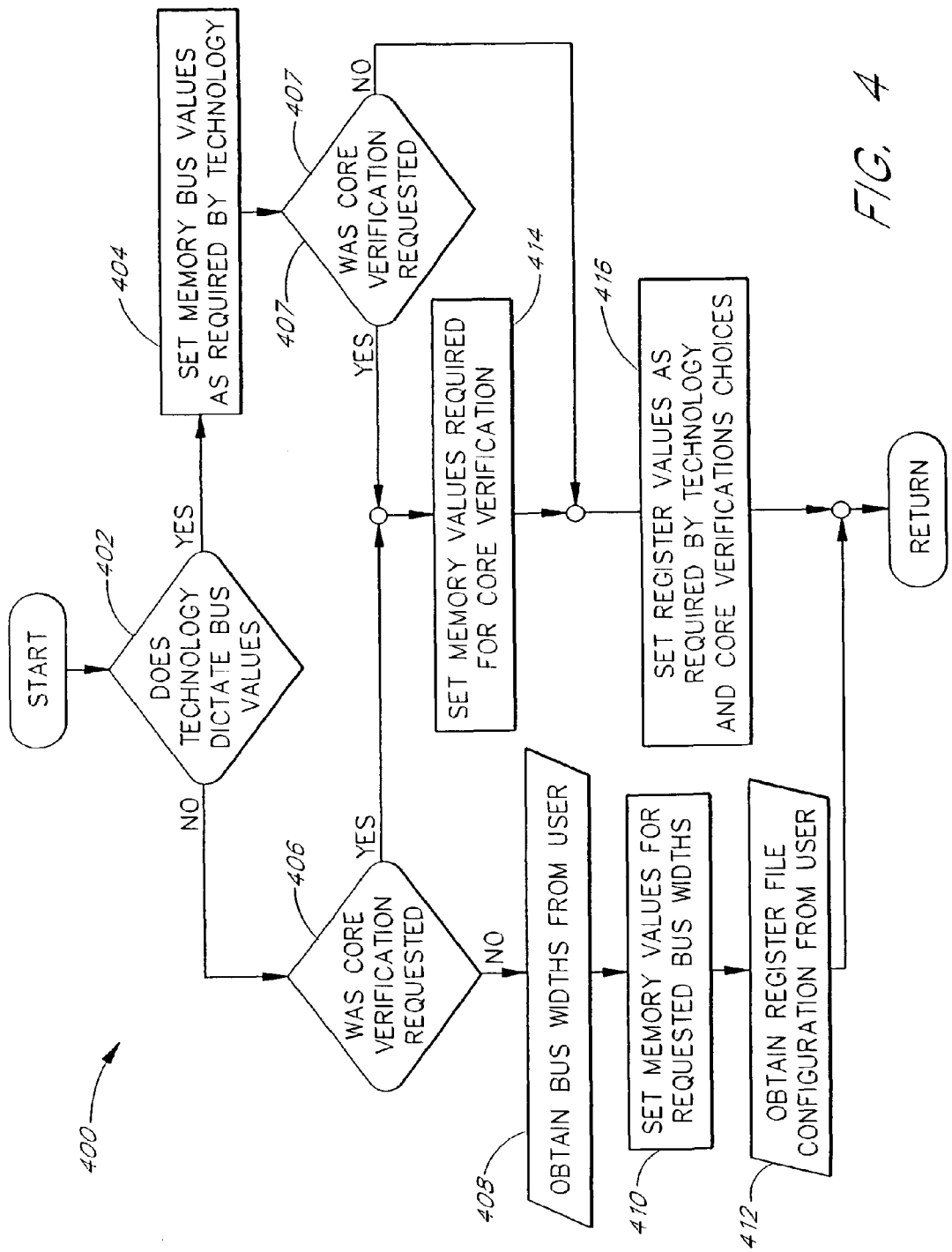
FIG. 4 is a logical flow diagram illustrating one exemplary embodiment of the method of determining the memory and register configuration of the system under design as shown generally in FIG. 3c herein.

Referring now to FIG. 4, one exemplary embodiment of the method of determining the memory and register configuration of the system under design as shown generally in step 332 of FIG. 3c is described. The method 400 comprises an initial determination in step 402 of whether the bus parameters are dictated by the technology previously chosen in step 306 (FIG. 3a). If the chosen technology requires specific bus values, these values are set in step 404. If not, (or alternatively, after setting the bus values in step 404), it is next determined whether core verification was requested by the user (steps 406, 407). If not, and the technology selected does not dictate the bus values, then the user is prompted to provide the desired bus widths in step 408. The memory values appropriate to the selected bus width are then set in step 410, and the user prompted for the desired register file configuration in step 412.

If core verification was requested by the user in steps 406 or 407, the memory values required for such verification are set in step 414, and the register values required by the selected technology and the core verification are set in step 416.

In the case that the technology selected does dictate the bus values, and core verification is not selected, then the register values are set per step 416 previously described.

Figure 5A:
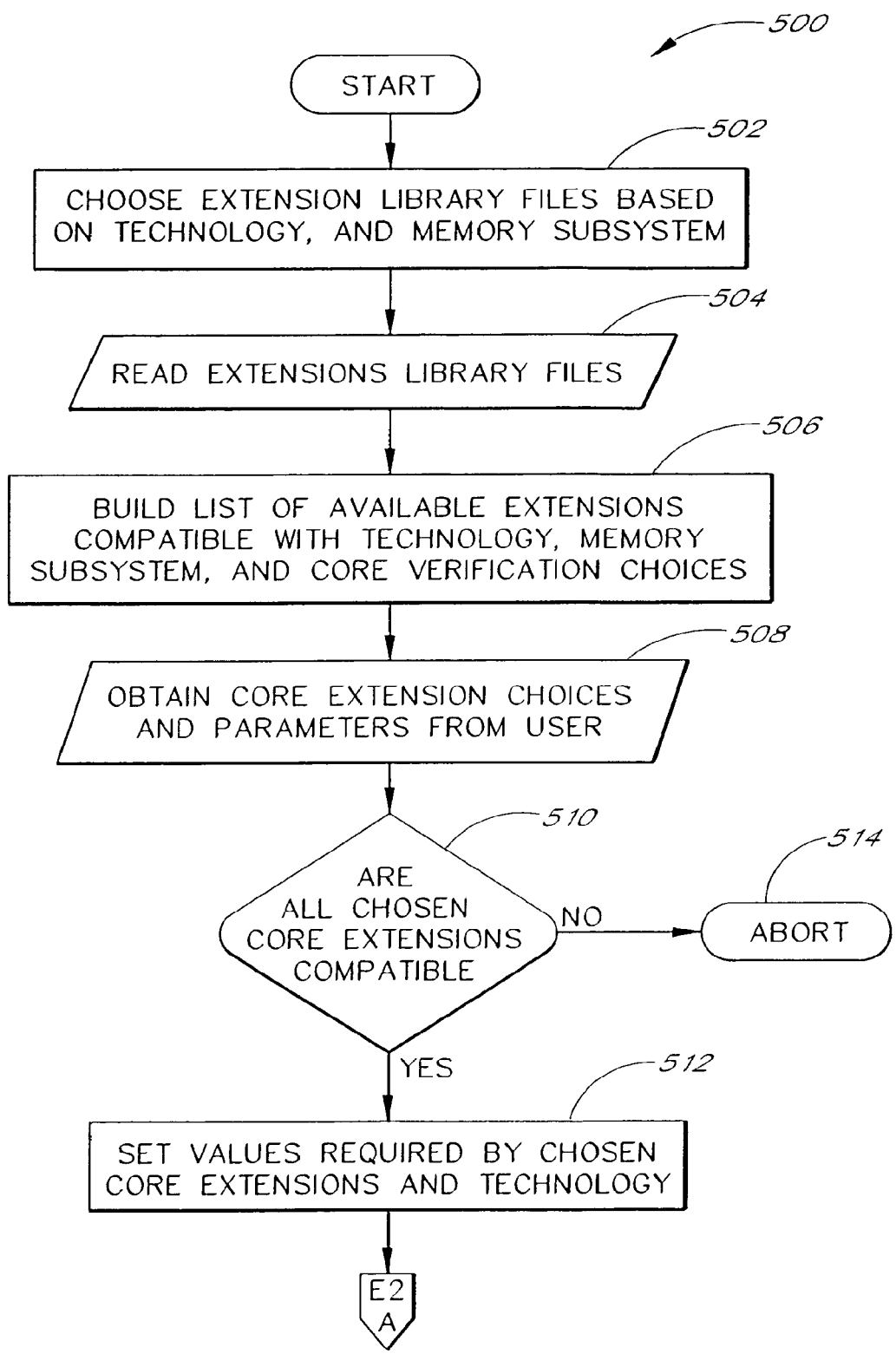
FIGS. 5a-5h collectively comprise a logical flow diagram illustrating one exemplary embodiment of the method of configuring file extensions as shown generally in FIG. 3c herein.

Referring now to FIGS. 5a-5h, one exemplary embodiment of the method of configuring file extensions as shown generally in step 340 of FIG. 3c herein is described. As illustrated in FIG. 5a, the method 500 comprises first choosing one or more extensions library files in step 502 based on the technology initially selected and the memory subsystem configuration previously discussed. In step 504, the chosen extensions library file(s) are read. A list of available extensions compatible with the selected technology, memory subsystem configuration, and core verification choices is then built in step 506. Next, the user is prompted for specific core extension choices and associated parameters in step 508. Specifically, extensions include core registers, ALU extensions that provide more operations, auxiliary registers, condition codes, FIFO (first in-first out memory), increasing the number of pending load/stores that may be issued, and interrupts. After the user input has been received in step 508, each of the user core extension choices is analyzed to determine if it is compatible with the other choices made by the user (step 510). If so, the values required by those user selected core extensions are set in step 512. Note that the selection of some extensions will require the selection of other extensions which are needed for support functions. If not, the extension algorithm 500 is aborted in step 514, and restarted. It will be recognized that step 510 herein may be accomplished interactively, such that when the user is making selections in step 508, they will be immediately apprised of the compatibility of the extensions chosen. Alternatively, the method 500 may be structured such that the system will not allow incompatible choices, either by prompting the user to make another selection, or only presenting the user with compatible choices to choose from (such as on a display menu). Many other approaches are possible as well.

Figure 5B:
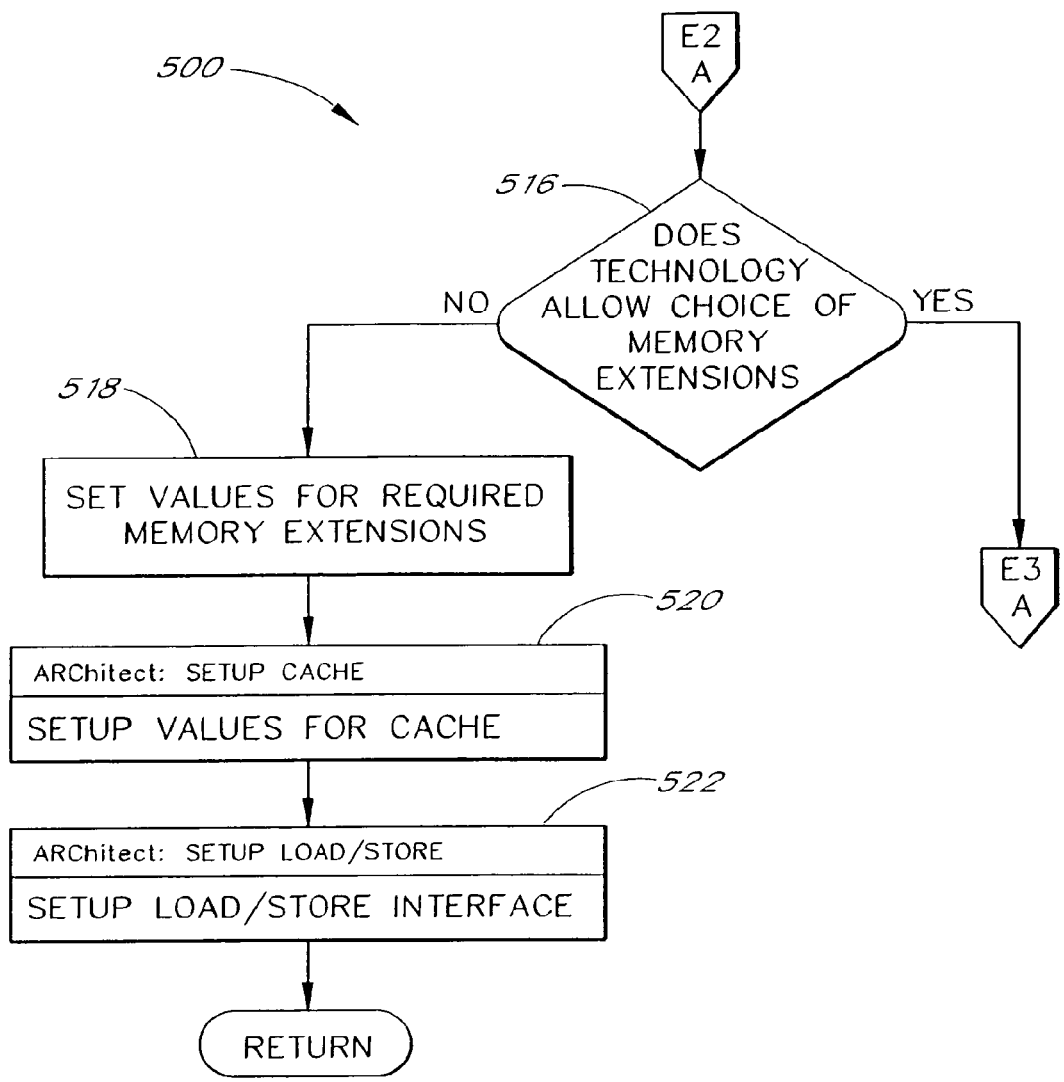

Referring now to FIG. 5b, the method 500 continues with step 516, wherein the user's choice of technology is examined to determine whether it permits the choice of memory extensions (versus core extensions, as previously described). If no choice of memory extensions is allowed, the required memory extension values are set per step 518, the cache values set up per step 520, and the load/store interface configuration set up per step 522.

Figure 5C:
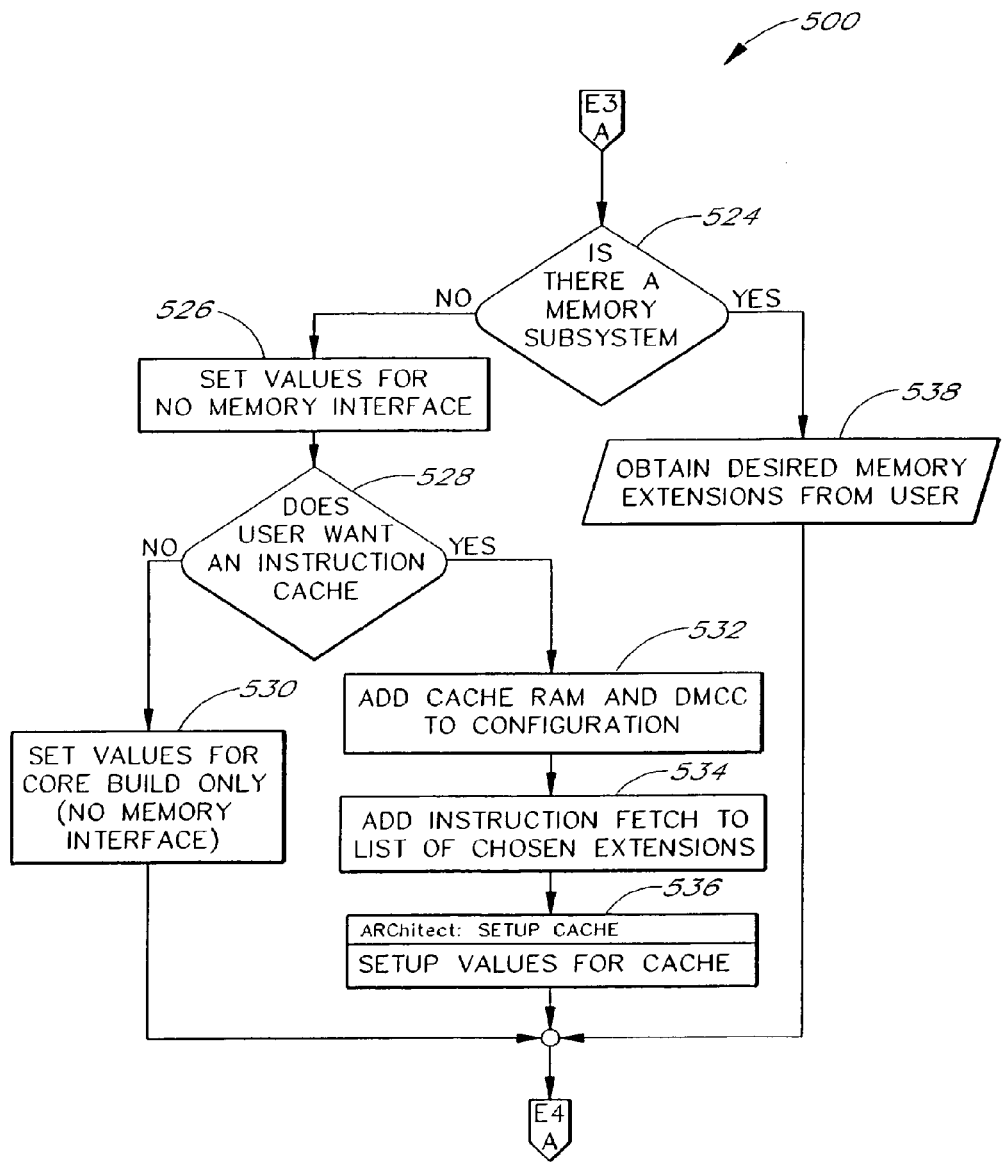

If a choice of memory extensions is allowed per step 516, the method of FIG. 5c is utilized. As shown therein, the existence of a memory subsystem is next determined in step 524. If no memory subsystem exists, values consistent with no memory interface are set in step 526. Next, the user is queried if an instruction cache is desired in step 528; if no, the values for a core build only (i.e., no memory interface) are set in step 530. If yes, a cache random access memory (RAM) and direct mapped cache controller (DMCC) are added (step 532), "instruction fetch" extension is added to list of selected extensions (step 534), and the cache is set up (step 536), as further described with reference to FIG. 6 herein.

If a memory subsystem does exist in step 524, the desired memory extensions are obtained from the user in step 538.

Figure 5D:
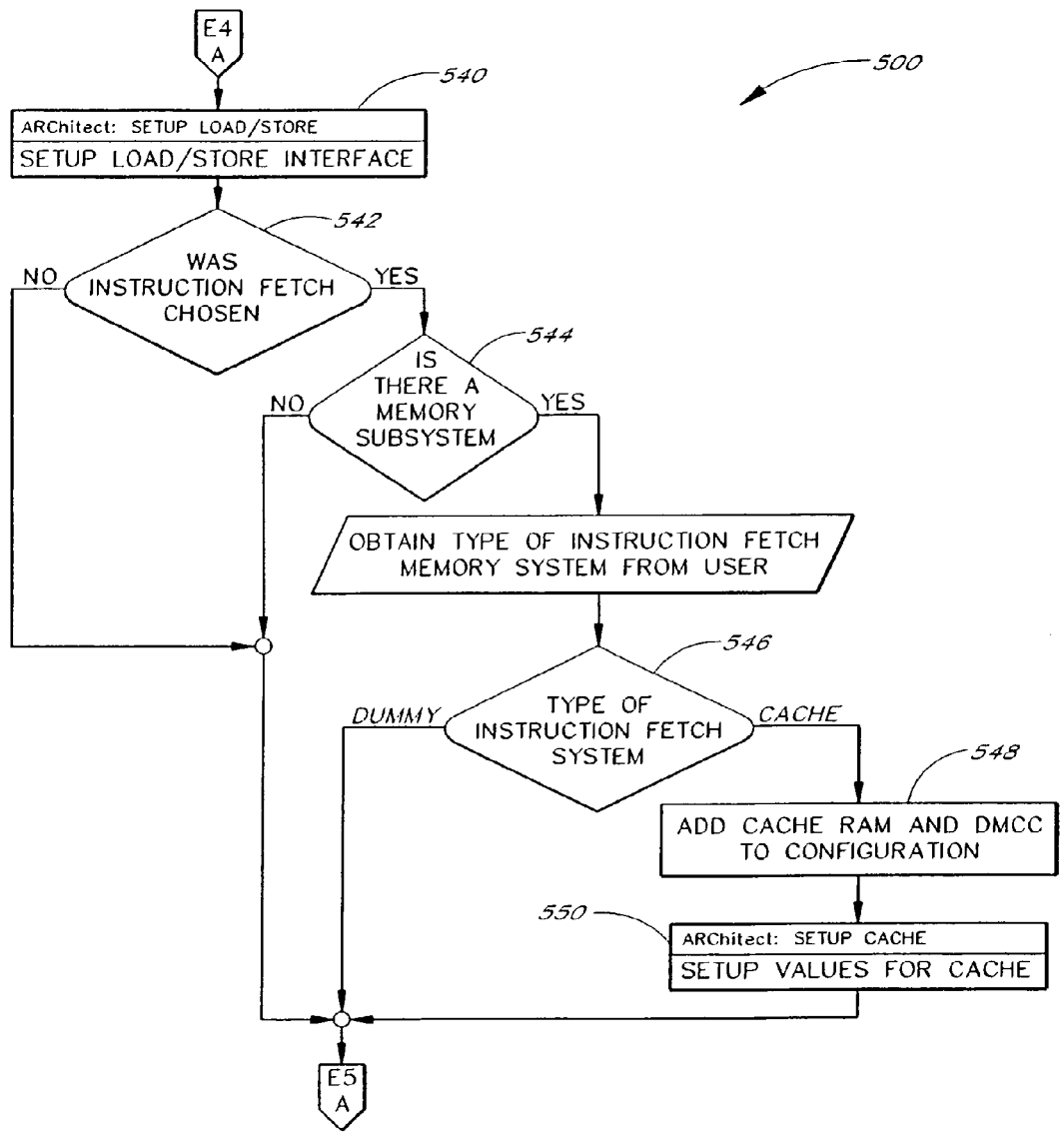

Referring now to FIG. 5d, the method 500 continues by setting up the load/store interface in step 540. The method of step 540 is described in greater detail with respect to FIG. 7 herein. Upon completion of step 540, the algorithm determines in step 542 whether an instruction fetch was selected by the user. If so, the algorithm again determines whether a memory subsystem exists (step 544); if so, the user is queried in step 546 as to the type of instruction fetch system desired. If the type of instruction fetch system is a "cache", the algorithm then adds a cache RAM and DMCC to the configuration per step 548, and sets up the cache in step 550 as in step 536 previously described. If the type of instruction fetch selected in step 546 is a "dummy", then the algorithm proceeds to step 552 of FIG. 5e. Note that if no instruction fetch was selected in step 542, or no memory subsystem exists in step 544, the algorithm proceeds to step 552 as well.

Figure 5E:
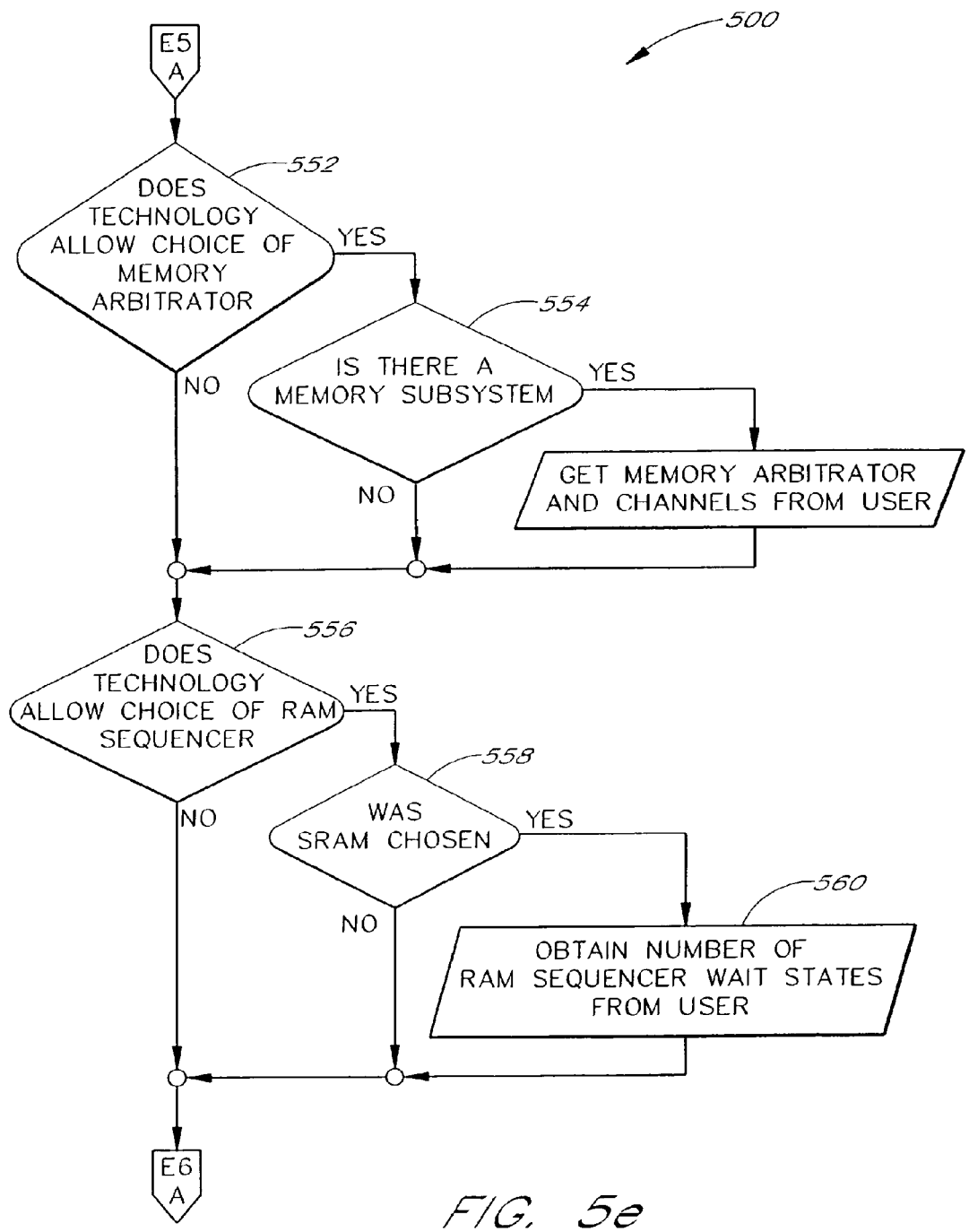

Referring now to FIG. 5e, the method 500 continues with step 552 in which the initial choice of technology by the user (step 306) is examined to determine whether the choice of a memory arbiter is allowed. If yes, the existence of a memory subsystem is then determined in step 554. If no choice of memory arbiter is allowed, or if there is no memory subsystem, the algorithm then determines whether the choice of RAM sequencer is allowed for the chosen technology in step 556. Note that in step 544, if a memory subsystem is allowed, then the algorithm queries the user to specify the memory arbiter and channels desired.

Returning to step 556, if a RAM sequencer choice is permitted, then the algorithm determines in step 558 whether a synchronous RAM (SRAM) was chosen by the user. If so, the user is prompted in step 560 for the number of RAM sequencer wait states associated with the SRAM. Upon obtaining that information, the algorithm proceeds to step 562 of FIG. 5f. Similarly, if no choice of RAM sequencer is permitted by the technology in step 556, the algorithm proceeds to step 562.

Figure 5F:
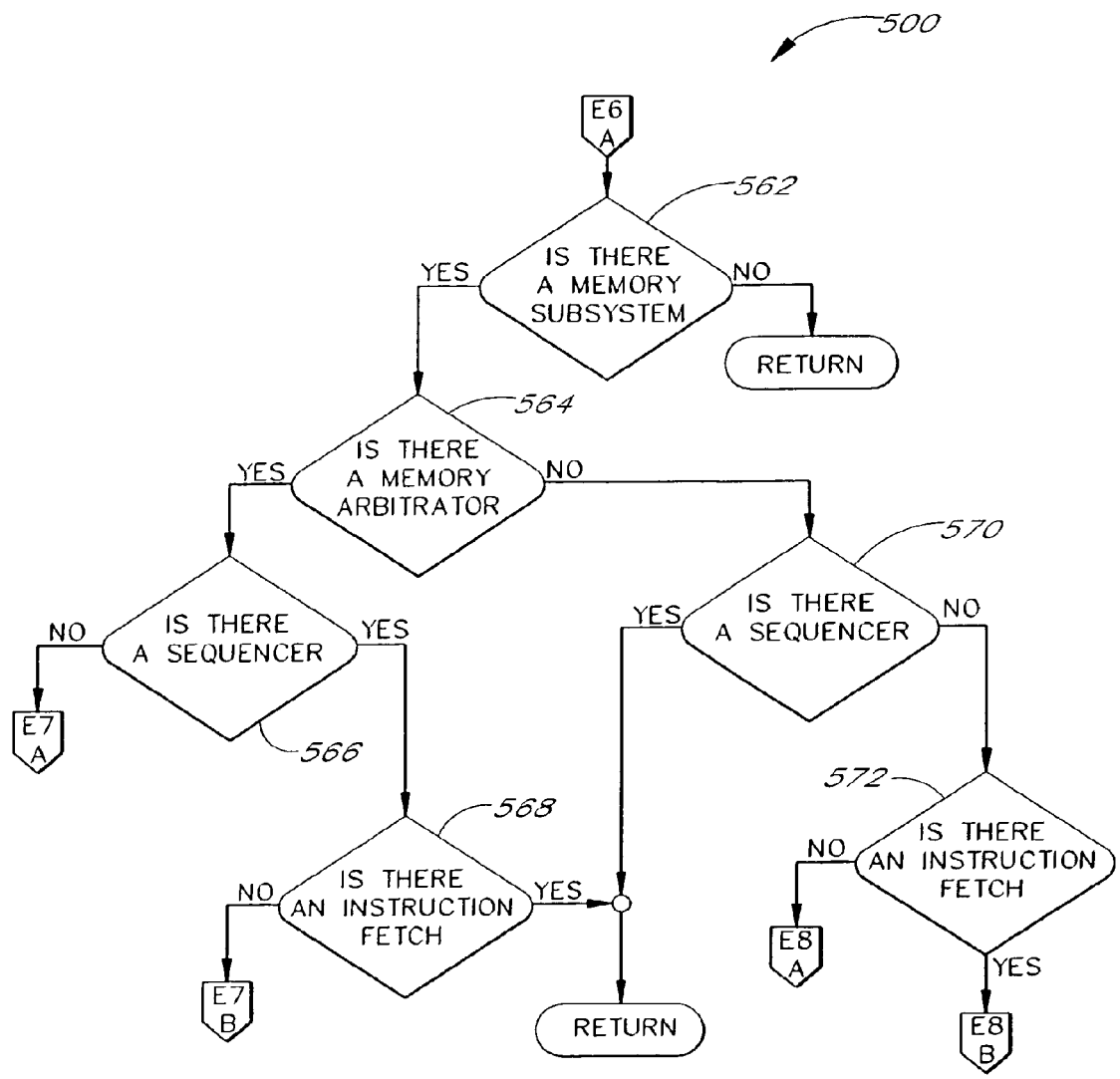

Referring now to FIG. 5f, the extensions selection algorithm continues at step 562, wherein again the existence of a memory subsystem is determined. If a memory subsystem does exist, the existence of a memory arbiter is queried in step 564. If a memory arbiter exists, then the existence of a memory sequencer is determined in step 566. If a memory sequencer exists, the existence of an instruction fetch is determined in step 568. After step 568, the algorithm executes a branch return back to step 342 of FIG. 3c. If no memory subsystem exists per step 562, a branch return to step 336 of FIG. 3c is also executed. If no sequencer exists per step 566, the algorithm proceeds to step 574 of FIG. 5g. If no instruction fetch exists per step 568, then the algorithm proceeds to step 576 of FIG. 5g.

If no memory arbiter exists per step 564, then the existence of a sequencer is again determined per step 570. If a sequencer exists, the aforementioned return is executed. If no sequencer exists, the existence of an instruction fetch is determined in step 572. If an instruction fetch exists per step 572, the algorithm proceeds to step 580 of FIG. 5h. If not, then step 582 of FIG. 5h is selected.

Figure 5G:
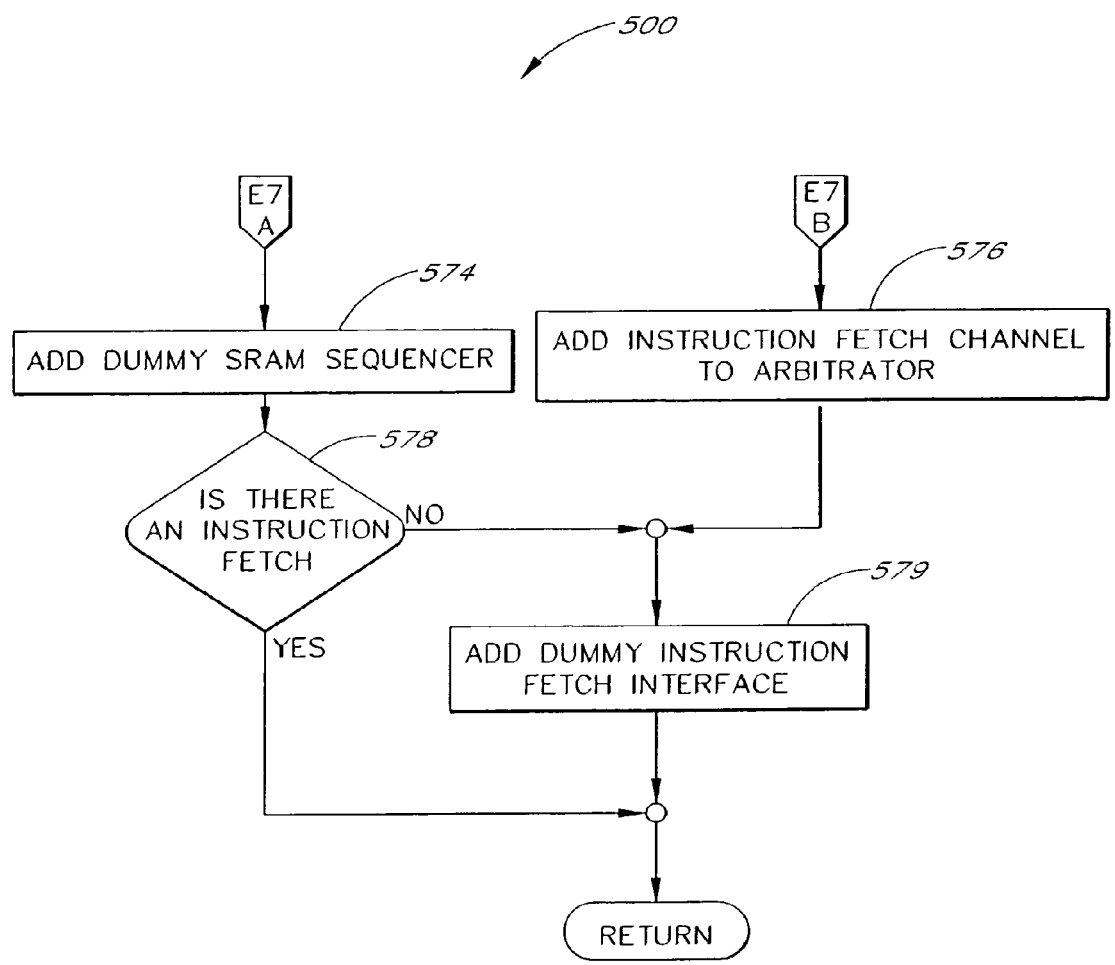

Referring now to FIG. 5g, step 574 comprises adding a dummy SRAM sequencer. After the dummy sequencer has been added, the algorithm determines whether an instruction fetch exists in step 578. If yes, a branch return is executed. If no, a dummy instruction fetch interface is added per step 579. If no instruction fetch exists per step 572 of FIG. 5f, an instruction fetch channel is added to the arbiter per step 576 of FIG. 5g, and a dummy instruction fetch interface added per step 579.

Figure 5H:
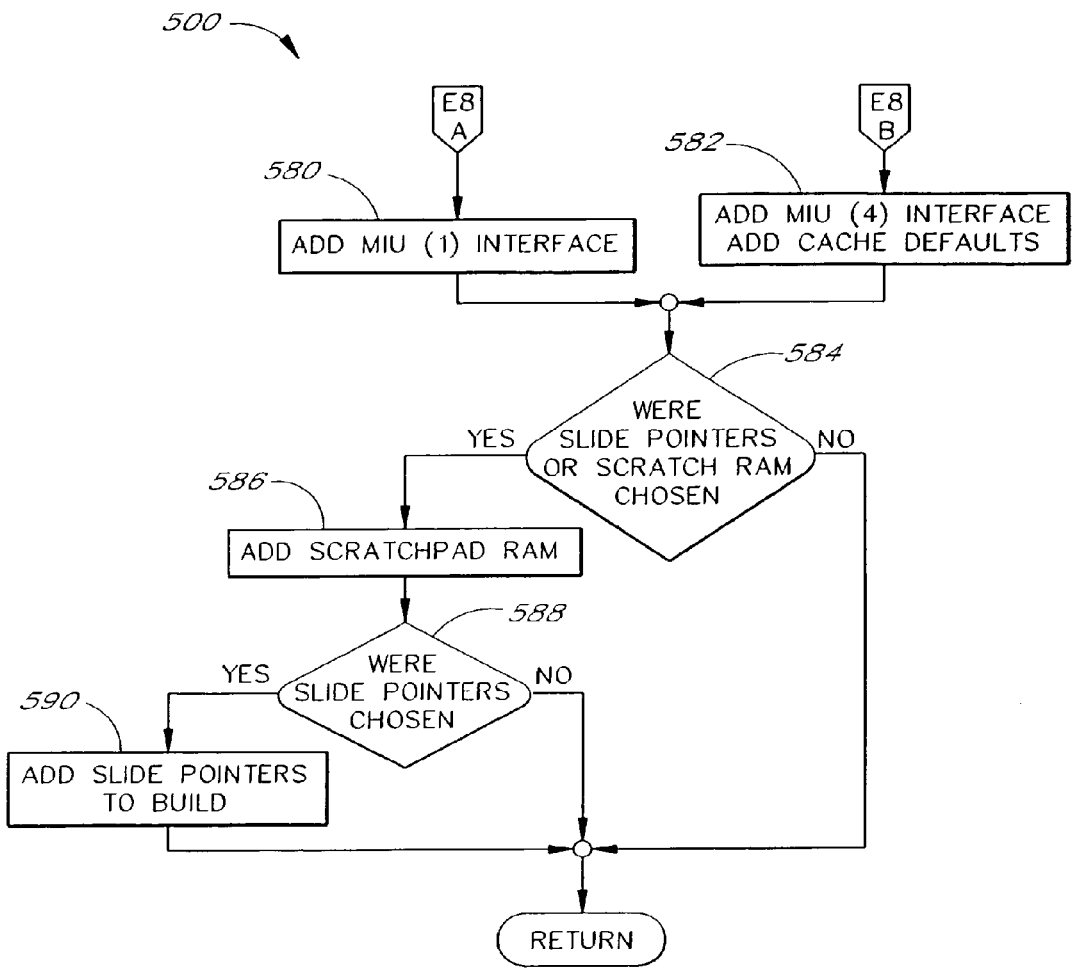

Referring now to FIG. 5h, step 580 comprises adding an miu(1) (external memory instruction fetch) interface for addressing external memory during instruction fetch. Alternatively, in step 582, an miu(4) interface and cache default values are added. Upon completion of step 580 or step 582, the algorithm determines in step 584 whether slide pointers or a scratch RAM was chosen by the user. If either was chosen, a scratchpad RAM is added per step 586, and slide pointers added to the build (as appropriate per steps 588 and 590.

Figure 6:
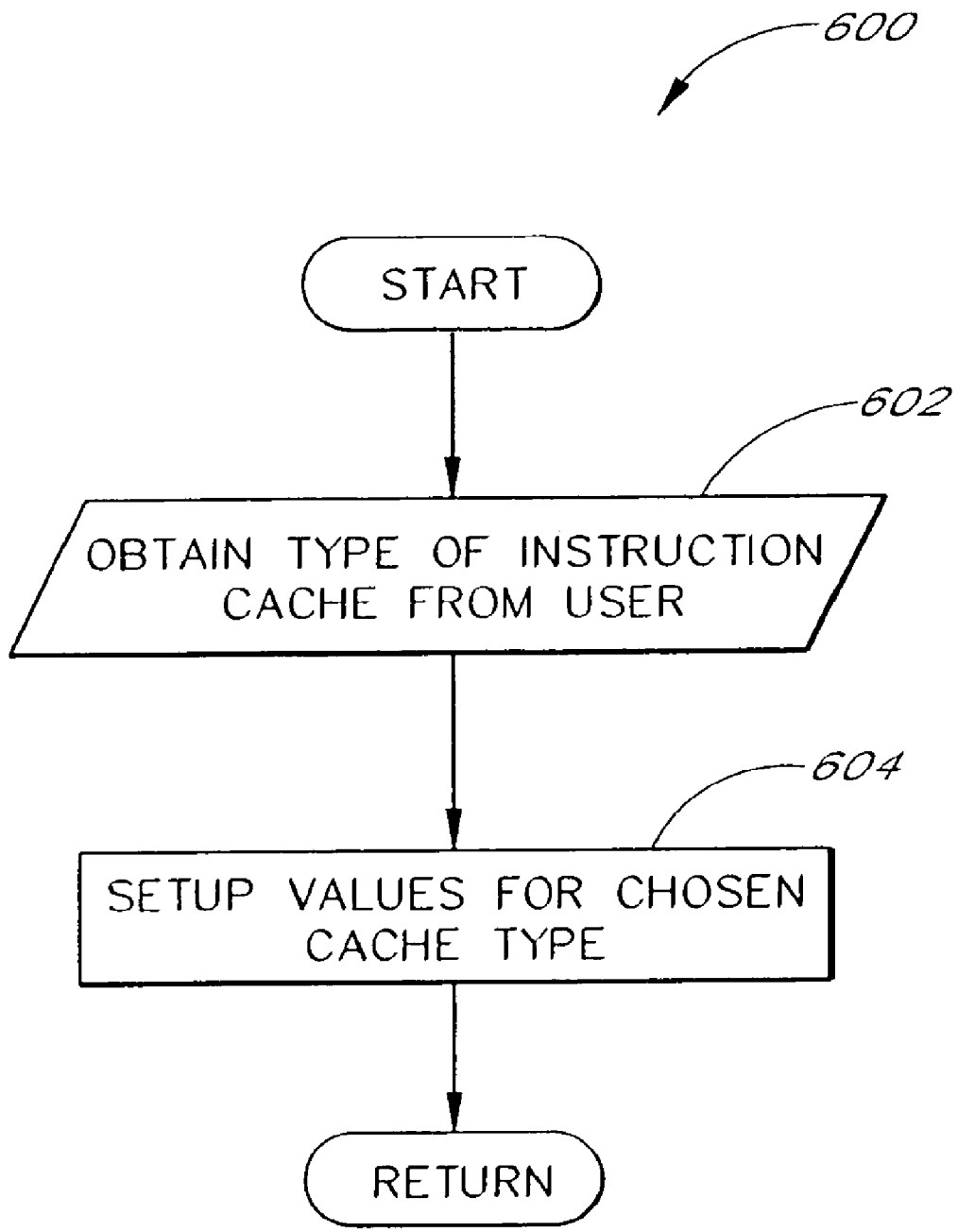
FIG. 6 is a logical flow diagram illustrating one exemplary embodiment of the method of setting up the cache structure as shown generally in FIGS. 5b, 5c, and 5d herein.

Referring now to FIG. 6, one exemplary embodiment of the method 600 of setting up the cache as previously discussed with respect to FIGS. 5b, 5c, and 5d herein is described. In a first step 602, the type of instruction cache to be used is obtained from the user. In the illustrated embodiment, the user may specify cache size, memory width, line size, and operation mode (such as debug and bypass), although other choices are possible. Next, in step 604, the values for the chosen cache type are read and stored as appropriate for later use.

Figure 7:
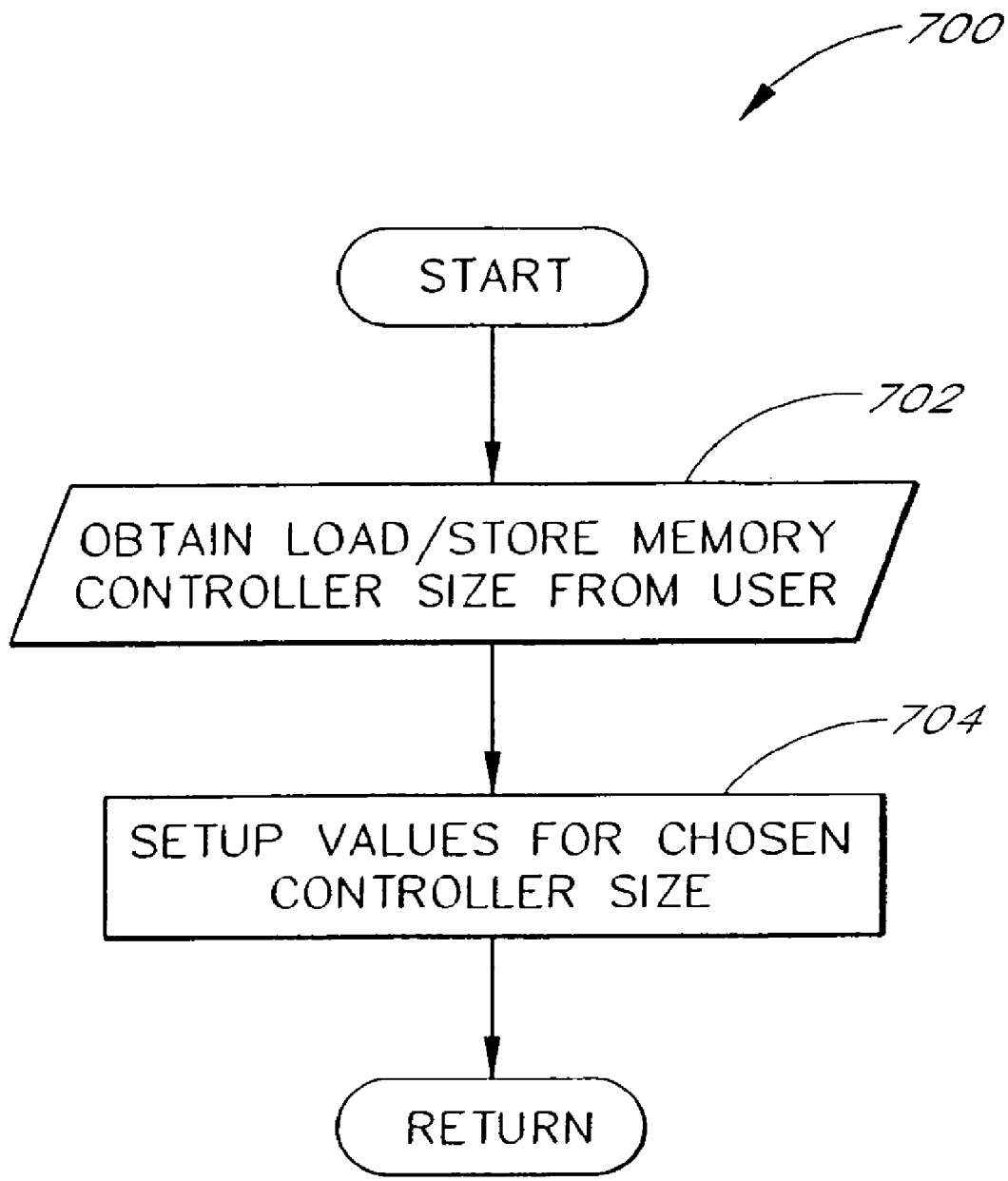
FIG. 7 is a logical flow diagram illustrating one exemplary embodiment of the method of setting up the load/store interface structure as shown generally in FIG. 5d herein.

Referring now to FIG. 7, one embodiment of the method 700 of setting up the load/store interface per FIG. 5d herein is described. First, the load/store memory controller size is obtained from the user per step 702; the values associated with the selected controller size are then obtained from the appropriate file and stored in step 704.

Figure 8:
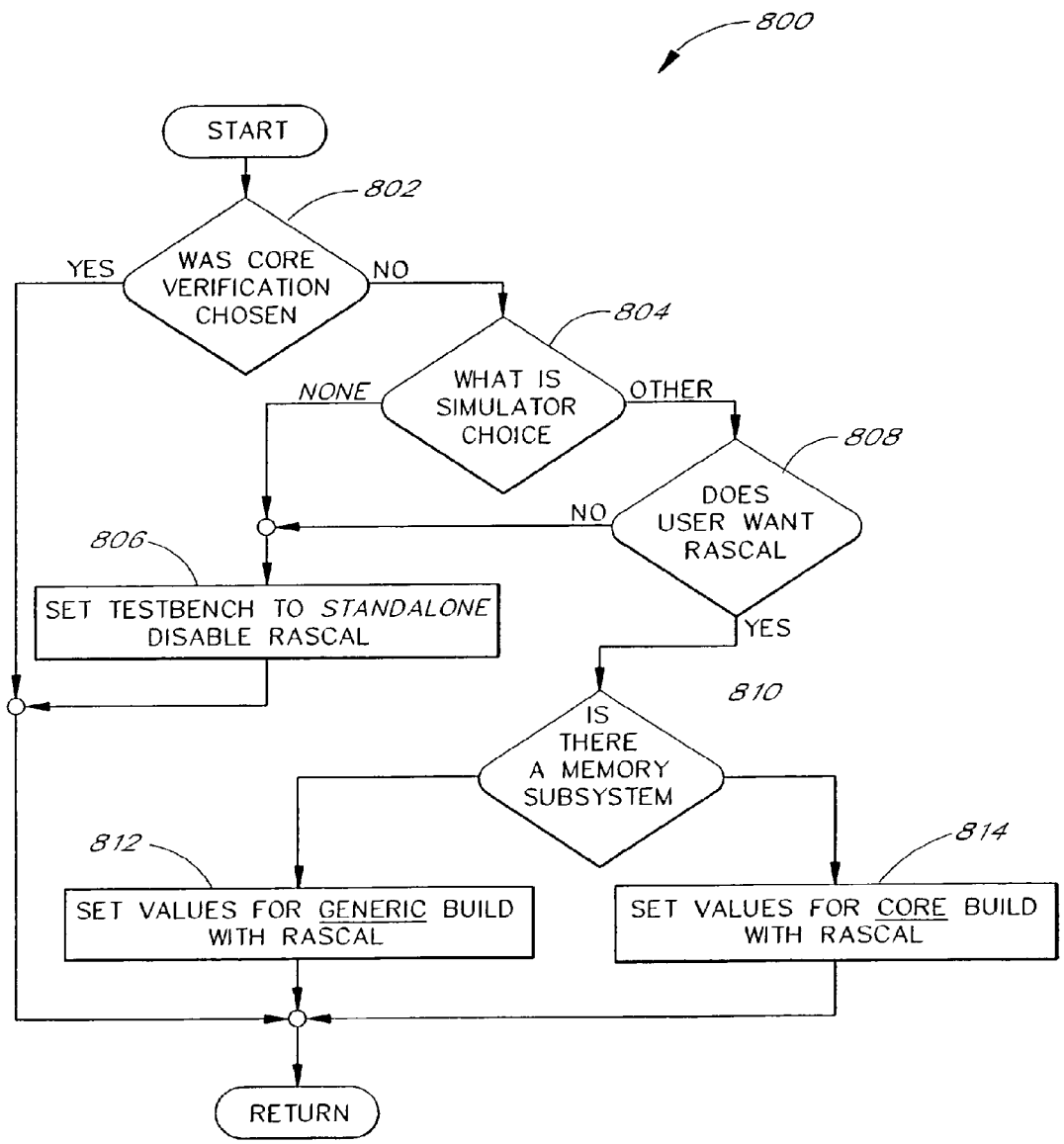
FIG. 8 is a logical flow diagram illustrating one exemplary embodiment of the method of setting up the register transfer language (RTL) link structure as shown generally in FIG. 3d herein.

Referring now to FIG. 8, one exemplary embodiment of the method 800 of setting up the register transfer language structure (e.g., RTL and SeeCode Link, or RASCAL™) as shown generally in FIG. 3d herein is described. The method 800 first determines in step 802 whether a core verification was selected by the user; if a core verification was selected, a branch return to step 354 (FIG. 3d) is executed. If no core verification was selected, the method 800 then determines what simulator choice has been made by the user in step 804. If no choice has been made, the system "testbench" function (a simulation environment with test vectors) is set to "standalone" mode, and the RTL and SeeCode Link disabled per step 806. If some choice (other than "none") has been made, the user is prompted in step 808 to determine whether the aforementioned RTL link is desired; if not, the testbench function is set per step 806. If the RTL link is desired, the existence of a memory subsystem is again determined per step 810, and the values for either a generic build with the RTL link (step 812) or the core build with RTL link (step 814) set as appropriate. Upon completion of the RTL setup method 800, a branch return to step 354 is executed.

Figure 9:
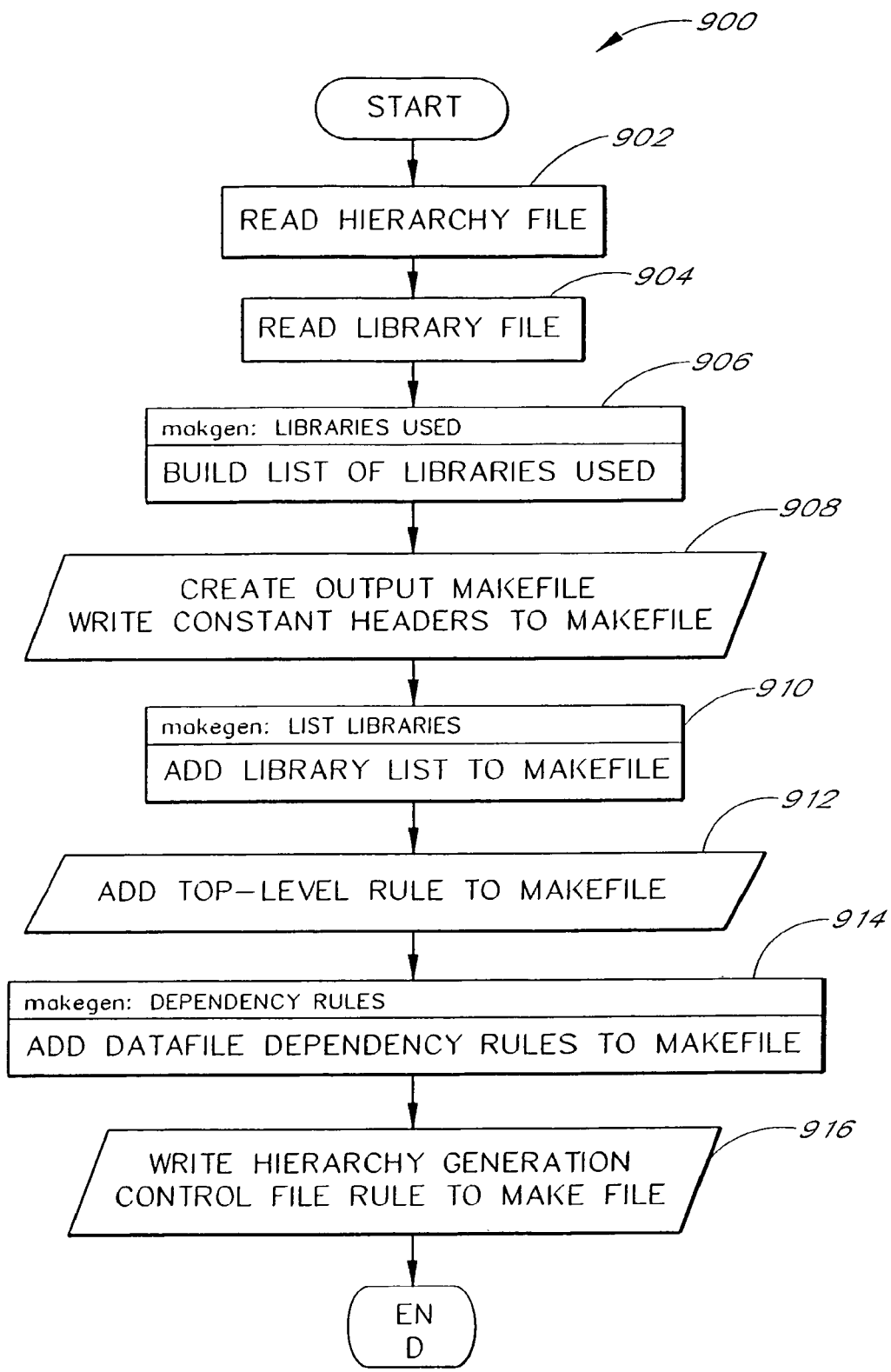
FIG. 9 is a logical flow diagram illustrating one exemplary embodiment of the method of generating a new script according to the invention.

FIG. 9 illustrates one exemplary embodiment of the method 900 of generating a new script according to the invention. First, the hierarchy file representative of the physical hierarchy of the design is read per step 902. Next, the applicable library file is read in step 904. In step 906, a list of the libraries used in conjunction with the design is built, as described in greater detail with reference to FIG. 10 herein. After the libraries list is built, an output makefile is created in step 908, and the constant headers written to the created makefile. In step 910, the aforementioned libraries list is added to the makefile as described in detail with reference to FIG. 11 herein. Next, the "top-level" rule is added to the makefile in step 912. As used herein, the top-level rule relates to those rules specified by the hardware description language (such as VHDL or Verilog), although it will be appreciated that others rule bases may be used.

After the top-level rules have been added, the datafile dependency rules are added to the makefile in step 914. This step 914 is described in greater detail with reference to FIG. 12 herein. Lastly, the physical hierarchy generation control file rule is added to the makefile to complete the latter.

Figure 10:
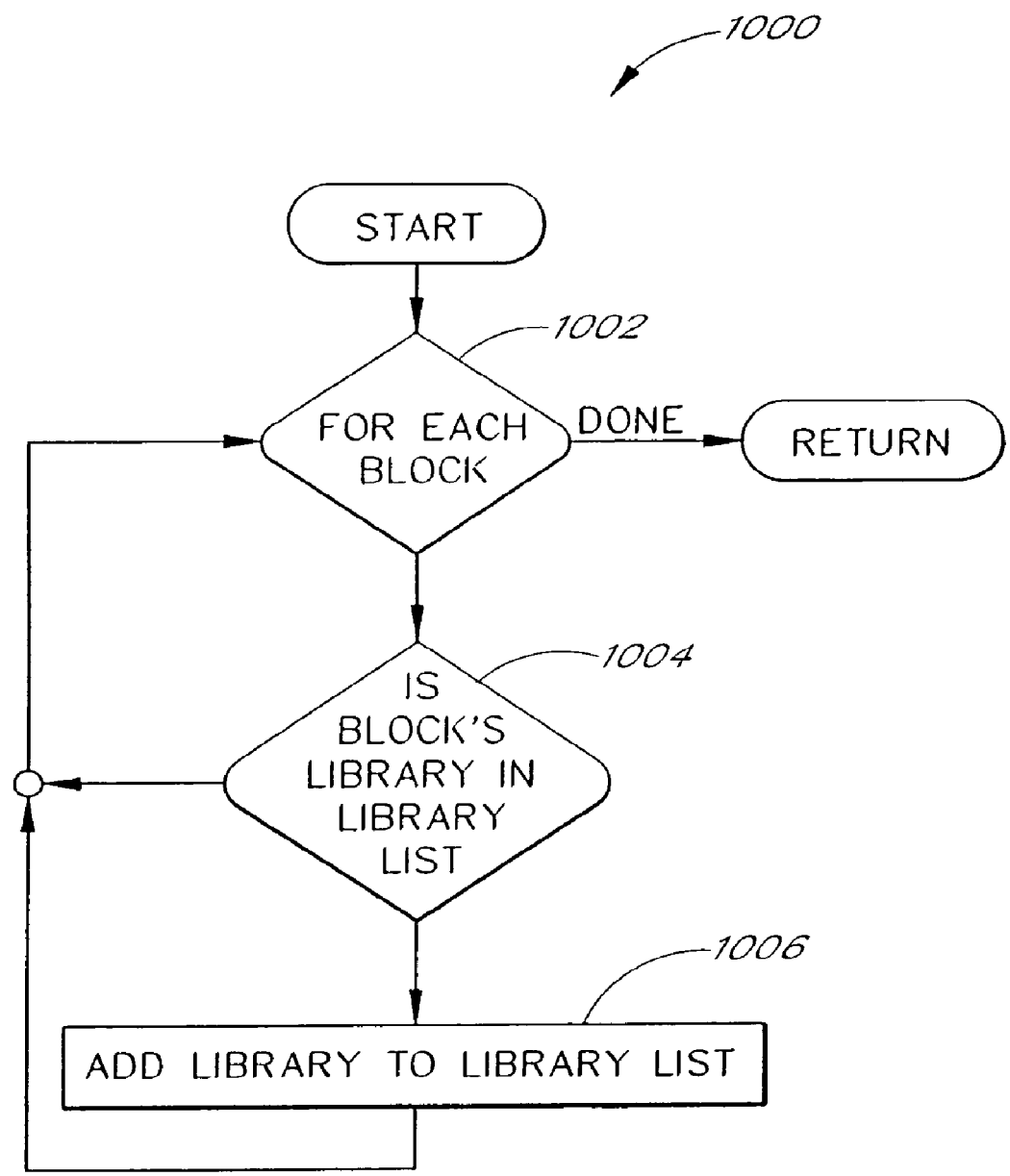
FIG. 10 is a logical flow diagram of one exemplary embodiment of the method of building a libraries list as shown generally in FIG. 9.

Referring now to FIG. 10, one exemplary embodiment of the method 1000 of building a libraries list as shown generally in step 906 of FIG. 9 is described. In a first step 1002, each block present in the design is analyzed; if the read block's library is presently within the libraries list (step 1004), the next block is read and similarly checked. Note that as used herein, the term "block" refers to a logical entity having a particular function, such as an adder or multiplier. If the required block library is not in the list, that library is added per step 1006. This process 1000 is repeated until all blocks have been analyzed and the presence of their required libraries verified in the libraries list.

Figure 11:
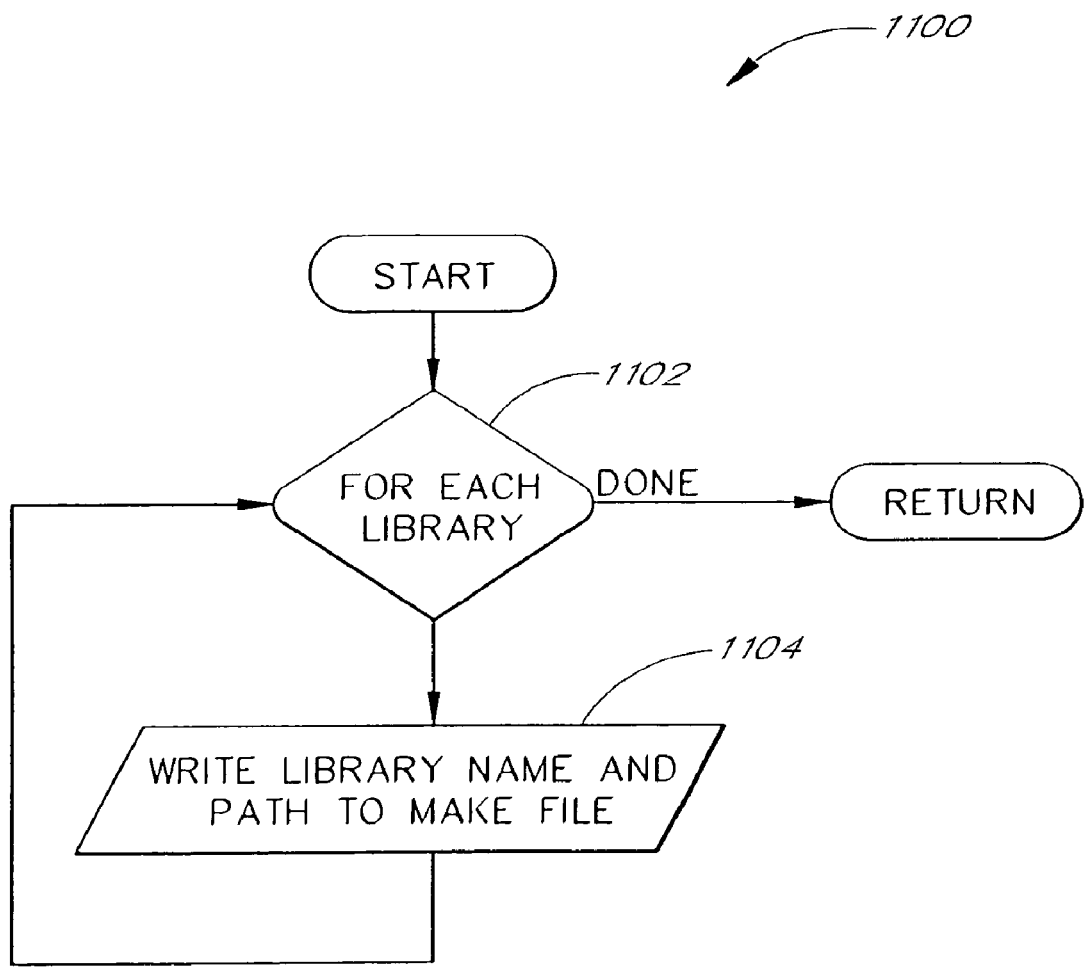
FIG. 11 is a logical flow diagram of one exemplary embodiment of the method of adding the libraries list to the system "makefile" as shown generally in FIG. 9.

Referring now to FIG. 11, one exemplary embodiment of the method 1100 of adding the libraries list to the system "makefile" as shown generally in step 910 of FIG. 9. Specifically, the method 1100 comprises reading each library per step 1102, and writing the library name and path to the aforementioned makefile per step 1104. The algorithm returns to step 912 of FIG. 9 when all of the required library information has been added to the makefile.

Figure 12:
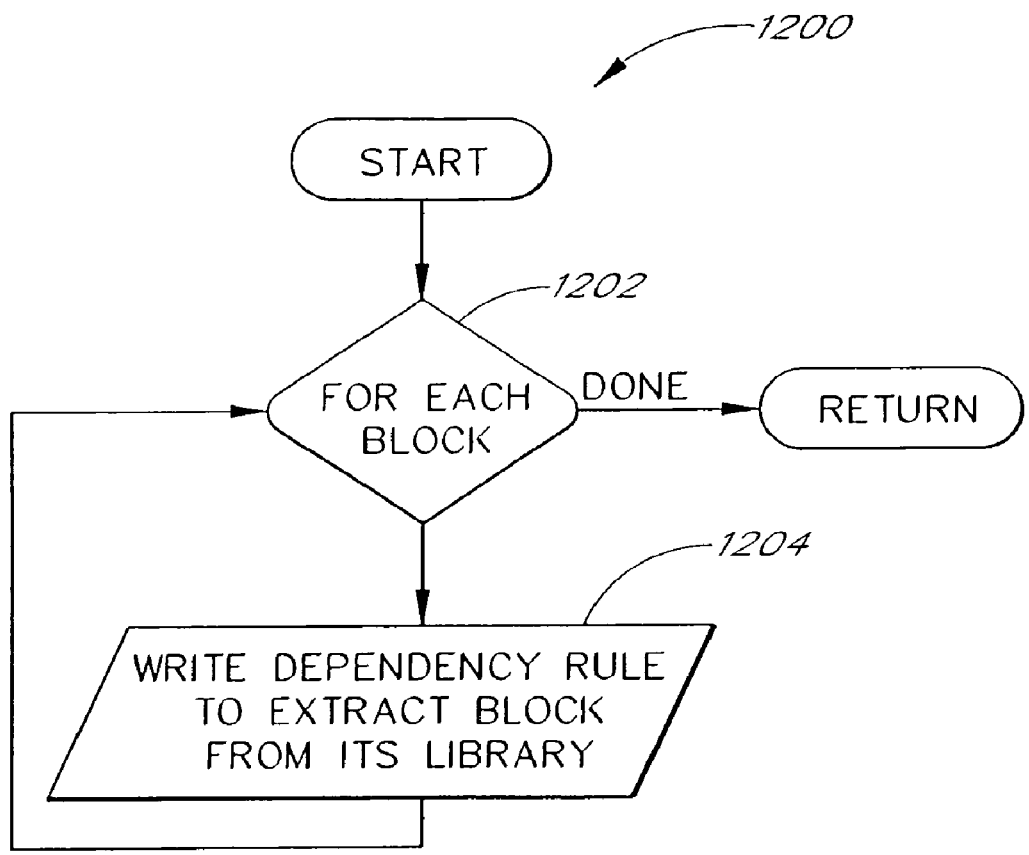
FIG. 12 is a logical flow diagram of one exemplary embodiment of the method of adding datafile dependency rules to the system "makefile" as shown generally in FIG. 9.

FIG. 12 illustrates one embodiment of the method of adding datafile dependency rules to the system "makefile" as shown generally in step 914 of FIG. 9. Specifically, each block is read in step 1202, and the dependency rules are written to a file in step 1204 to extract that block from its library. When all dependency rules have been written, the algorithm returns to step 916 of FIG. 9. This completes the script generation process 900.

Figure 13:
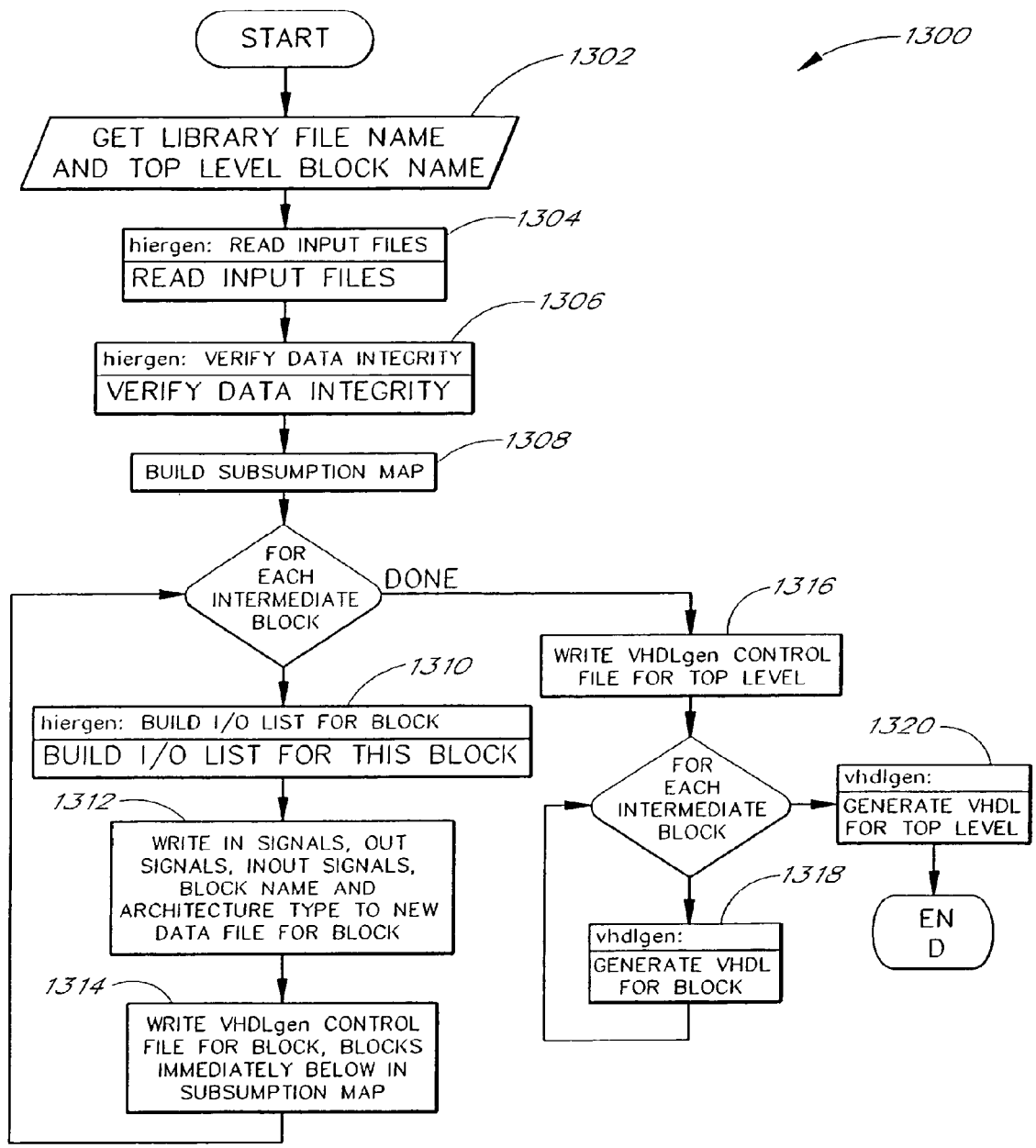
FIG. 13 is a logical flowchart illustrating one exemplary embodiment of the method of hierarchy file generation according to the invention.

Referring now to FIG. 13, one exemplary embodiment of the method 1300 of hierarchy file generation according to the invention is described. In step 1302, the library file name and top level block name are obtained. Next, in step 1304, the input files are read as described in detail with respect to FIG. 14 herein. Next, the integrity of the data read is verified in step 1306; see FIG. 19 for additional detail. Then, for each intermediate block, a subsumption map is built (step 1308). In step 1310, an I/O list is built for each intermediate block as further described with reference to FIG. 20 herein. In step 1312, the "in", "out", and "inout" signals are written to a new data file for each block; the block ID and architecture type are also written thereto. Next, the HDL (e.g., "VHDLgen") control file for each block is written in step 1314. The foregoing three steps 1310, 1312, 1314 are subsequently performed for each intermediate block until all blocks have been processed; at this point, the HDL control file for the top level is written in step 1316.

Next, for each intermediate block, the HDL is generated in step 1318, and when all intermediate blocks have been generated, the HDL for the top level generated in step 1320. This completes the hierarchy file generation method 1300.

Figure 14:
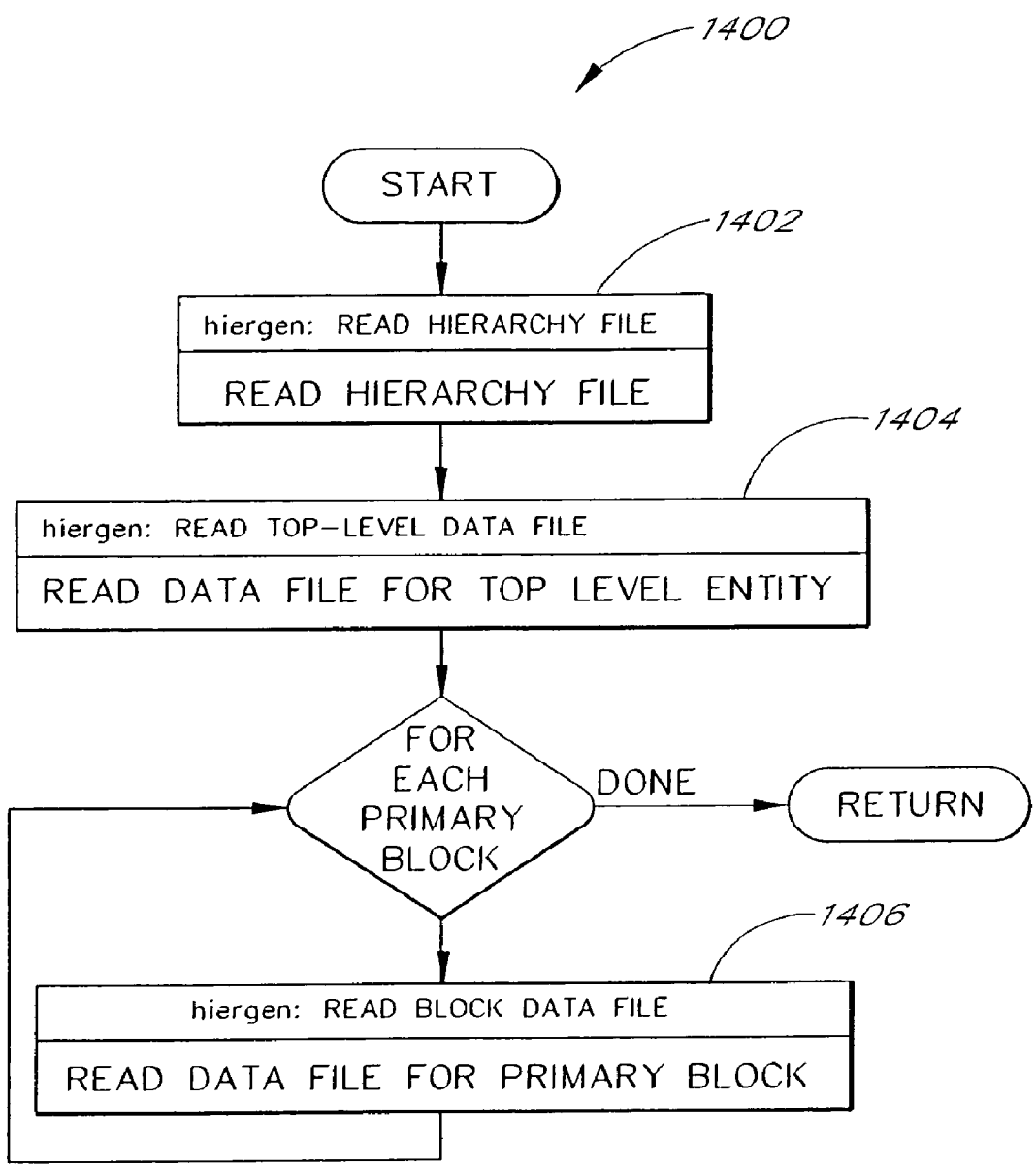
FIG. 14 is a logical flowchart illustrating one exemplary embodiment of the method of reading input files in accordance with the hierarchy file generation method of FIG. 13.
Figure 15:
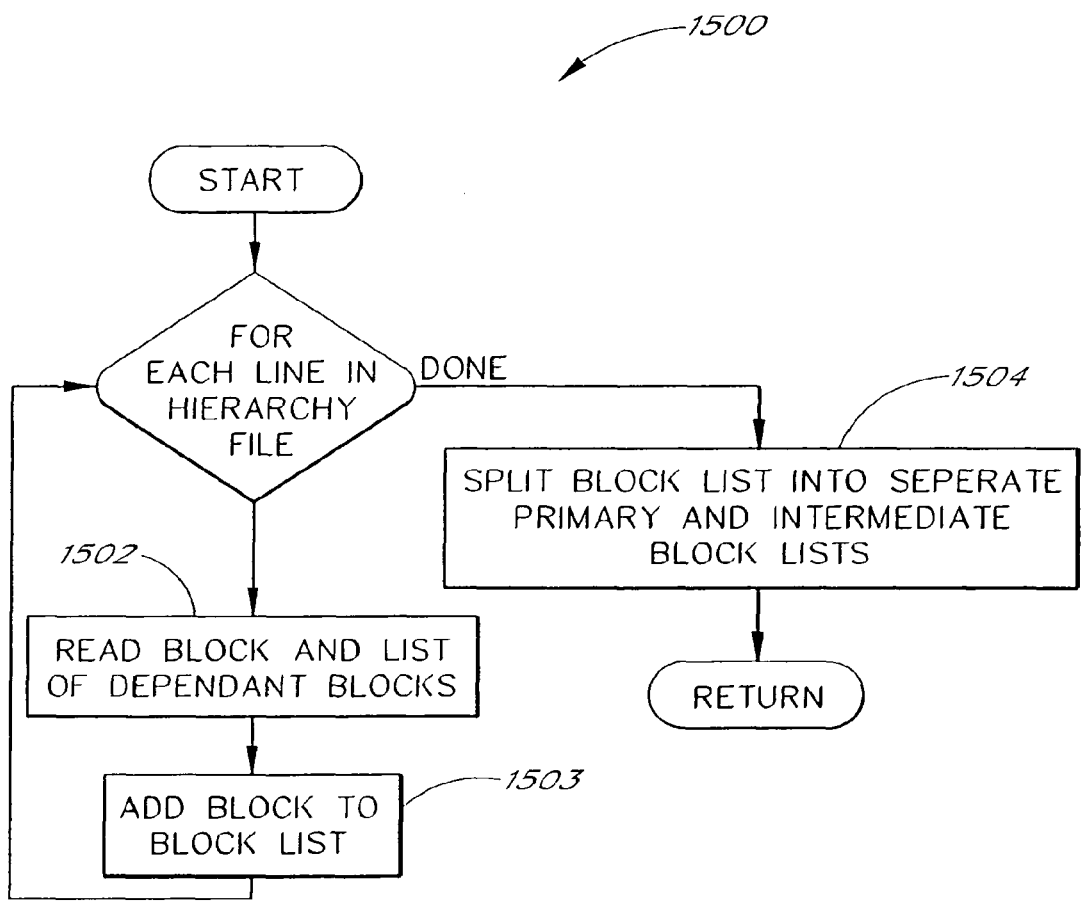
FIG. 15 is a logical flowchart illustrating one exemplary embodiment of the method of reading hierarchy files as shown generally in FIG. 14.
Figure 16:
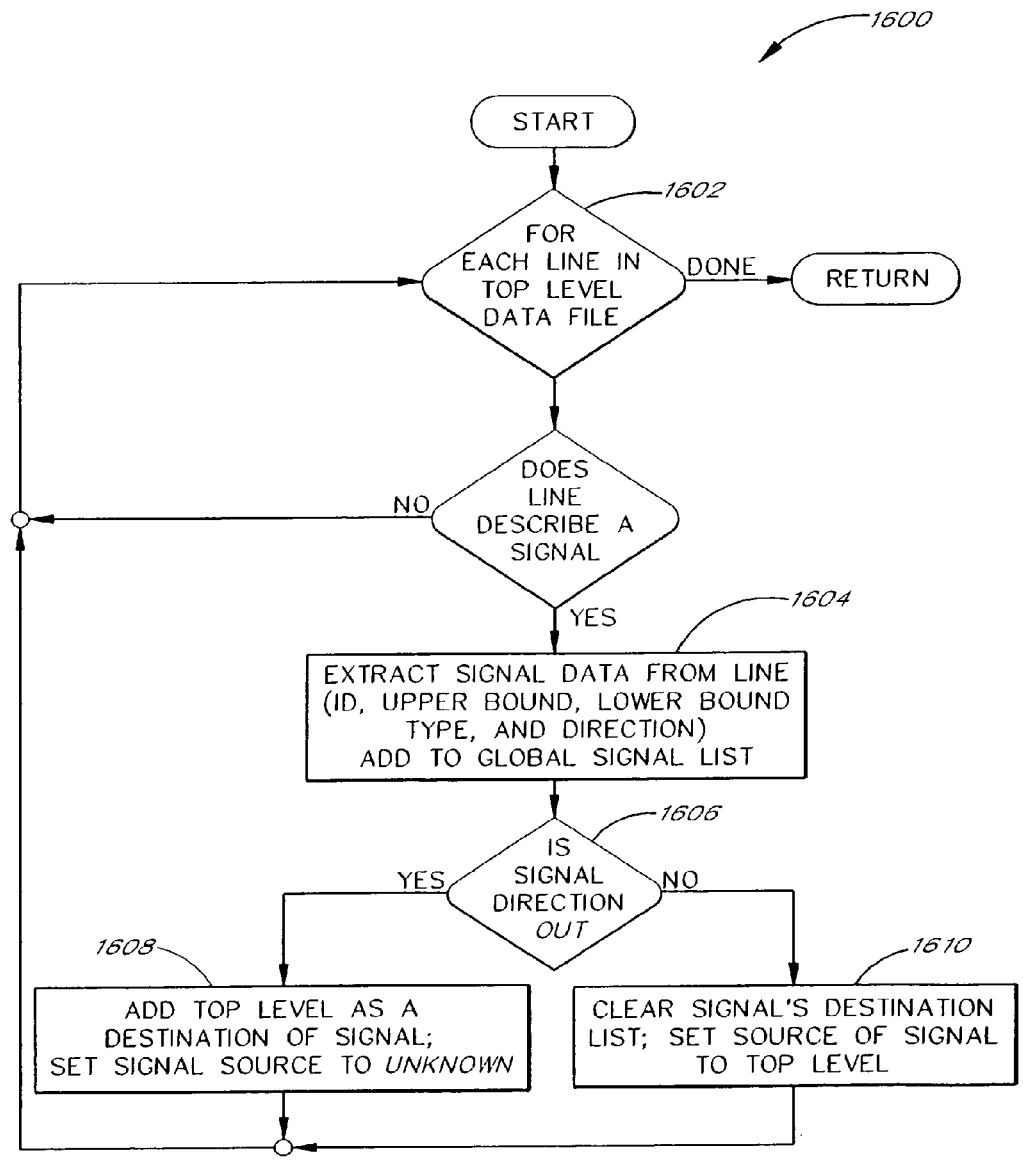
FIG. 16 is a logical flowchart illustrating one exemplary embodiment of the method of reading top level entity data files as shown generally in FIG. 14.
Figure 17:
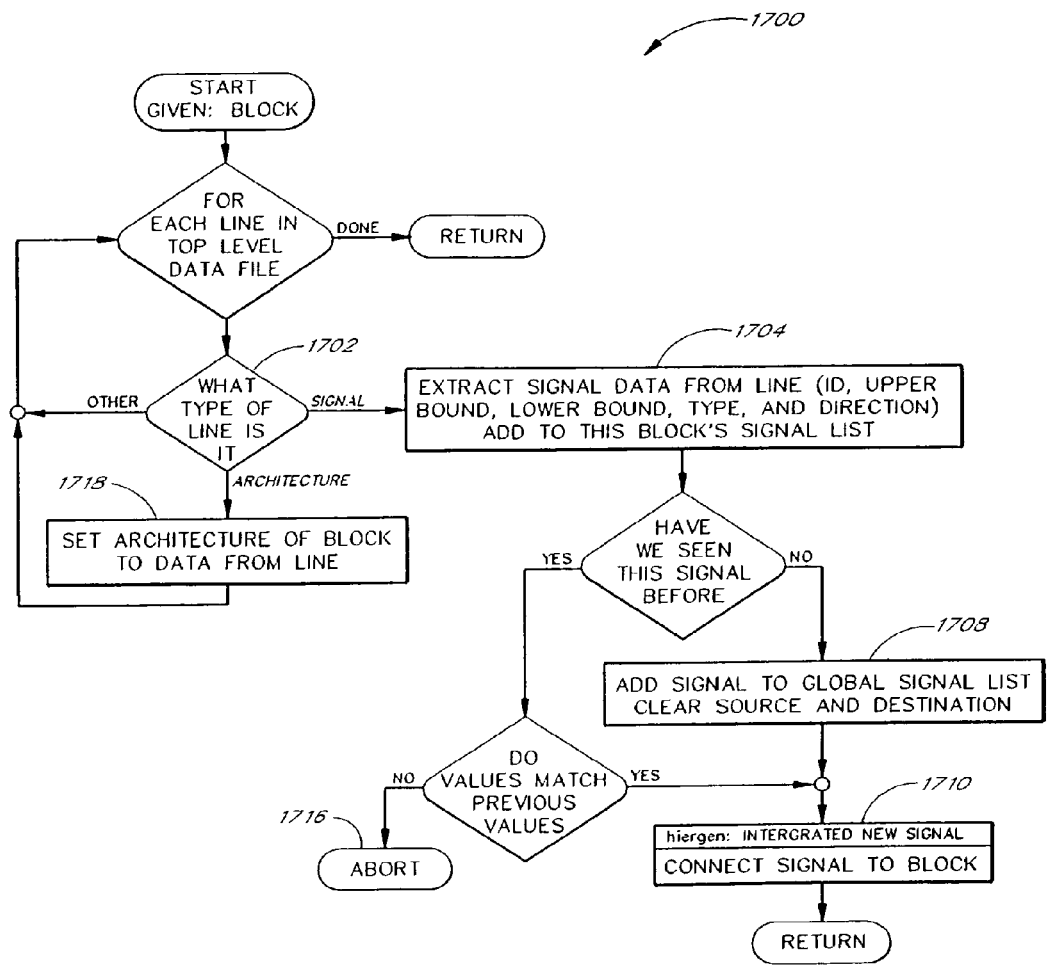
FIG. 17 is a logical flowchart illustrating one exemplary embodiment of the method of reading primary block data files as shown generally in FIG. 14.

FIG. 14 illustrates one embodiment of the method 1400 of reading input files (step 1304) in accordance with the hierarchy file generation method of FIG. 13. First, the hierarchy file is read in step 1402. Next, the data file for the top level entity is read per step 1404. Then, for each primary block, the data file is read per step 1406. FIGS. 15, 16, and 17 illustrate these steps 1402, 1404, 1406 in detail.

FIG. 15 illustrates one exemplary embodiment of the method 1500 of reading hierarchy files as shown generally in step 1402 of FIG. 14. For each line in the hierarchy files, the associated block and list of dependent blocks is read in step 1502 and each added to the block list in step 1503. When all such lines have been read, the block list is then split into a separate (i) primary block list and (ii) intermediate block list, in step 1504.

Referring now to FIG. 16, one exemplary embodiment of the method 1600 of reading top level entity data files as shown generally in step 1404 of FIG. 14 is described. First, each line of the top level data file is analyzed in step 1602 to determine whether it describes a signal. If so, then the signal data is extracted from each line per step 1604. In the illustrated embodiment, signal data includes, without limitation, "id," "upper bound," "lower bound," "type," and "direction" information. Next, in step 1606, the direction of the signal in each line determined to have a signal present is analyzed; if the signal is outbound, the top level of the hierarchy is added as the destination of the signal, and the signal source set to "unknown" per step 1608. If the signal is not outbound, the signal's destination list is cleared, and the source of the signal set to the top level per step 1610. This process 1600 is repeated for each line in the top level data file until all lines have been analyzed.

FIG. 17 illustrates one exemplary embodiment of the method 1700 of reading primary block data files as shown generally in step 1406 of FIG. 14. Initially, for each primary block, each line of the associated top level data file is analyzed in step 1702.

If the line under analysis is classified as a "signal" line, then the signal data is extracted from that line in step 1704 as previously described with reference to FIG. 16. If the signal has been read before by the algorithm, and the values associated with the signal match those previously read, the signal is connected to the primary block per step 1710. If the signal has not been previously read, it is added to the signal list per step 1708, and then connected to the primary block. Note also that if the signal has been read before but the current values do not match those previously read, then the algorithm aborts per step 1716.

If the line under analysis is an "architecture" line, the architecture of the primary block is set to "data" per step 1718, and the next line analyzed.

If the line under analysis is neither an "architecture" or "signal" line, no action is taken, and the next line in the top level data file is read.

Figure 18:
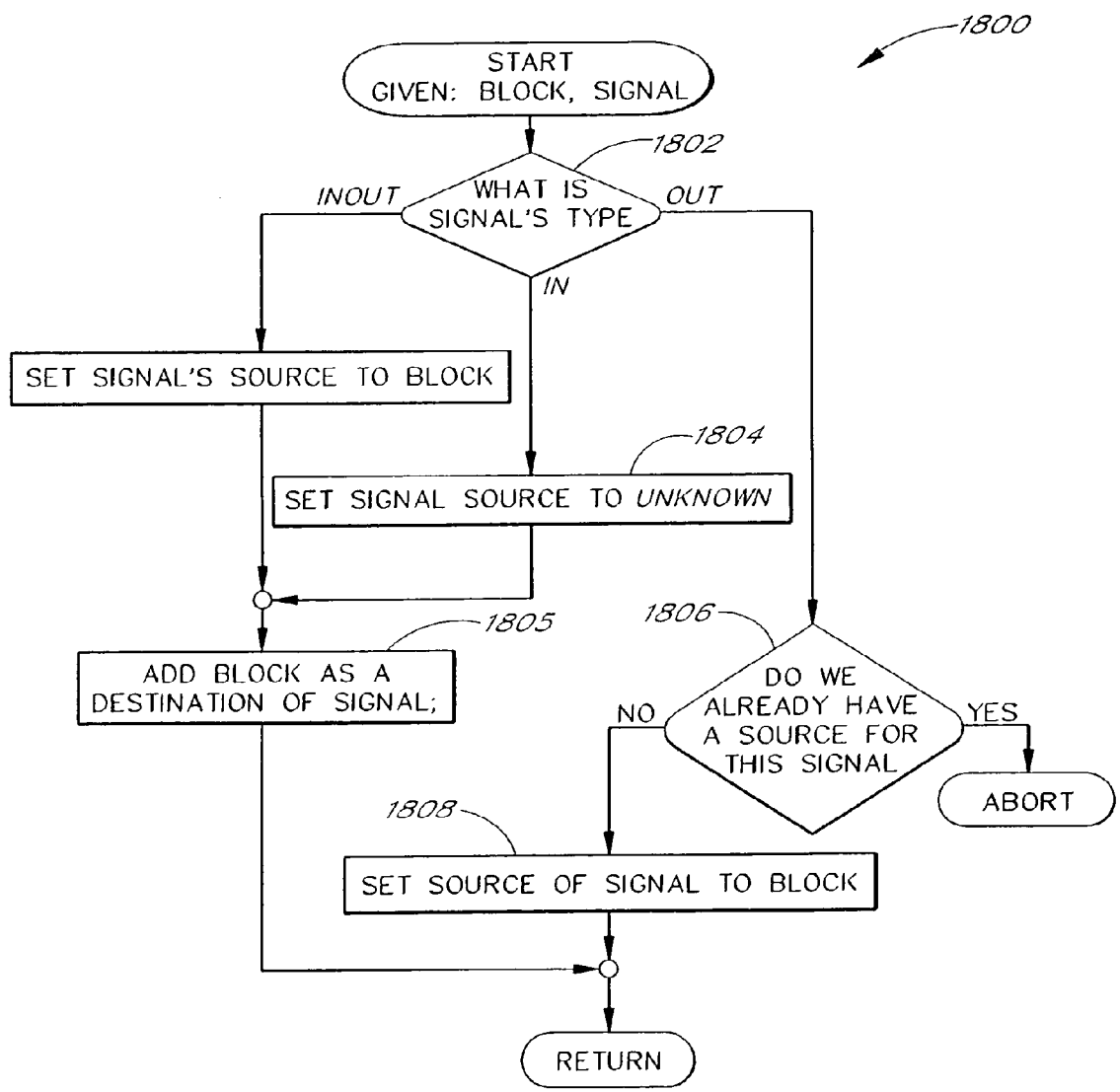
FIG. 18 is a logical flowchart illustrating one exemplary embodiment of the method of identifying and integrating new signals into the block data files as shown generally in FIG. 17.

Referring now to FIG. 18, one embodiment of the method 1800 of identifying and integrating new signals into the block data files as shown generally in FIG. 17 is described. Initially, the signal type is determined in step 1802. Signal types in the present embodiment include "in", "out", and "inout". If the signal is an "in" signal, the signal's source is set to "unknown" in step 1804; the block is then added as the destination of the signal per step 1805. If an "out" signal, the signal is examined to determine if a source already exists (step 1806); if yes, the algorithm 1800 is aborted. If no, the signal's destination list is cleared and the signal's source set to "block" per step 1808. If the signal's type is "inout", then the block is set as the destination in step 1805.

Figure 19:
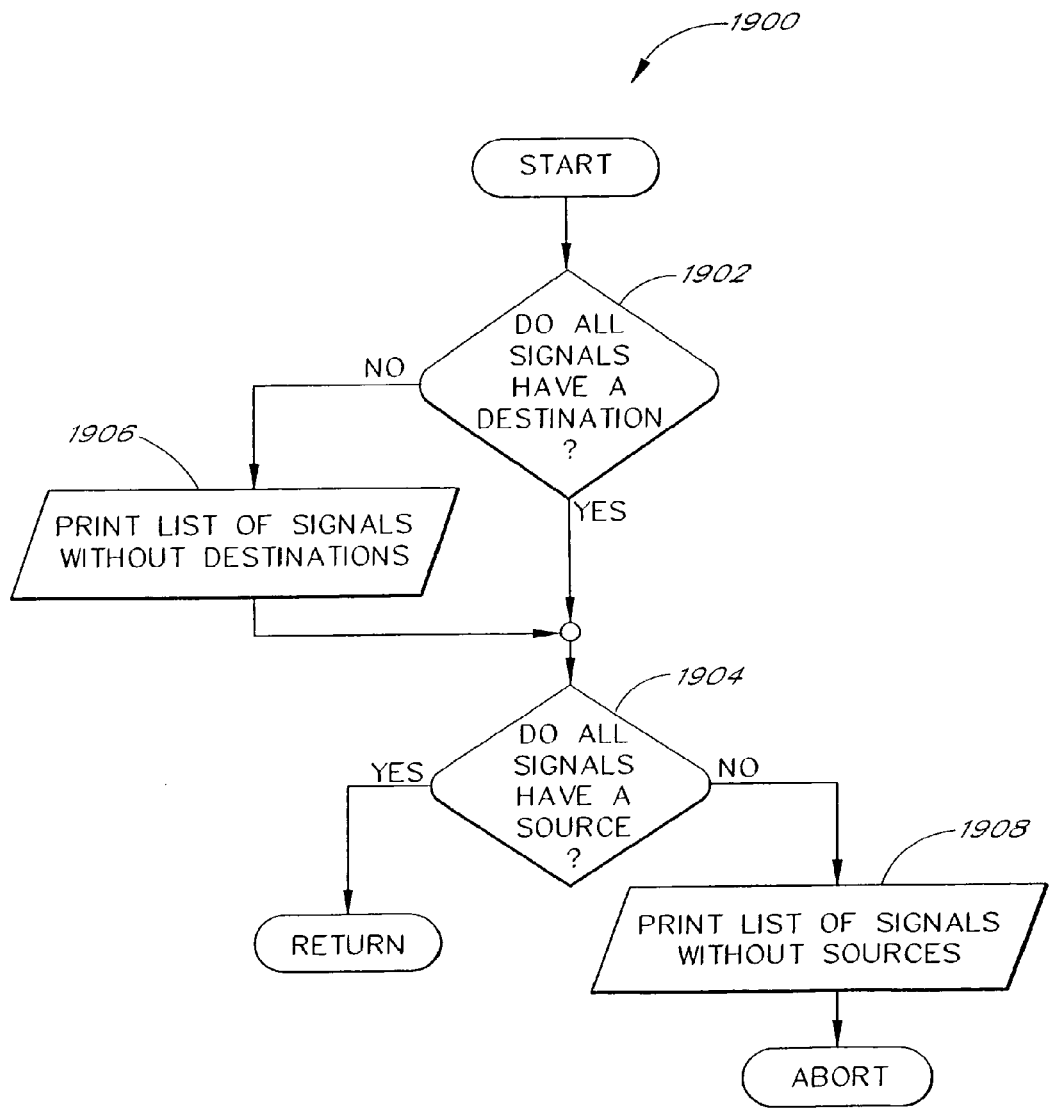
FIG. 19 is a logical flowchart illustrating one exemplary embodiment of the method of verifying data integrity as shown generally in FIG. 13.

Referring now to FIG. 19, one exemplary embodiment of the method 1900 of verifying signal data integrity as shown generally in FIG. 13 is described. First, in step 1902, each signal is examined to determine if it has an associated destination. If so, the existence of an associated source is then checked in step 1904. If both source and destination exist for all signals, the routine is terminated. If no destination is present for one or more signals in step 1902, a list of signals without destinations is printed per step 1906. If all signals have destinations but one or more signals do not have a source, a list of signals without sources is printed per step 1908.

Figure 20:
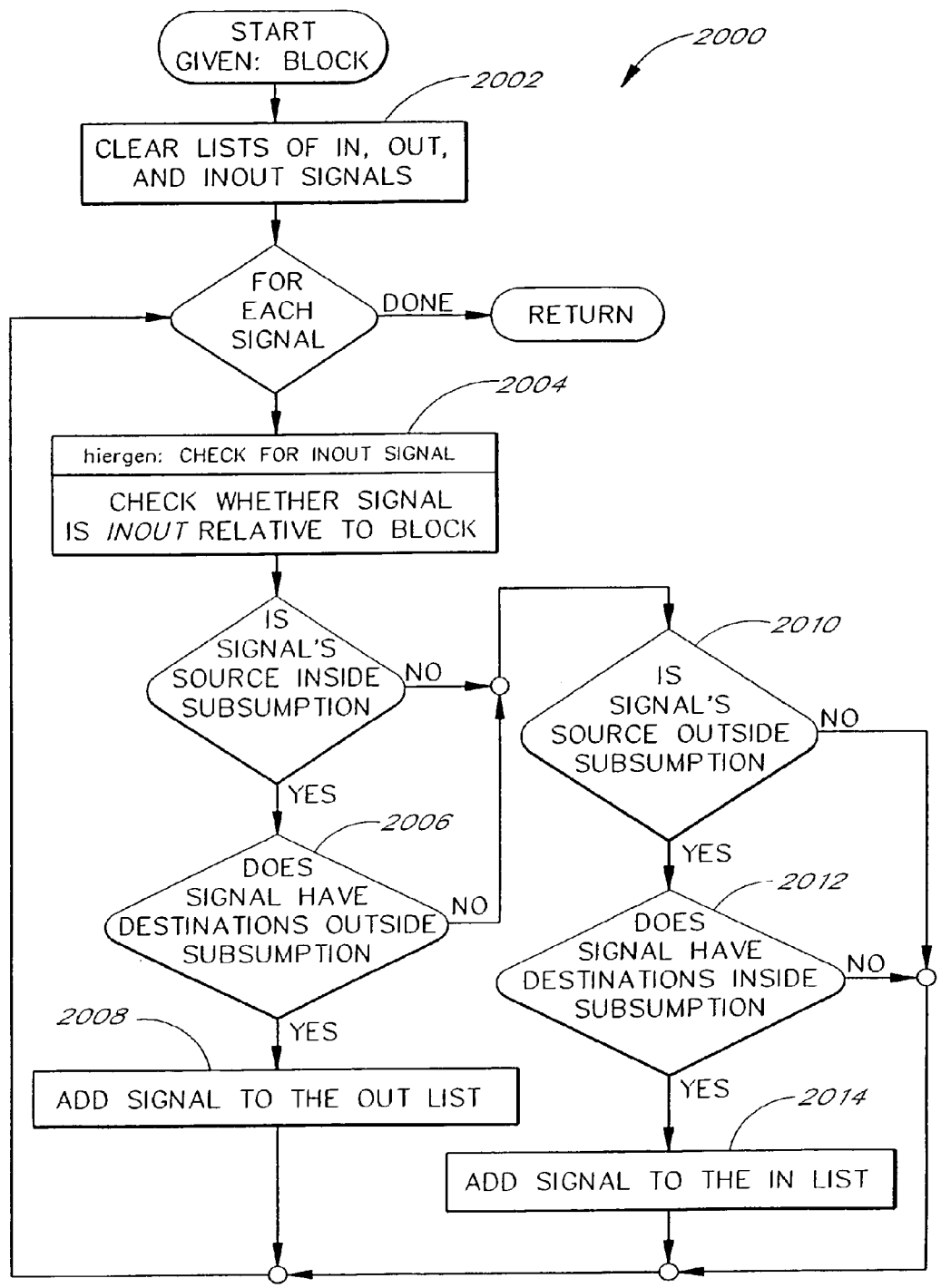
FIG. 20 is a logical flowchart illustrating one exemplary embodiment of the method of adjusting signal types relative to the block data files as shown generally in FIG. 13.

Referring now to FIG. 20, one exemplary embodiment of the method 2000 of building an I/O list relative to the block data files as shown generally in FIG. 13 is described. For a given block, the lists of "in", "out", and "inout" signals are first cleared per step 2002. Each signal is then checked to determine if it is an "inout" signal relative to the block in step 2004, as described in greater detail with reference to FIG. 21 herein. For each signal with a source inside the subsumption, the signal is checked in step 2006 to determine if it has a destination outside the subsumption. If so, the signal is added to the "out" list per step 2008, and the next signal analyzed. If the signal under analysis has no source inside the block, or all of its destinations are inside the subsumption, then the signal is checked to determine if it has an source outside of the subsumption in step 2010. If so, and it has at least one destination inside the subsumption (step 2012), then the signal is added to the "in" list per step 2014, and the next signal subsequently analyzed.

Figure 21:
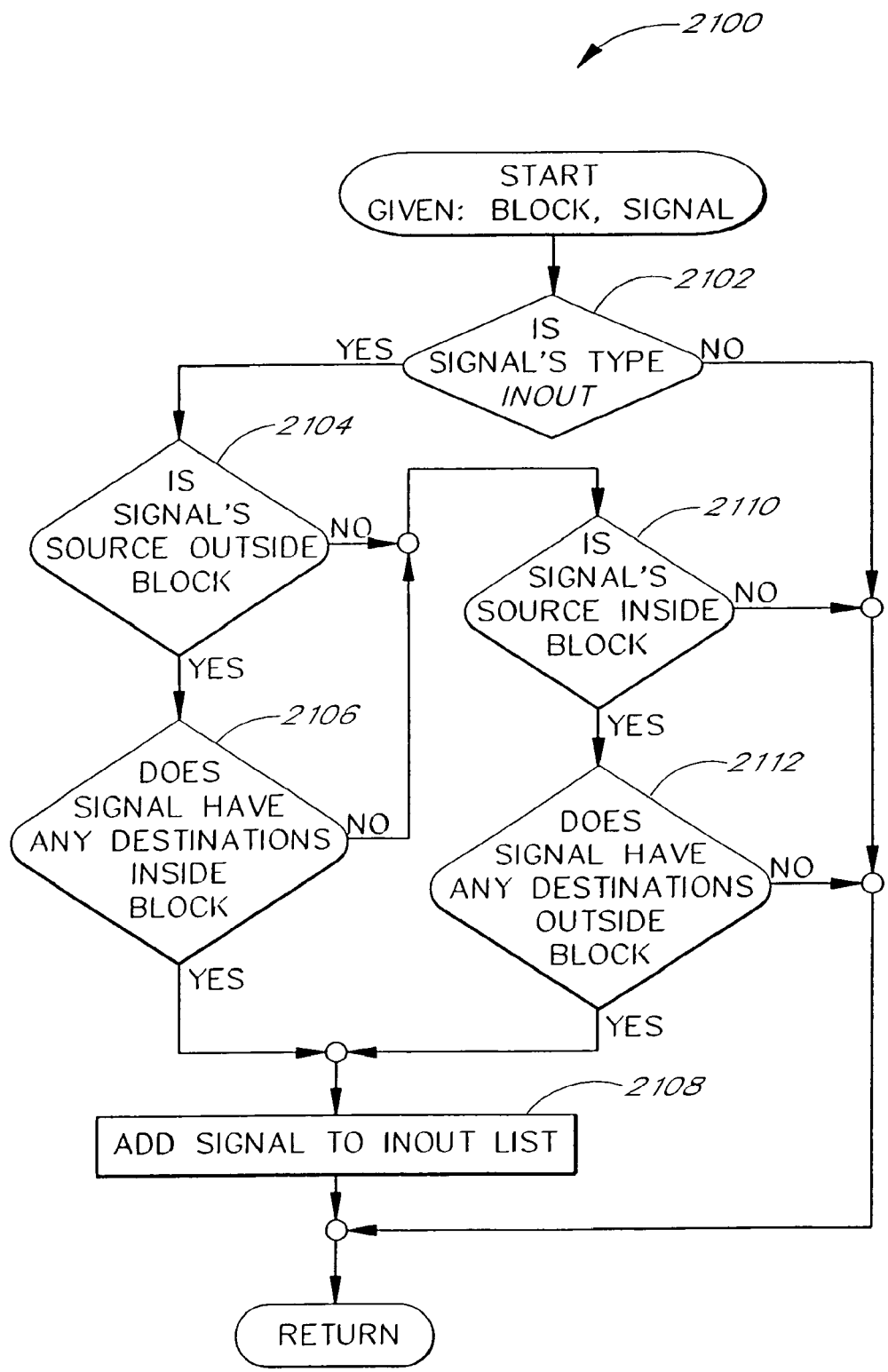
FIG. 21 is a logical flowchart illustrating one exemplary embodiment of the method of checking for "in" or "out" signals as shown generally in FIG. 20.

FIG. 21 is a logical flowchart illustrating one embodiment of the method 2100 of checking for "in" or "out" signals as shown generally in FIG. 20. For a given block and signal, the signal type is checked in step 2102 to determine whether the signal is an "inout" type; if the signal is not an "inout" type, the algorithm returns to FIG. 20. If it is an "inout" type, the signal's source is checked in step 2104 to determine if it is outside of the block, then whether it has destinations inside the block (step 2106). If both conditions are met, the signal is added to the inout list per step 2108. If either one of the conditions is not met, the signal's source is checked in step 2110 to determine if it is inside of the block; if so, then the destination is checked in step 2112 to determine if it is outside of the block.

Figure 22:
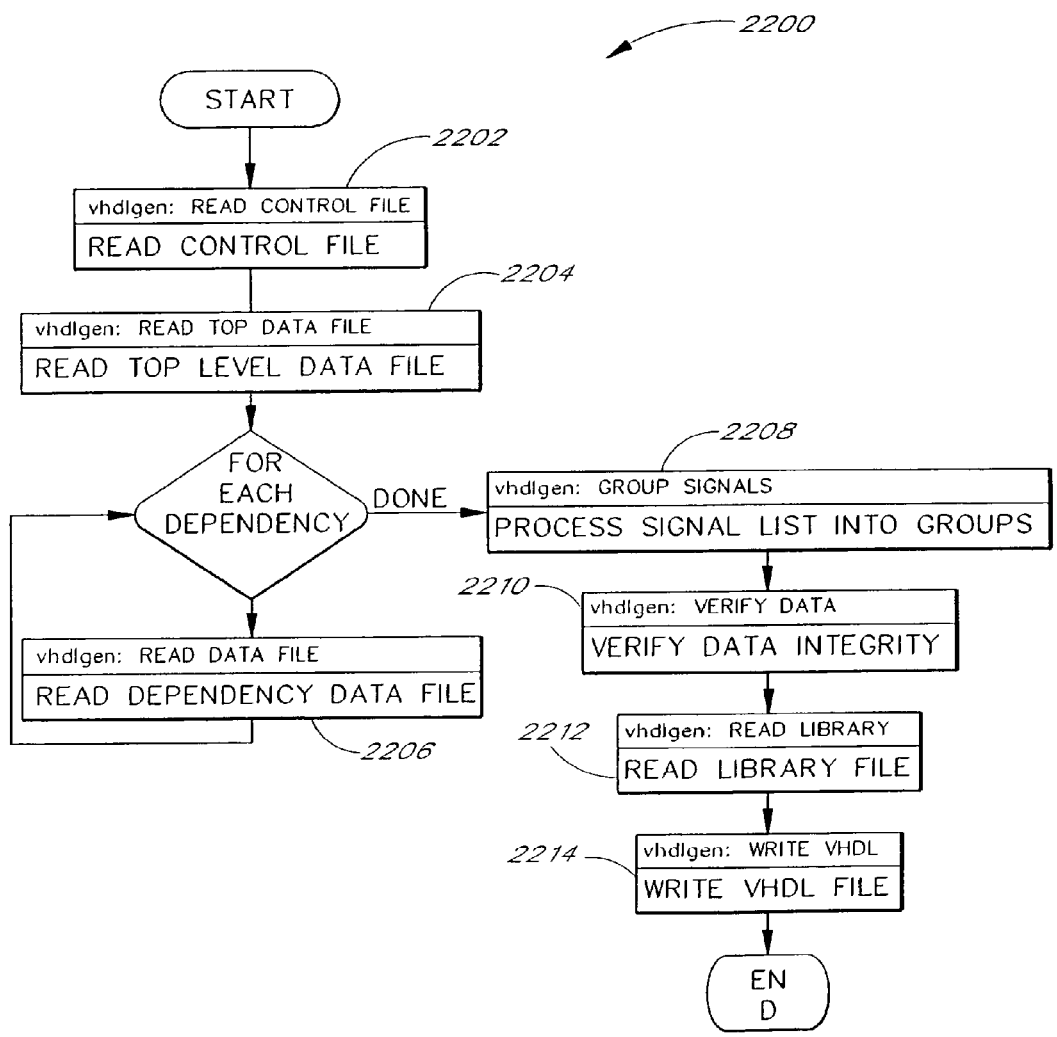
FIG. 22 is a logical flowchart illustrating one exemplary embodiment of the method of generating the merged hardware description language (HDL) file according to the invention.

Referring now to FIG. 22, one exemplary embodiment of the method 2200 of generating the merged hardware description language (HDL) file according to the invention is described.

It is again noted that while the following discussion is cast in terms of VHSIC Hardware description Language (VHDL), other languages may be used to practice the method of the invention with equal success VHDL is chosen for the illustrated examples simply for its comparatively wide-spread recognition and ease of use.

As used herein, the term "vhdlgen" refers to VHDL generation, a process within the invention by which the individual VHDL files relating to various aspects or components of the design are merged together to form a common VHDL file descriptive of the overall design.

As shown in FIG. 22, the vhdlgen method 2200 comprises first reading a control file (step 2202), followed by reading the top level data file (step 2204). These steps 2202, 2204 are described in greater detail with reference to FIGS. 23 and 24, respectively. After the top level data file is read, each dependency present is analyzed by reading the dependency data file (step 2206), as further illustrated in FIG. 25. After each dependency data file has been read, the signal list is processed in step 2208 into a plurality of groups (FIG. 27), the data integrity verified in step 2210 (FIG. 28), the associated library file read in step 2212 (FIG. 29), and the "merged" VHDL file written in step 2214 (FIG. 30).

Figure 23:
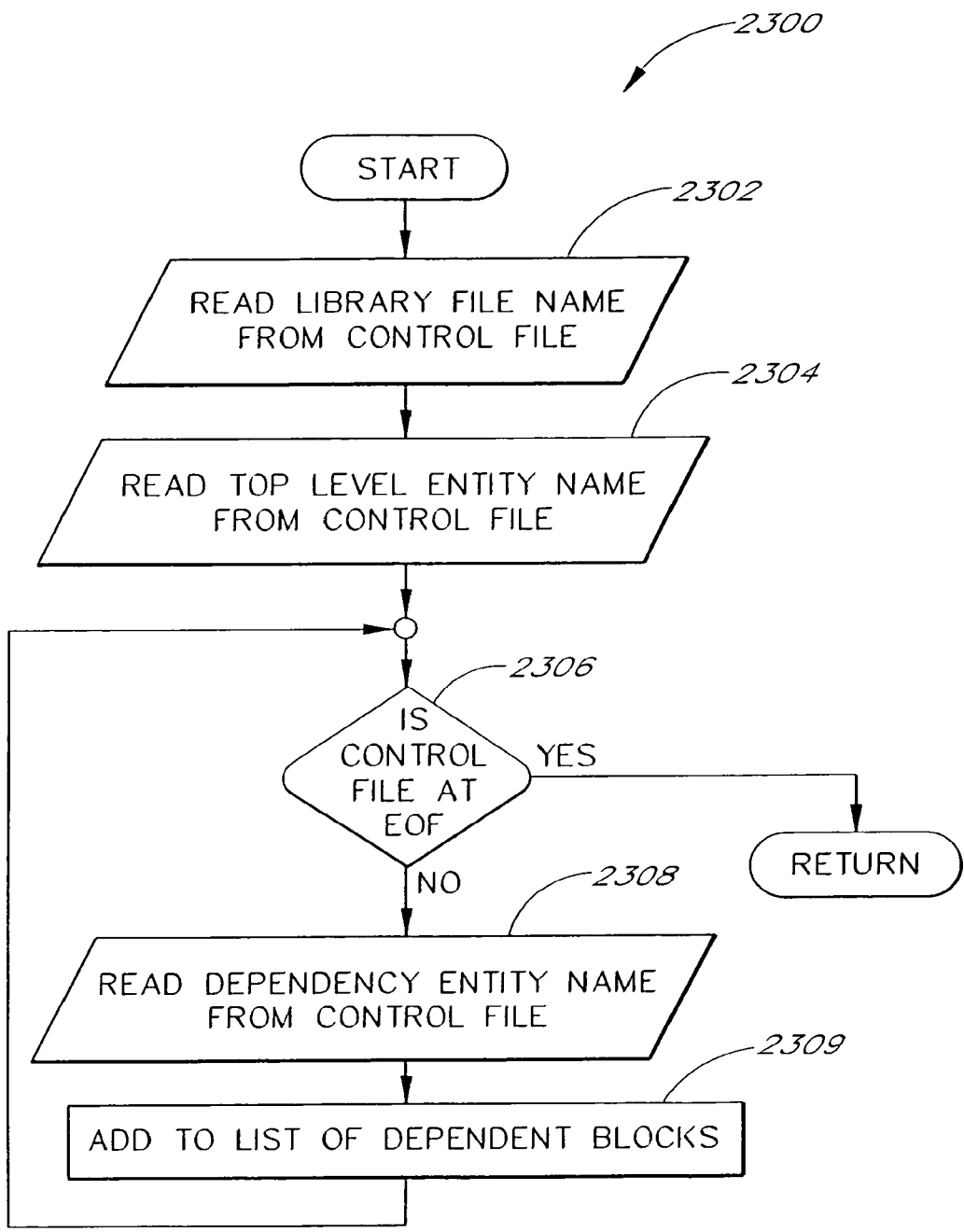
FIG. 23 is a logical flowchart illustrating one exemplary embodiment of the method of reading the HDL control file as shown generally in FIG. 22.

Referring now to FIG. 23, one exemplary embodiment of the method 2300 of reading the HDL control file as shown generally in step 2202 of FIG. 22 is described. Initially, the library file name is read from the control file in step 2302. Next, the top level entity name is read from the control file in step 2304. The control file is then examined in step 2306 to determine if it is at end of file (eof); if so, the routine is terminated and returns to step 2204 of FIG. 22. If not, the first dependency entity name is read from the control file in step 2308 and added to the list of dependent blocks in step 2309. If additional dependencies exist, they are subsequently read and added to the list of dependent blocks until the eof condition is met, at which point the routine returns to step 2204 of FIG. 22.

Figure 24:
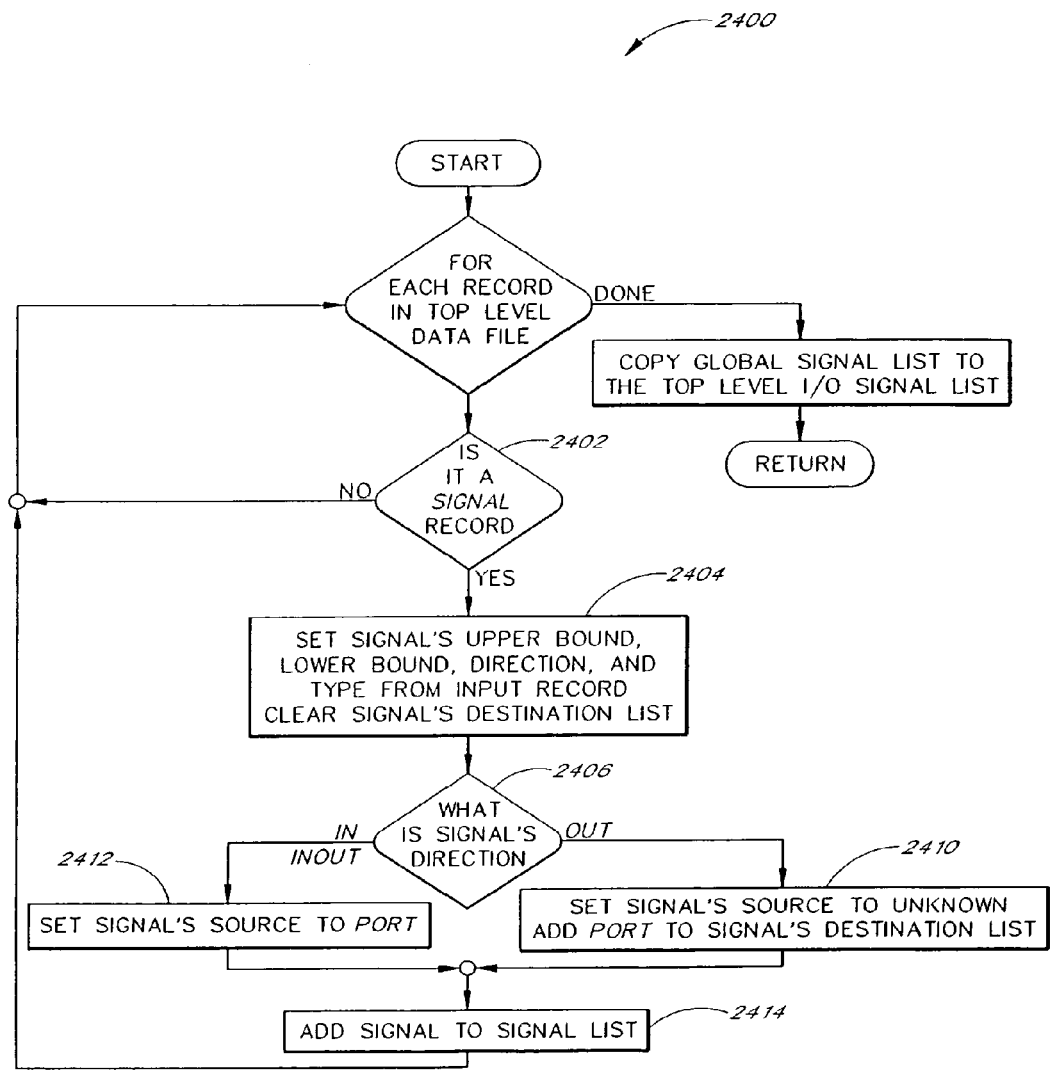
FIG. 24 is a logical flowchart illustrating one exemplary embodiment of the method of reading the HDL top level entity data file as shown generally in FIG. 22.

FIG. 24 illustrates one exemplary embodiment of the method 2400 of reading the HDL top level entity data file as shown generally in step 2204 of FIG. 22. Specifically, each record in the top level data file is examined in step 2402 to determine if it is a "signal" record; if so, the signal's upper bound, lower bound, direction, and type are set from the input record in step 2404. The signal's destination list is also cleared. Next, each signal's direction (i.e., "in", "out", or "inout") is determined in step 2406; if the direction of a given signal is "out", then the signal's source is set to "unknown", and "PORT" is added to the signal's destination list in step 2410. If the signal is "in" or "inout", then the signal's source is set to "PORT" in step 2412. Lastly, in step 2414, the signal is added to the signal list, and the next record in the top level data file subsequently read.

Figure 25:
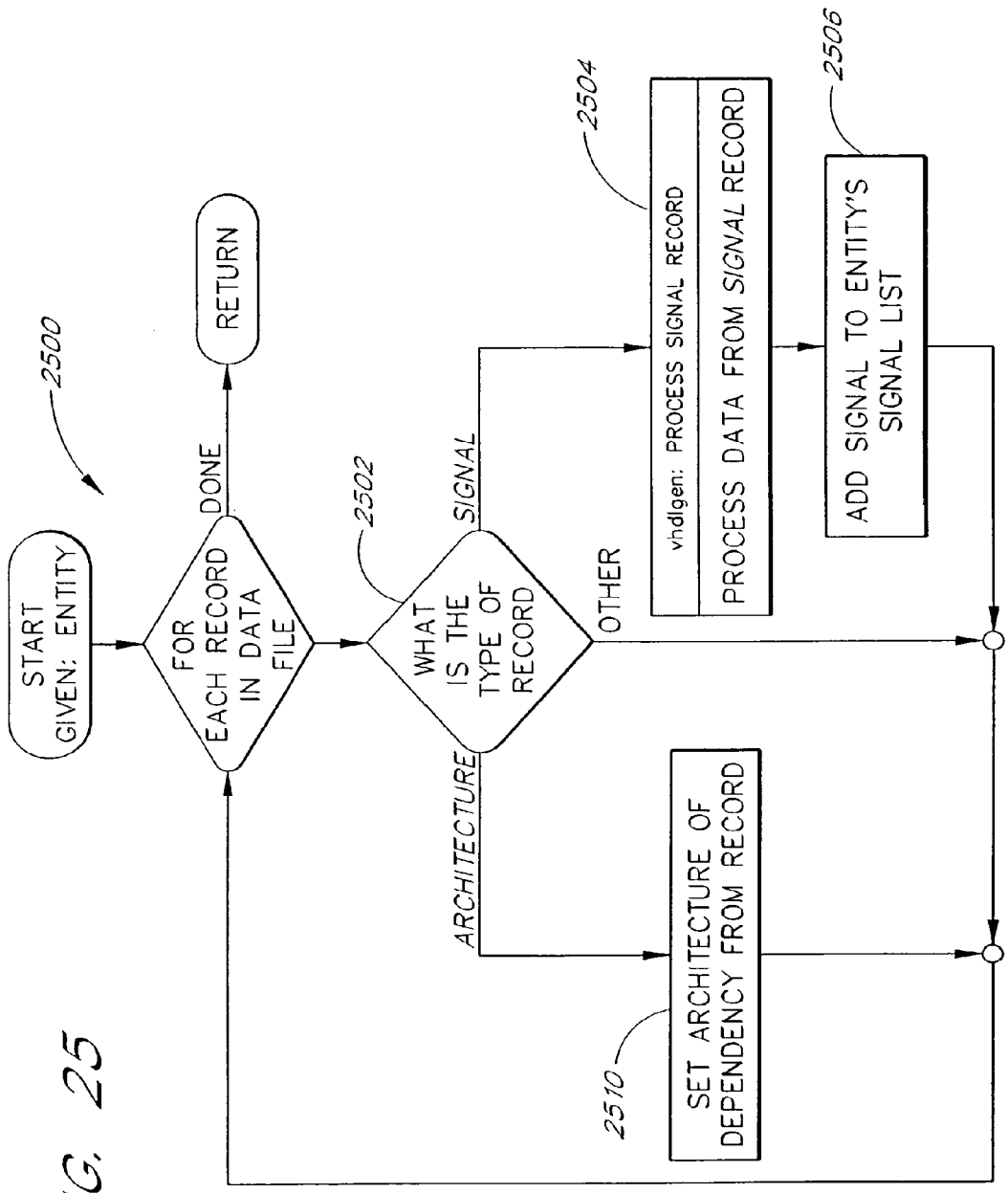
FIG. 25 is a logical flowchart illustrating one exemplary embodiment of the method of reading the HDL dependency data file as shown generally in FIG. 22.

FIG. 25 illustrates one exemplary embodiment of the method 2500 of reading the HDL dependency data file as shown generally in FIG. 22. For a given entity, each record in the data file is read and the type of record determined in step 2502. If the record is a "signal", data from the signal record is then processed in step 2504 (see FIG. 26 for additional detail on this step). After the data has been processed, the signal is added to the entity's signal list in step 2506, and the next record read. Conversely, if the record read is an "architecture"

record, then the architecture of the dependency for that record is set per step 2510, and then a subsequent record read. When all records have been read, the routine is terminated in favor of step 2206 of FIG. 25.

Figure 26:
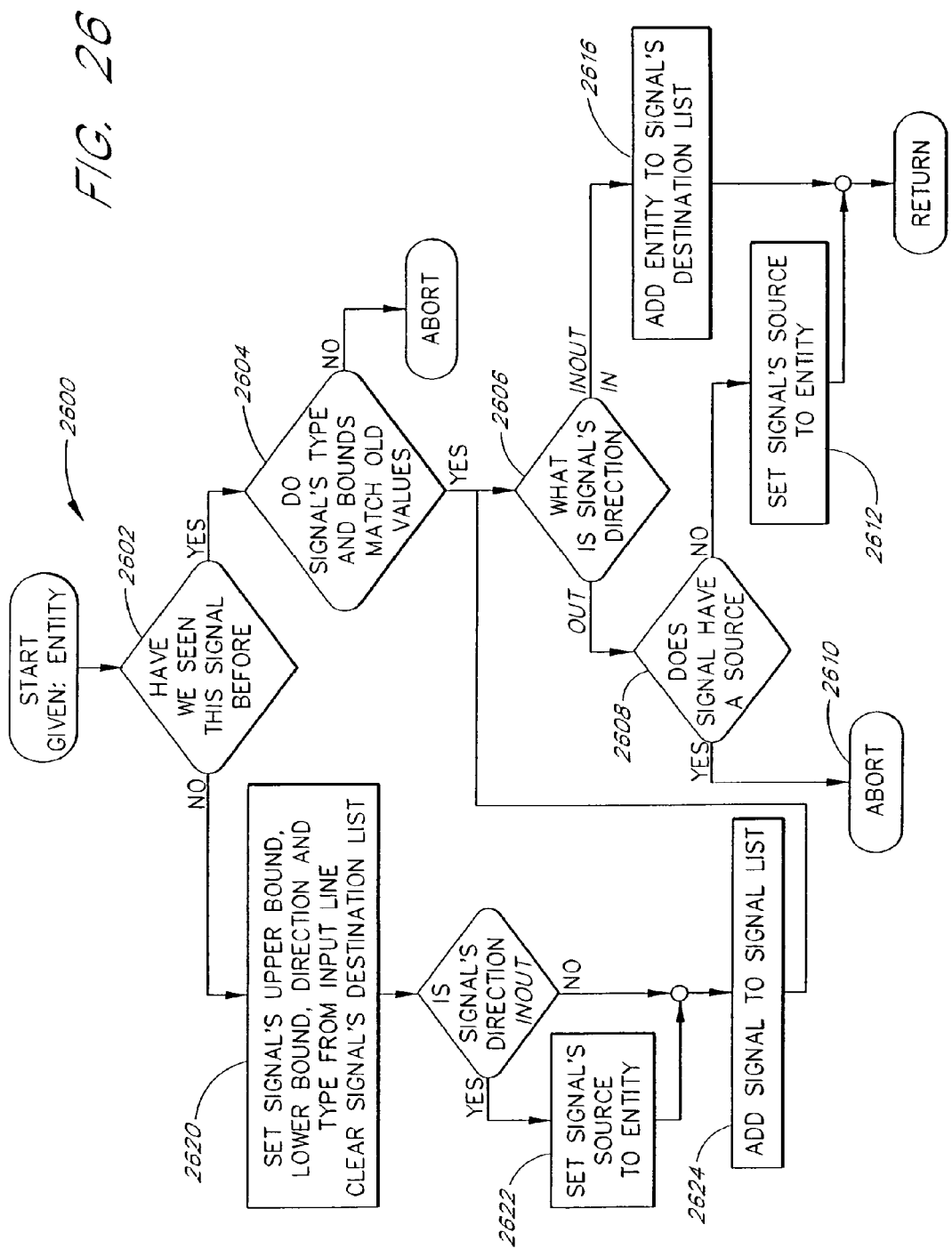
FIG. 26 is a logical flowchart illustrating one exemplary embodiment of the method of processing the signal record as shown generally in FIG. 25.

FIG. 26 illustrates one embodiment of the method 2600 of processing signal record as previously discussed with respect to FIG. 25. For the chosen entity, the algorithm 2600 first determines in step 2602 whether the signal being examined has been read before; if so, the signal's type and bounds are next examined to determine whether they match the previous occurrence of the signal (step 2604). If so, the signal's direction is next analyzed in step 2606 to determine its type. If the signal is an "out" signal, the source of the signal is then analyzed in step 2608 if a source exists, the routine is aborted per step 2610. If not, the signal's source is set to "entity" per step 2612. Conversely, if the signal is an "out" or "inout" signal, then the entity is added to the signal's destination list per step 2616.

In the case where the signal under examination has not been previously read, the signal's upper and lower bounds, direction, and type are set in step 2620 using information from the input line. The signal's destination list is also cleared. If the signal's direction is "inout", then the signal's source is set to "entity" in step 2622, and the signal added to the signal list in step 2624. If not, the signal is added to the signal list directly. After the addition of the signal to the signal list in step 2624, the routine proceeds to step 2606 for analysis of the signal's direction as previously described.

Figure 27:
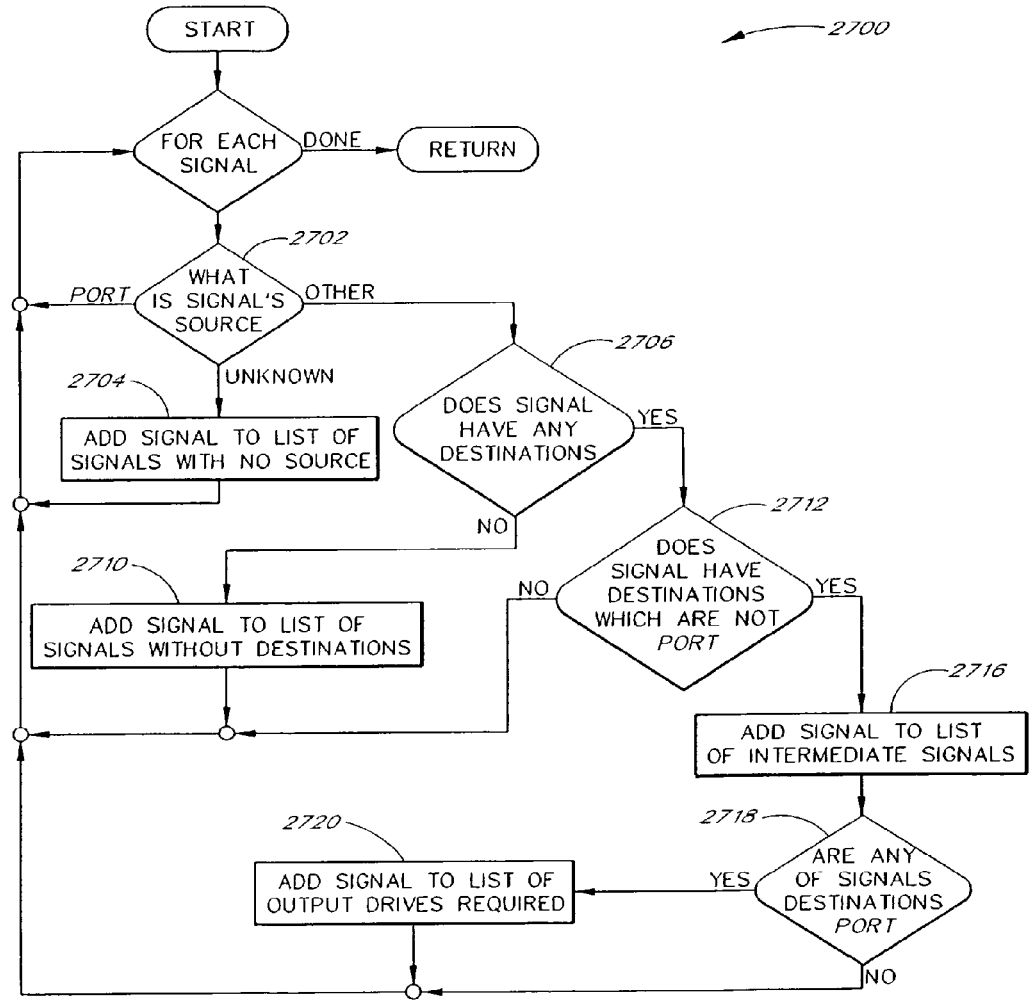
FIG. 27 is a logical flowchart illustrating one exemplary embodiment of the method of processing the signal list into groups as shown generally in FIG. 22.

FIG. 27 illustrates one exemplary embodiment of the method 2700 of processing the signal list into groups as shown generally in FIG. 22. Specifically, for each signal, the signal's source is first determined in step 2702; if the signal source is "PORT", then no further analysis of that signal is required, and the next signal is analyzed. If the signal's source is "unknown", then the signal is added to the list of signals with no source in step 2704, and the next signal analyzed. If the signal source is "other", the signal is then analyzed in step 2706 to determine if any destinations are specified. If there are no destinations specified, the signal is added to the list of signals without destinations per step 2710. If the signal does have one or more destinations, these destinations are then examined in step 2712 to determine if any are destinations other than "PORT". If so, then the signal is added to the list of intermediate signals per step 2716. Next, in step 2718, the destinations of the signal are again examined to determine if any of these destinations are "PORT"; if yes, the signal is further added to the list of signals requiring output drives in step 2720.

Figure 28:
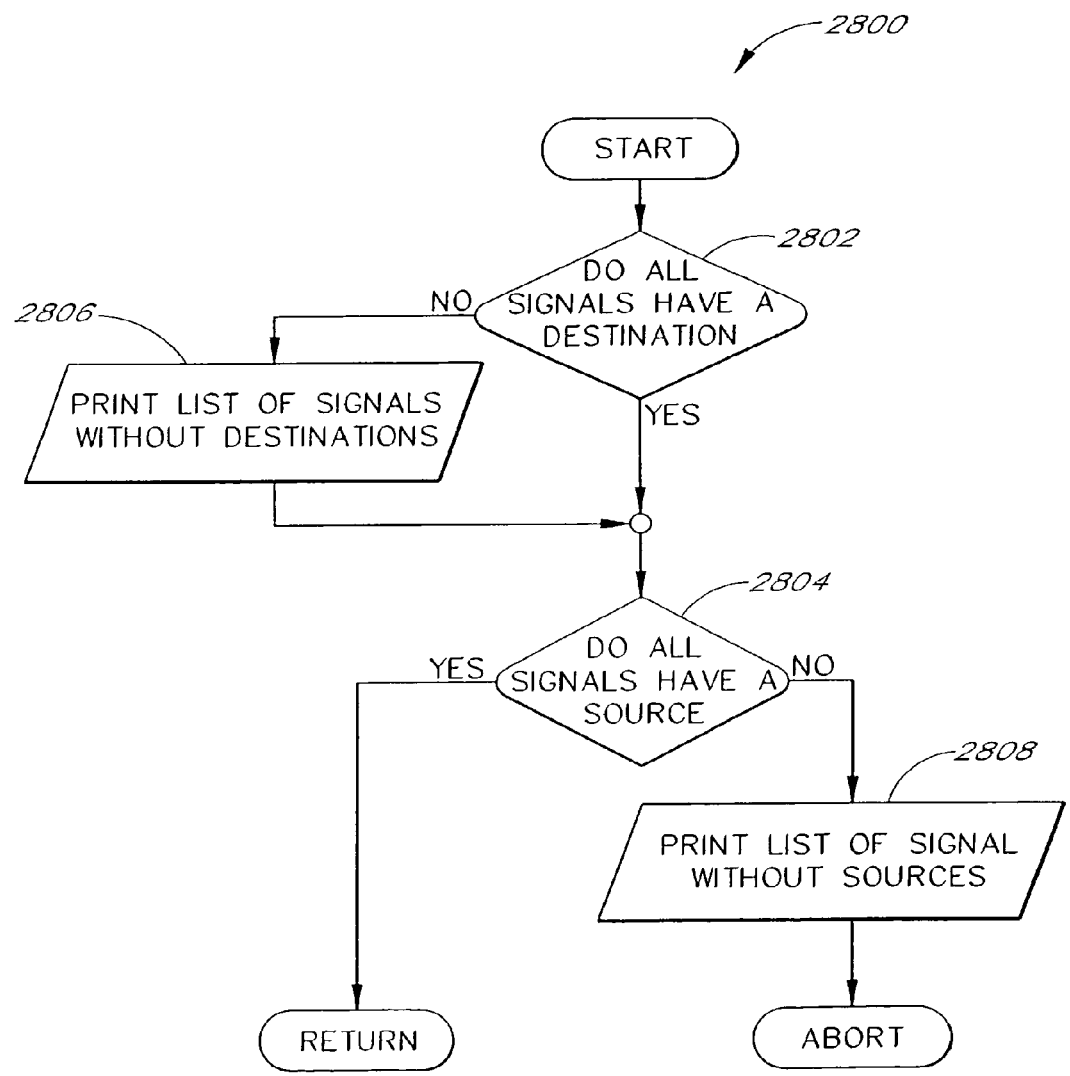
FIG. 28 is a logical flowchart illustrating one exemplary embodiment of the method of verifying data integrity as shown generally in FIG. 22.

Referring now to FIG. 28, one exemplary embodiment of the method 2800 of verifying signal data integrity as shown generally in FIG. 22 is described. First, in step 2802, each signal is examined to determine if it has an associated destination. If so, the existence of an associated source is then checked in step 2804. If both source and destination exist for all signals, the routine is terminated. If no destination is present for one or more signals in step 2802, a list of signals without destinations is printed per step 2806. If all signals have destinations but one or more signals do not have a source, a list of signals without sources is printed per step 2808.

Figure 29:
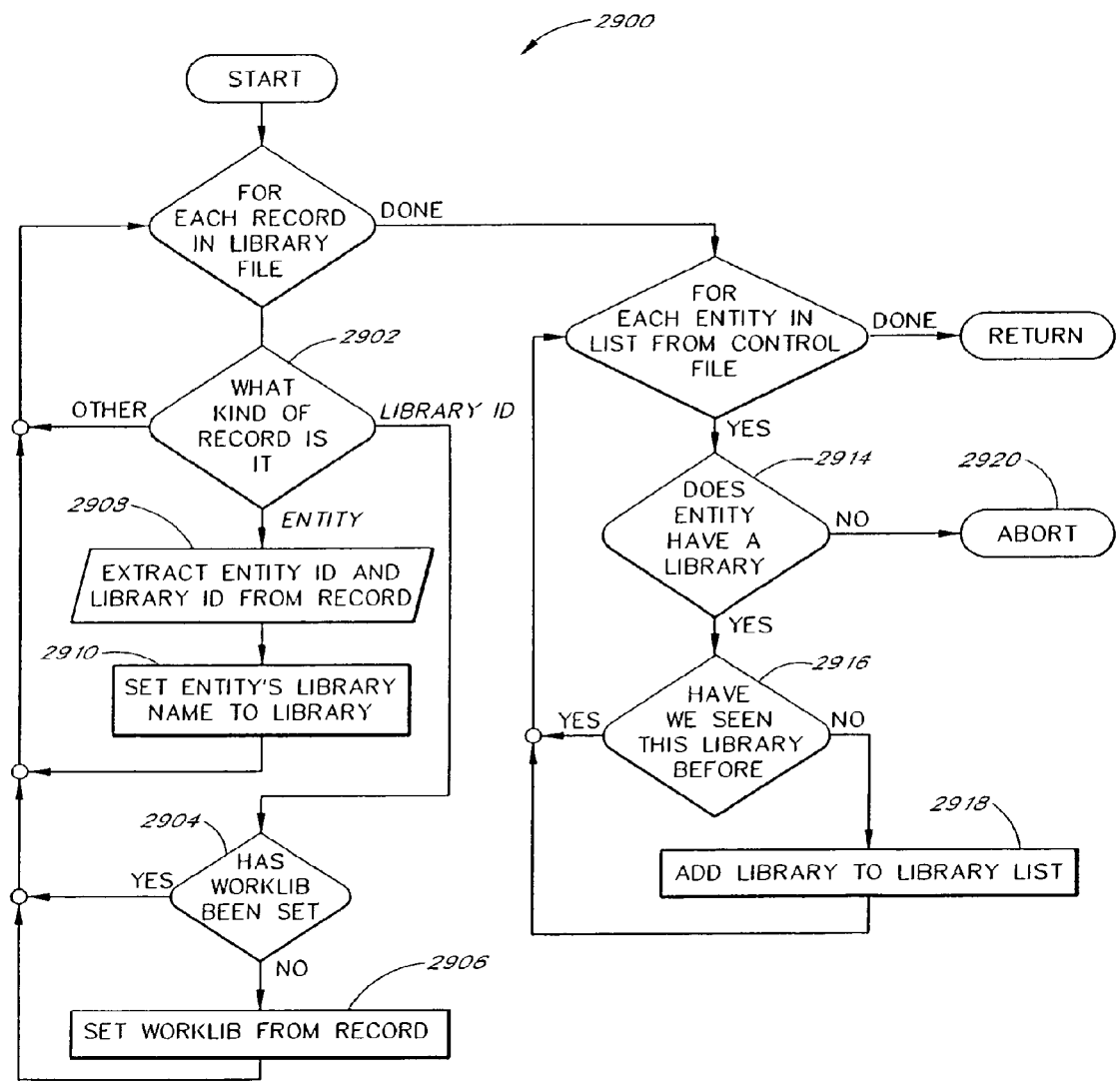
FIG. 29 is a logical flowchart illustrating one exemplary embodiment of the method of reading the library file as shown generally in FIG. 22.
Figure 30:
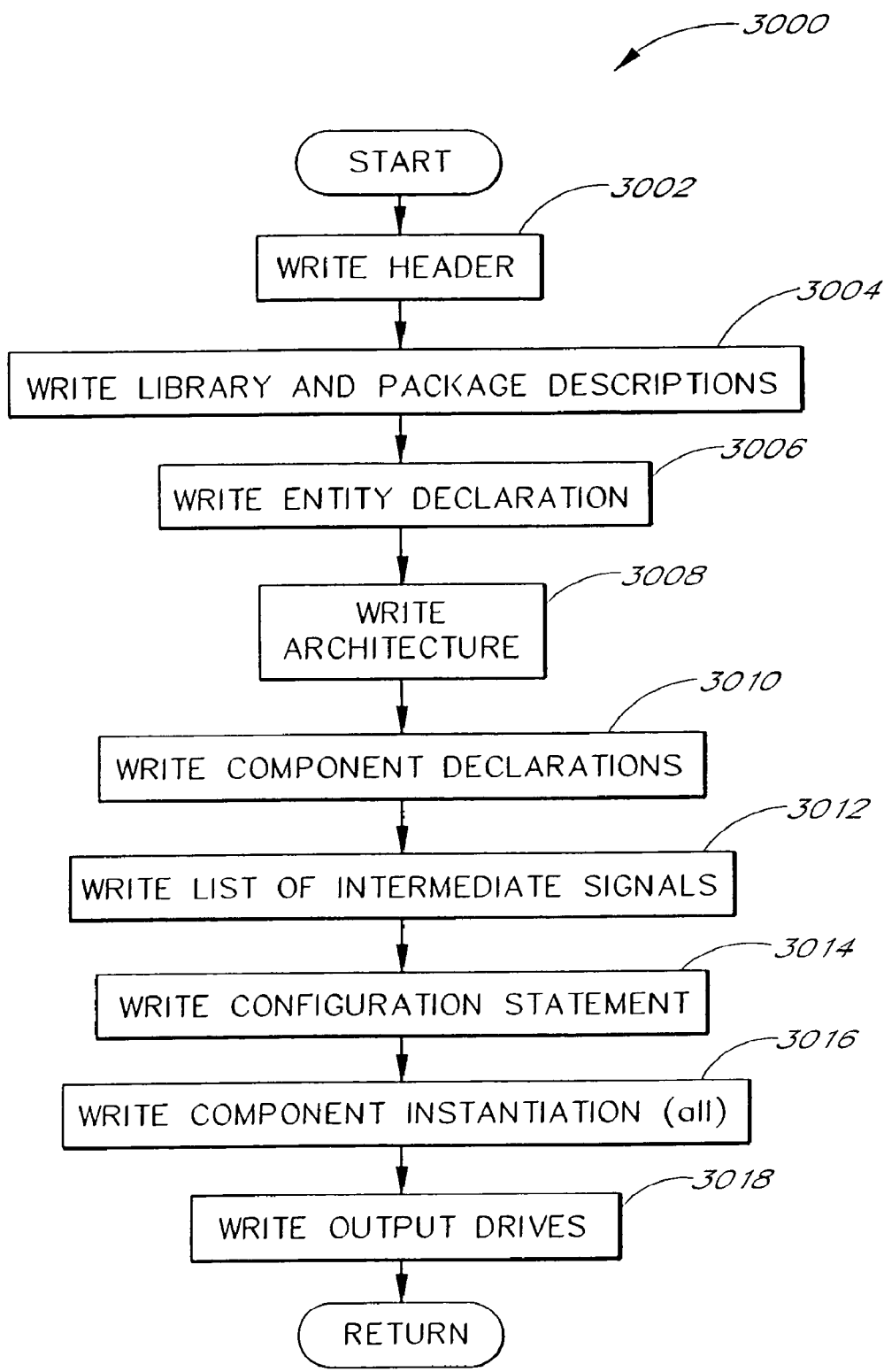
FIG. 30 is a logical flowchart illustrating one exemplary embodiment of the method of writing the HDL file as shown generally in FIG. 22.

FIG. 29 illustrates one embodiment of the method 2900 of reading the library file as shown generally in FIG. 22 herein. For each record present in the given library file, a determination is first made in step 2902 as to what type of record is under analysis; if the record is a "library id", then the status of setting the "worklib" flag is determined in step 2904. If the flag has not been set, it is set from the present record per step 2906. If it has been set, then the next subsequent record is read from the library. If the record is an "entity" record, the "entity id" and "library id" are extracted from the record in step 2908, and the entity's library name is set to "library" in step 2910.

Lastly, if the record is classified as "other" in step 2902, then no action is taken and the next subsequent record is read.

After each record has been read from the selected library and analyzed as to type, each entity is examined to determine whether it has an associated entity library per step 2914. If a given entity does have a library, that library is next analyzed in step 2916 to determine if that library has been read before. If so, the next sequential entity is analyzed. If not, the library is added to the library list in step 2918, and then the next subsequent entity analyzed. If the entity has no associated library in step 2914, then the program is aborted per step 2920.

Referring now to FIG. 30, one exemplary embodiment of the method 3000 of writing one or more HDL files as shown generally in FIG. 22 is described. The VHDL file is written in a sequence of steps that conform to the specification for VHDL format. It is noted that other HDL languages may employ differing formats that result in some information becoming unnecessary, or required in a different order. The first step 3002 of the illustrated method 3000 comprises writing the VHDL file header to a VHDL file. Next the list of libraries and packages used is written to the VHDL file in step 3004. Next the entity declarations are written to the VHDL file in step 3006. Subsequently the architecture information is written to the VHDL file in step 3008. In the next step 3010, VHDL component declarations are written to the VHDL file. The list of intermediate signals is then written to the VHDL file in step 3012, and VHDL configuration statements are written to the VHDL file in step 3014. Then, in step 3016, all component instantiations are written to the VHDL file. Finally, output drives are written to the VHDL file in step 3018. This completes the hardware description language file generation process.

It is noted that while the foregoing description of FIGS. 2-30 refers to specific embodiments of the various aspects of the method of the invention, various substitutions, alterations, permutations, additions, and deletions may be made to the disclosed method. For example, certain routines disclosed herein may be selectively employed, or the order in which they are employed with respect to other routines varied. Similarly, individual steps within each of the routines may be modified as required by the particular application.

Description of the IC Design Apparatus

Figure 31:
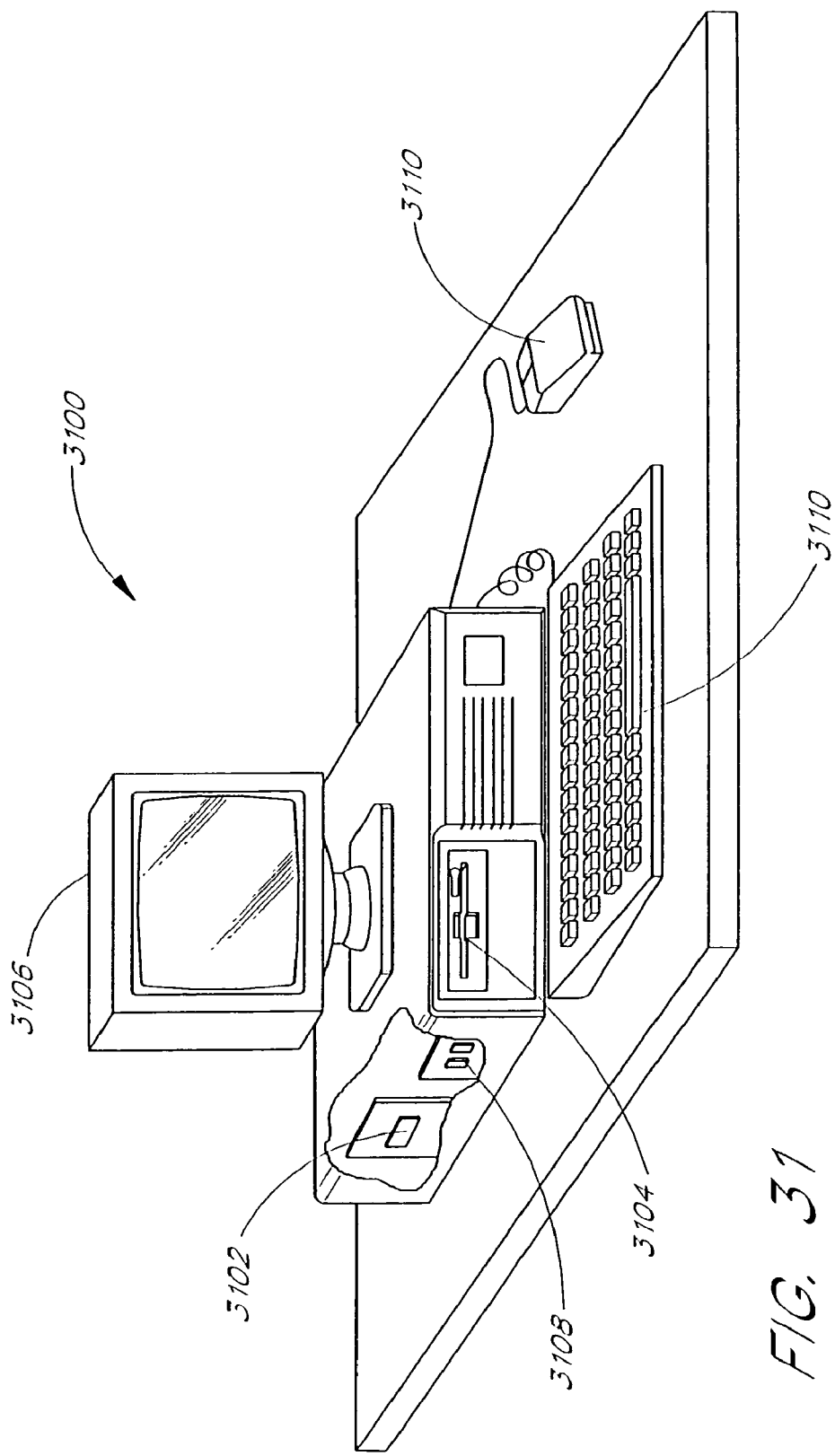
FIG. 31 is a perspective view of one exemplary embodiment of an integrated circuit design apparatus according to the invention.

Referring now to FIG. 31, an exemplary apparatus capable of implementing the method of FIGS. 2-32 is described. A stand-alone microcomputer system 3100 of the type well know in the computer arts, having a processor 3102, internal or external storage device 3104, display device 3106, internal memory 3108, and input device 3110, is used. The algorithm 100 of FIG. 2, embodied in the form of a computer program reduced to machine readable object code as is also well known in the art (not shown), is loaded into the storage device 3104 and memory 3108 of the system 3100 and run on the processor 3102 based on inputs provided by the user via the input device 3110. Alternatively, the computer program may reside on a removable storage device (not shown) such as a floppy disk or magnetic data cartridge of the type well known in the art. The display device 3106, which may comprise for example a cathode ray tube (CRT), liquid crystal display (LCD), thin film transistor (TFT), or plasma display, provides the user with a variety of visual information including representations of the program's menu structure, and the status and output of various routines or modules running within the program. See Appendix I for one exemplary embodiment of the menu structure used in conjunction with the aforementioned computer program. While the illustrated embodiment is a microcomputer, it will be recognized that other computer types and architectures may be used with equal success, For example, a networked minicomputer system or client/server arrangement wherein data or libraries relating to the design are not resident on the local system 3100 may be employed, or alternatively, a plurality of different computers may be used to run parts of the computer program in parallel. Many varying architectures and equipment/software configurations may be substituted, consistent with the general aims of providing an automated, interactive design process.

Description of the Integrated Circuit

Figure 32:
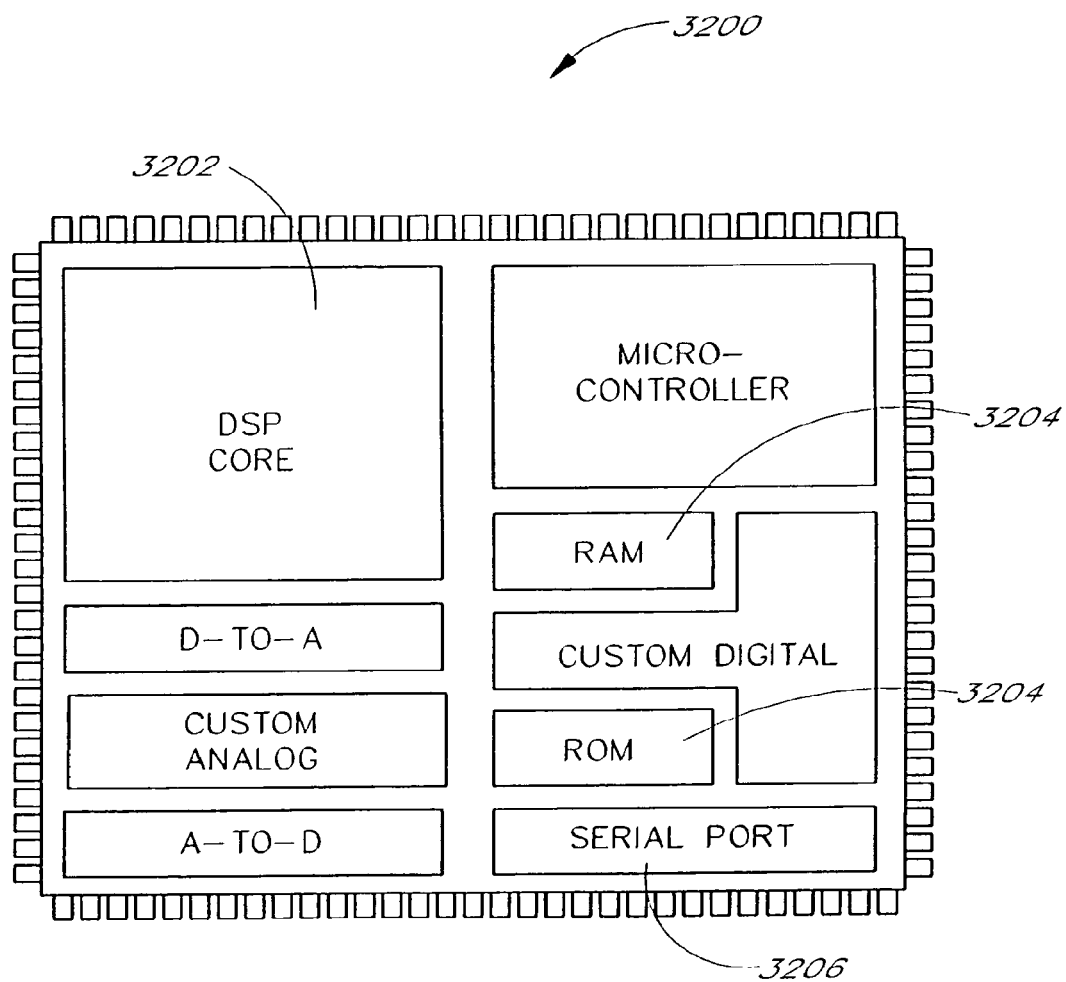
FIG. 32 is a top plan view illustrating the layout of one exemplary embodiment of a processor-based integrated circuit designed using the method of the invention.

Referring now to FIG. 32, an exemplary integrated circuit developed using the above-described method of the present invention is disclosed. As shown in FIG. 34, the integrated circuit 3200 is an ARC microprocessor-like CPU device having, inter alia, a processor core 3202, on-chip memory 3204, and an external interface 3206. The device is fabricated using the customized VHDL design obtained using the present invention (step 108 of FIG. 2) which is subsequently synthesized into a logic level representation, and then reduced to a physical device using compilation, layout and fabrication techniques well known in the semiconductor arts. As previously noted, the designs for a wide variety of other types of integrated circuits (including, for example, ASICs and FPGAs) can be synthesized using the method and apparatus set forth herein. Hence, the CPU-based device of FIG. 32 is merely exemplary of such devices.

It will be appreciated by one skilled in the art that the Integrated Circuit of FIG. 32 may contain any commonly available microcontroller peripheral such as serial communications devices, parallel ports, timers, counters, high current drivers, analog to digital (A/D) converters, digital to analog converters (D/A), interrupt processors, LCD drivers, memories and other related peripherals. Further, the Integrated Circuit may also include custom or application specific circuitry that is specifically developed to solve a specific applications problem or meet the needs of a single application. The present invention is not limited to the type, number or complexity of peripherals and other circuitry that may be combined using the method and apparatus. Rather, any limitations are imposed by the physical capacity of the extant semiconductor processes which improve over time. Therefore it is anticipated that the complexity and degree of integration possible employing the present invention will further increase as semiconductor processes improve.

It is noted that power consumption of devices such as that shown in FIG. 34 is significantly reduced due in part to a lower gate count resulting from better block and signal integration. Furthermore, the above-described method provides the user with the option to optimize for low power (or use a low power silicon process such as Xemics for example). The system may also be run at a lower clock speed, thereby further reducing power consumption; the use of one or more custom instructions and/or interfaces allows performance targets to be met at lower clock speeds.

It is also noted that many IC designs currently use a microprocessor core and a DSP core. The DSP however, might only be required for a limited number of DSP functions, or for the IC's fast DMA architecture. The invention disclosed herein can support many DSP instruction functions, and its fast local RAM system gives immediate access to data. Appreciable cost savings may be realized by using the methods disclosed herein for both the CPU & DSP functions of the IC.

Additionally, it will be noted that the computer program as previously described herein can readily be adapted to newer manufacturing technologies, such as 0.18 or 0.1 micron processes, with a comparatively simple re-synthesis instead of the lengthy and expensive process typically required to adapt such technologies using "hard" macro prior art systems.

While the above detailed description and Appendices have shown, described, and pointed out novel features of the invention as applied to various embodiments, it will be understood that various omissions, substitutions, and changes in the form and details of the device or process illustrated may be made by those skilled in the art without departing from the spirit of the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A computer-implemented method of producing at least a portion of an integrated circuit design, said design including at least one of a processor or processor peripheral device and a graphical user interface for interacting with a user, the method comprising:
    providing the user with an integrated circuit design for the processor or processor peripheral device, the integrated circuit design associated with a hardware description language model;
    assigning a set of default design parameters to the hardware description language model associated with the integrated circuit design, the set of design parameters including at least one of a clock parameter, a memory parameter and a cache parameter;
    receiving one or more inputs from the user for at least one design parameter for processor or processor peripheral device, for customizing the integrated circuit design to be generated;
    automatically generating a customized hardware description language model for the integrated circuit design of the processor or processor peripheral device based on at least one design parameter and the associated hardware description language model, wherein the at least one design parameter includes one of processor cache size, processor cache length, size of external memory space to be cached, clock period and clock skew;
    generating test code associated with the customized hardware description language model based at least in part on the at least one design parameter; and
    conducting a hardware/software co-verification of said at least a portion of said integrated circuit design by using a debugger to run software on at least a portion of the customized hardware description language model using a hardware description language simulator;
    wherein the customized description language model includes both functional and structural description language elements for the processor or processor peripheral.

2. The method of claim 1, further comprising:
    conducting core verification by verifying an integrated circuit synthesized from the customized description language model.

3. The method of claim 2, wherein the integrated circuit is synthesized on a Field Programmable Gate Array.

4. The method of claim 1, wherein the one or more inputs comprises at least one input selected from the group consisting of (i) overall device or system configuration, (ii) width of the external memory system data bus, and (iii) cache type/size.

5. The method of claim 1, wherein generating test code comprises generating configuration register test code.

6. The method of claim 1, wherein generating test code comprises generating test code based at least in part on one or more extensions added to said customized description language model.

7. The method of claim 1, wherein the processor or processor peripheral device comprises a RISC processor, and the hardware description language model comprises a VHDL model.

8. The method of claim 7, further comprising causing a first computer program to write a second computer program adapted to perform a specific task based at least in part on the user inputs.

9. The method of claim 8, further comprising executing the second program to perform the specific task.

10. The method of claim 1, further comprising evaluating the acceptability of the hardware description language model using the test code.

11. The method of claim 1, further comprising:

testing the description language through simulation or synthesis using the test code; and if a different testing outcome is desired, receiving one or more additional inputs from the user and generating a second customized hardware description language model.

* * * * *